United States Patent
Lee et al.

(10) Patent No.: US 12,068,279 B2
(45) Date of Patent: Aug. 20, 2024

(54) DIPOLE ALIGNMENT APPARATUS FOR USE IN MANUFACTURING OF DISPLAY DEVICE INCLUDING ELECTRIC FIELD FORMING UNIT HAVING A STAGE AND PROBE GENERATING ELECTRIC FIELD, AND APPLYING ELECTRIC FIELD SIMULTANEOUSLY WITH LIGHT IRRADIATION GENERATED BY THE LIGHT IRRADIATION DEVICE TO THE INK SPRAYED ON THE STAGE

(71) Applicant: Samsung Display Co., LTD., Yongin-si (KR)

(72) Inventors: Won Ho Lee, Suwon-si (KR); Hyun Deok Im, Seoul (KR); Jong Hyuk Kang, Suwon-si (KR); Jin Oh Kwag, Yongin-si (KR); Keun Kyu Song, Seongnam-si (KR); Sung Chan Jo, Seoul (KR); Hyun Min Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/630,595

(22) PCT Filed: Jun. 3, 2020

(86) PCT No.: PCT/KR2020/007232
§ 371 (c)(1),
(2) Date: Jan. 27, 2022

(87) PCT Pub. No.: WO2021/020714
PCT Pub. Date: Feb. 4, 2021

(65) Prior Publication Data
US 2022/0254753 A1    Aug. 11, 2022

(30) Foreign Application Priority Data

Jul. 31, 2019 (KR) .................. 10-2019-0093144

(51) Int. Cl.
*H01L 21/68* (2006.01)
*B41M 3/00* (2006.01)
(Continued)

(52) U.S. Cl.
CPC ............. *H01L 24/95* (2013.01); *B41M 3/006* (2013.01); *H01L 21/68* (2013.01); *H01L 25/167* (2013.01);
(Continued)

(58) Field of Classification Search
CPC ........ H01L 24/95; H01L 21/68; H01L 25/167; H01L 24/24; H01L 24/25;
(Continued)

(56) References Cited

U.S. PATENT DOCUMENTS

| 2008/0272388 A1 | 11/2008 | Ushiyama et al. |
| 2018/0019369 A1 | 1/2018 | Cho et al. |

(Continued)

FOREIGN PATENT DOCUMENTS

| EP | 0 721 177 | 4/2001 |
| EP | 3 907 082 | 11/2021 |

(Continued)

OTHER PUBLICATIONS

International Search Report, with English translation, corresponding to International Application No. PCT/KR2020/007232 dated Sep. 16, 2020.
(Continued)

*Primary Examiner* — Ermias T Woldegeorgis
(74) *Attorney, Agent, or Firm* — KILE PARK REED & HOUTTEMAN PLLC

(57) ABSTRACT

A dipole alignment device includes an electric field forming part including a stage, and a probe part which form an
(Continued)

electric field on the stage; an inkjet printing apparatus including at least one inkjet head which sprays ink including dipoles and a solvent with the dipoles dispersed therein onto the stage; a transportation part comprising a first moving part which moves the electric field forming part in at least one direction; and a light irradiation apparatus including a light irradiation part which applies light to the ink sprayed onto the stage.

23 Claims, 47 Drawing Sheets

(51) Int. Cl.
  *H01L 23/00* (2006.01)
  *H01L 25/16* (2023.01)
(52) U.S. Cl.
  CPC .............. *H01L 24/24* (2013.01); *H01L 24/25* (2013.01); *H01L 2224/24051* (2013.01); *H01L 2224/24101* (2013.01); *H01L 2224/24145* (2013.01); *H01L 2224/25175* (2013.01); *H01L 2224/95102* (2013.01); *H01L 2224/95133* (2013.01)
(58) Field of Classification Search
  CPC . H01L 2224/24051; H01L 2224/24101; H01L 2224/24145; H01L 2224/25175; H01L 2224/95102; H01L 2224/95133; H01L 25/0753; H01L 21/67715; H01L 21/6715; H01L 21/02288; H01L 21/67098; H01L 21/67144; H01L 27/156; B41M 3/006
  See application file for complete search history.

(56) References Cited

U.S. PATENT DOCUMENTS

| 2018/0269378 A1 | 9/2018 | Borkholder et al. |
| 2019/0214364 A1 | 7/2019 | Kreuter et al. |

FOREIGN PATENT DOCUMENTS

| JP | 11-286113 | | 10/1999 |
| JP | H11286113 A | * | 10/1999 |
| JP | 2000-505918 | | 5/2000 |
| JP | 2010-87452 | | 4/2010 |
| JP | 2011-205060 | | 10/2011 |
| JP | 2012-19241 | | 1/2012 |
| KR | 10-2014-0134967 | | 11/2014 |
| KR | 20140134967 A | * | 11/2014 |
| KR | 10-2016-0066551 | | 6/2016 |
| KR | 10-2017-0048311 | | 5/2017 |
| KR | 10-2018-0007376 | | 1/2018 |
| KR | 10-2018-0055021 | | 5/2018 |
| KR | 10-2020-0034898 | | 4/2020 |
| KR | 10-2020-0102607 | | 9/2020 |
| WO | 2011/111516 | | 9/2011 |

OTHER PUBLICATIONS

Written Opinion, with English translation, corresponding to International Application No. PCT/KR2020/007232, dated Sep. 16, 2020.

Extended European Search Report for European Application No. 20847623.4, dated Jul. 26, 2023.

* cited by examiner

FIG. 1
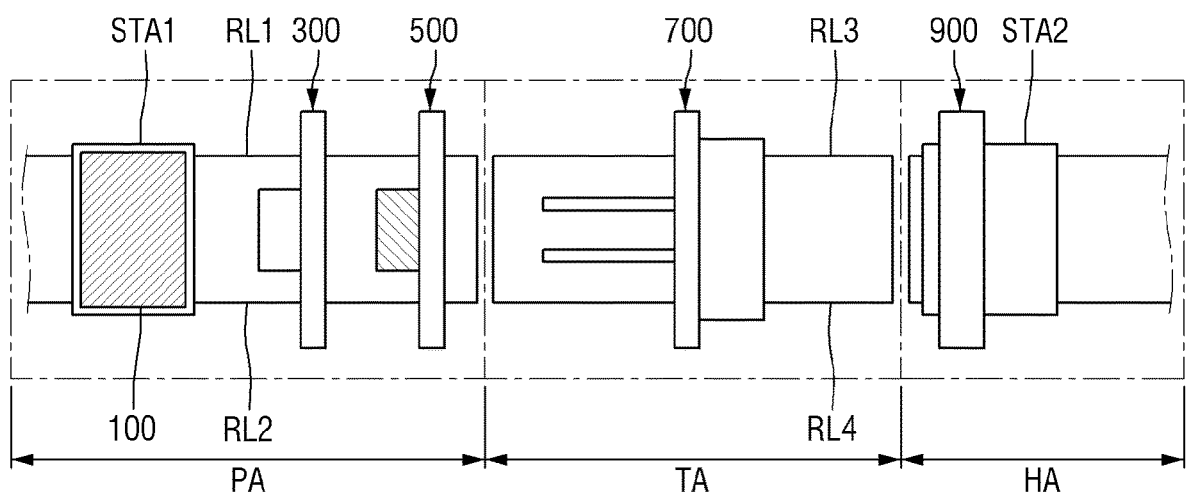
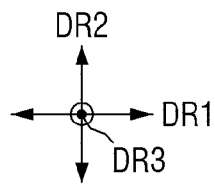

FIG. 3
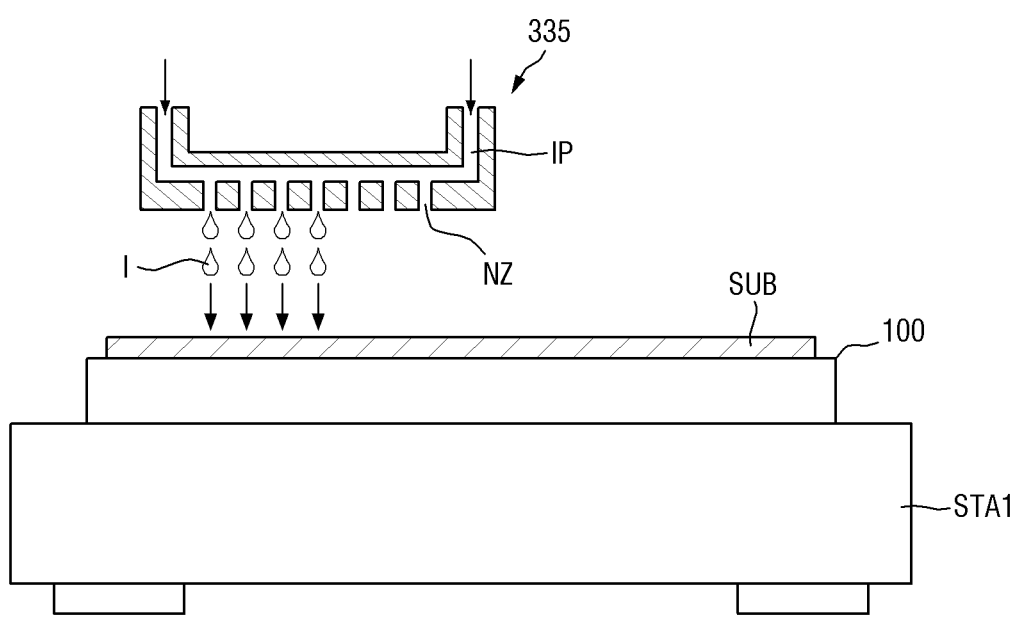
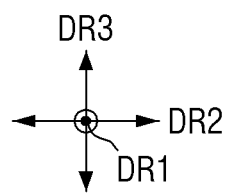

FIG. 6
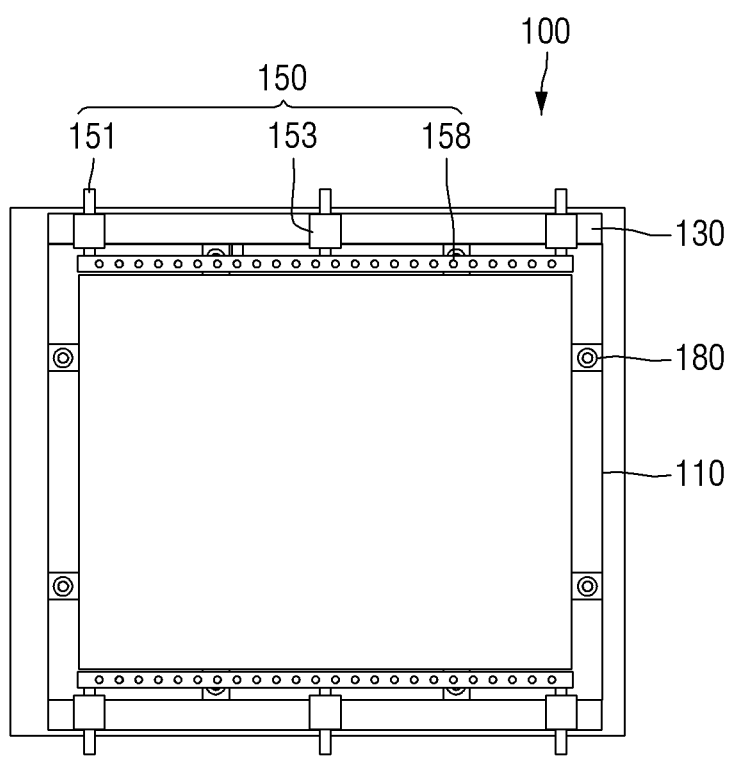
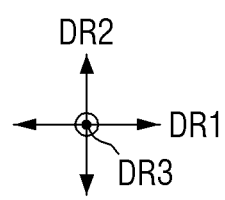

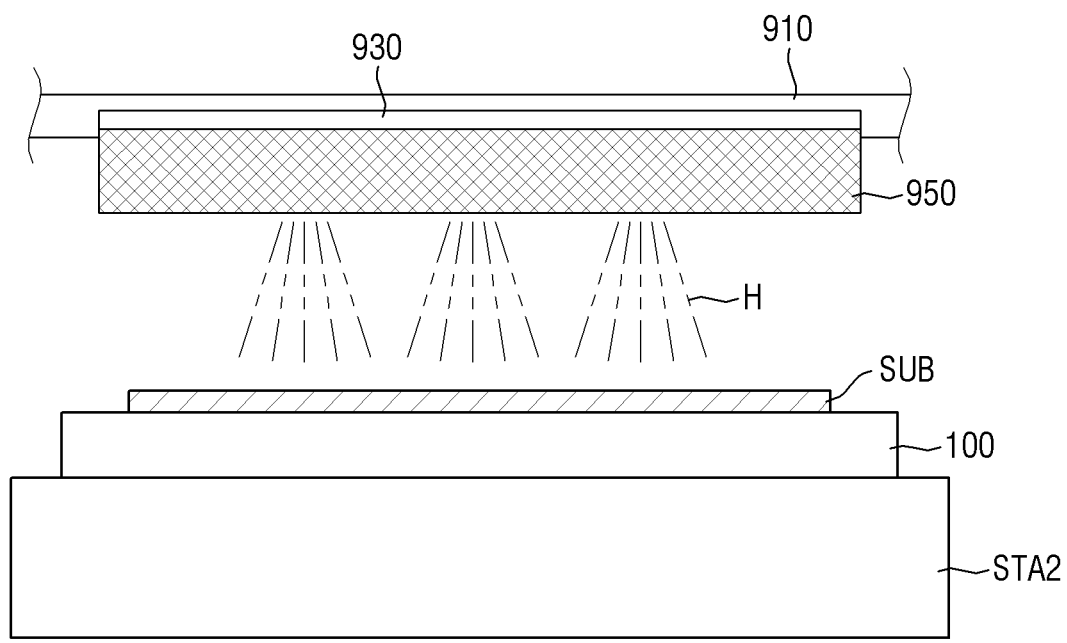
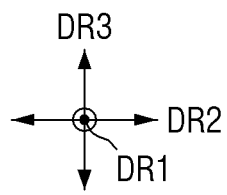

FIG. 16
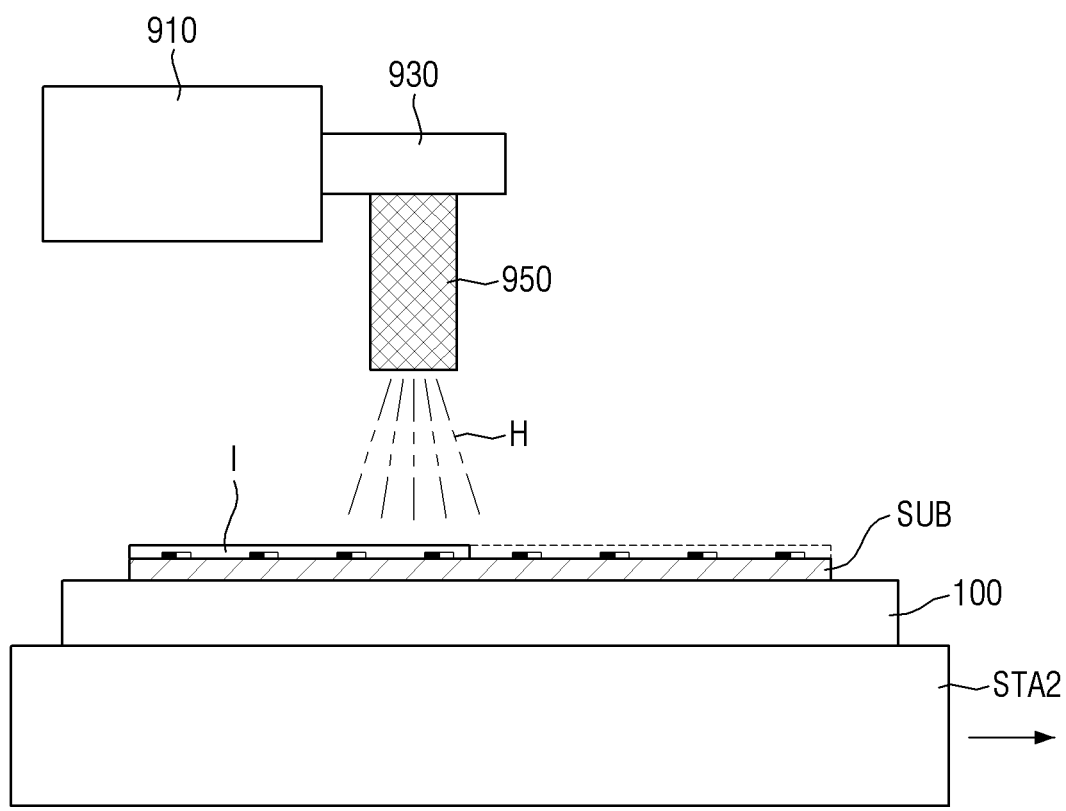
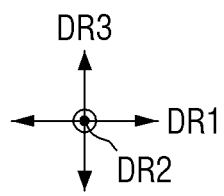

FIG. 17
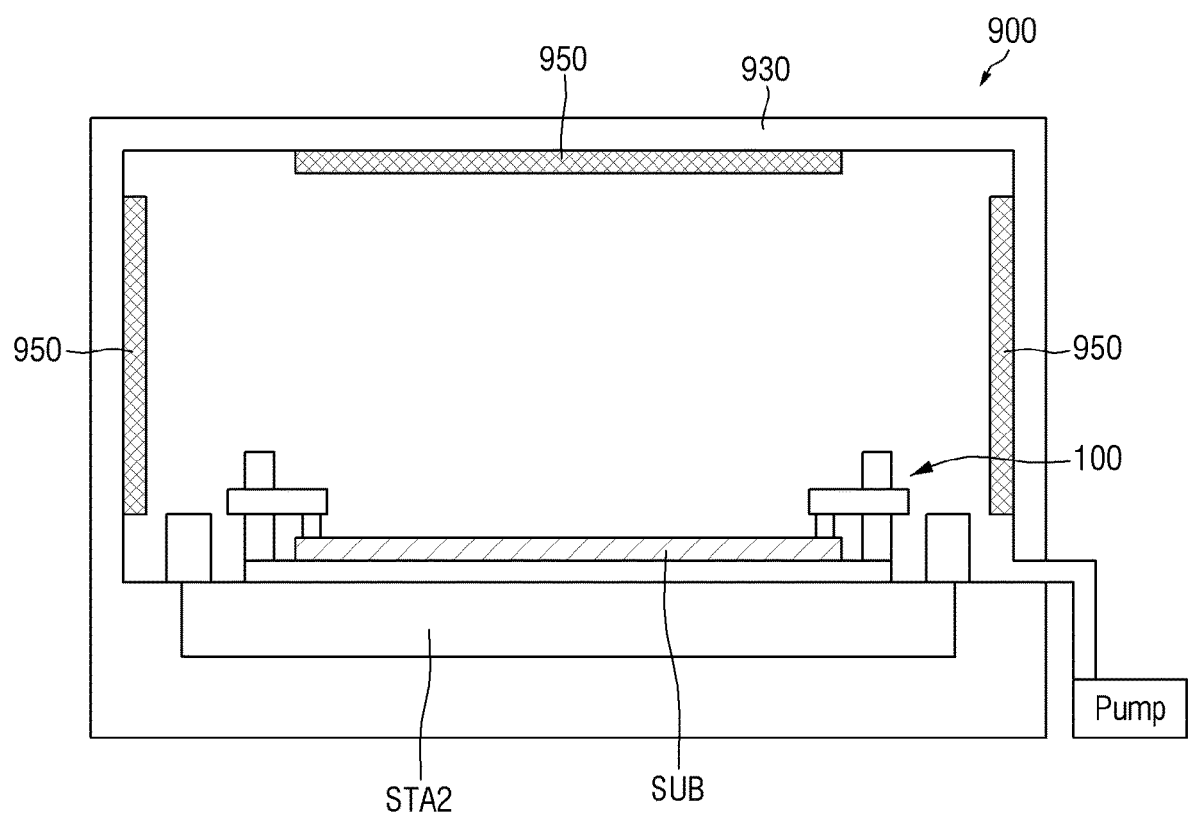
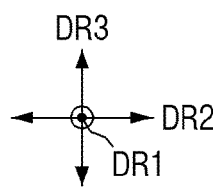

FIG. 20
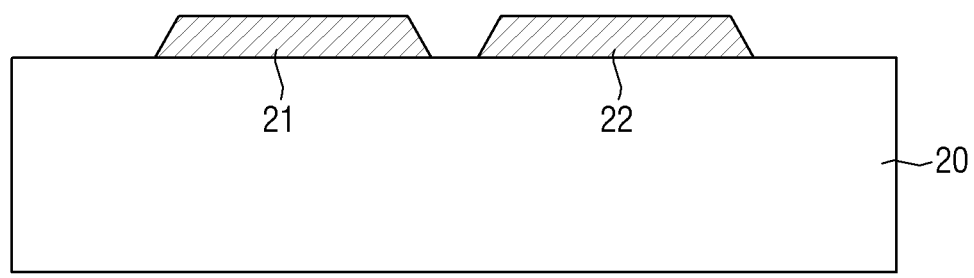
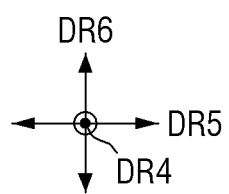

FIG. 22
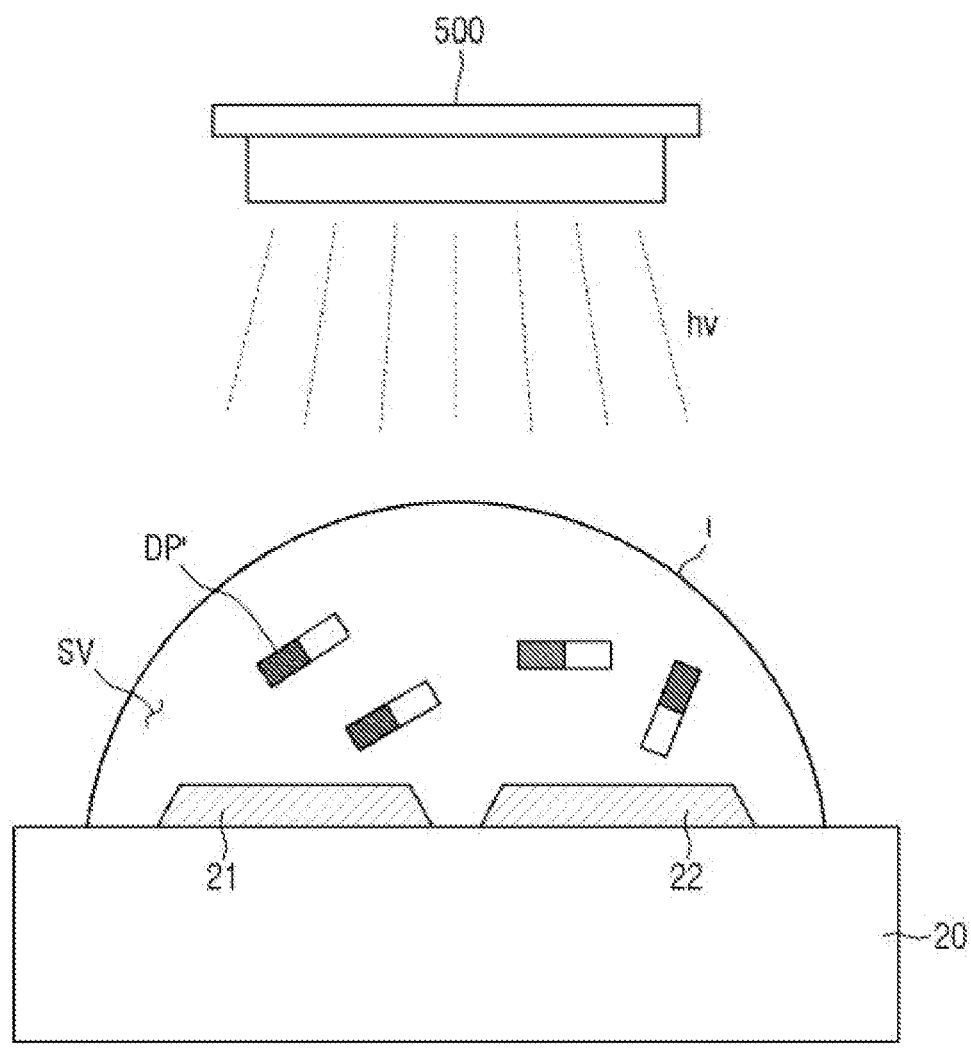
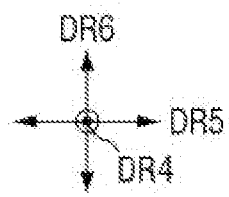

FIG. 28
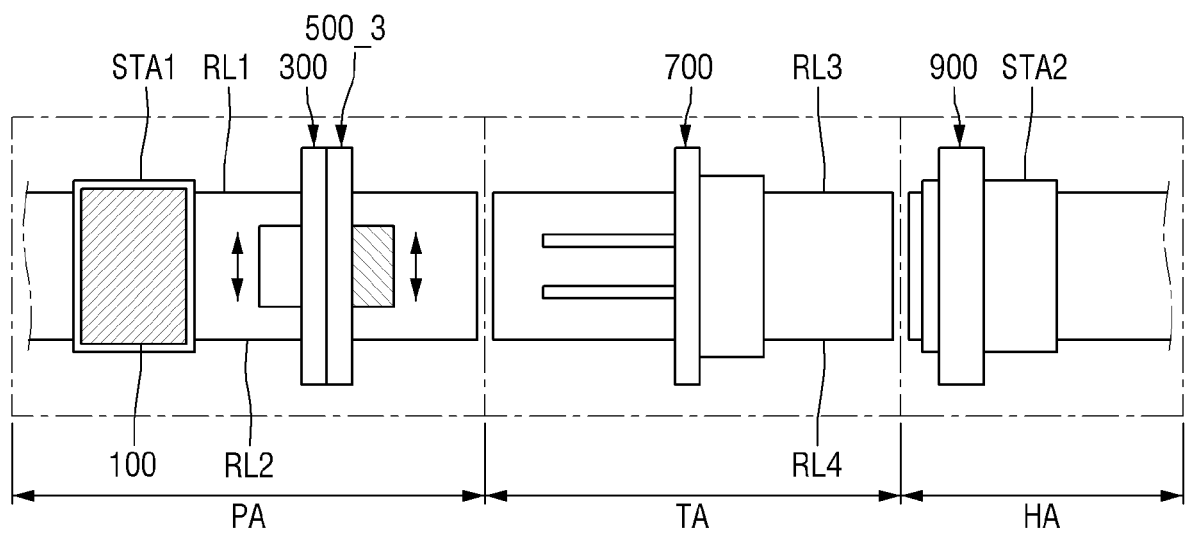
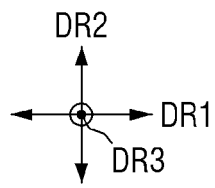

FIG. 32
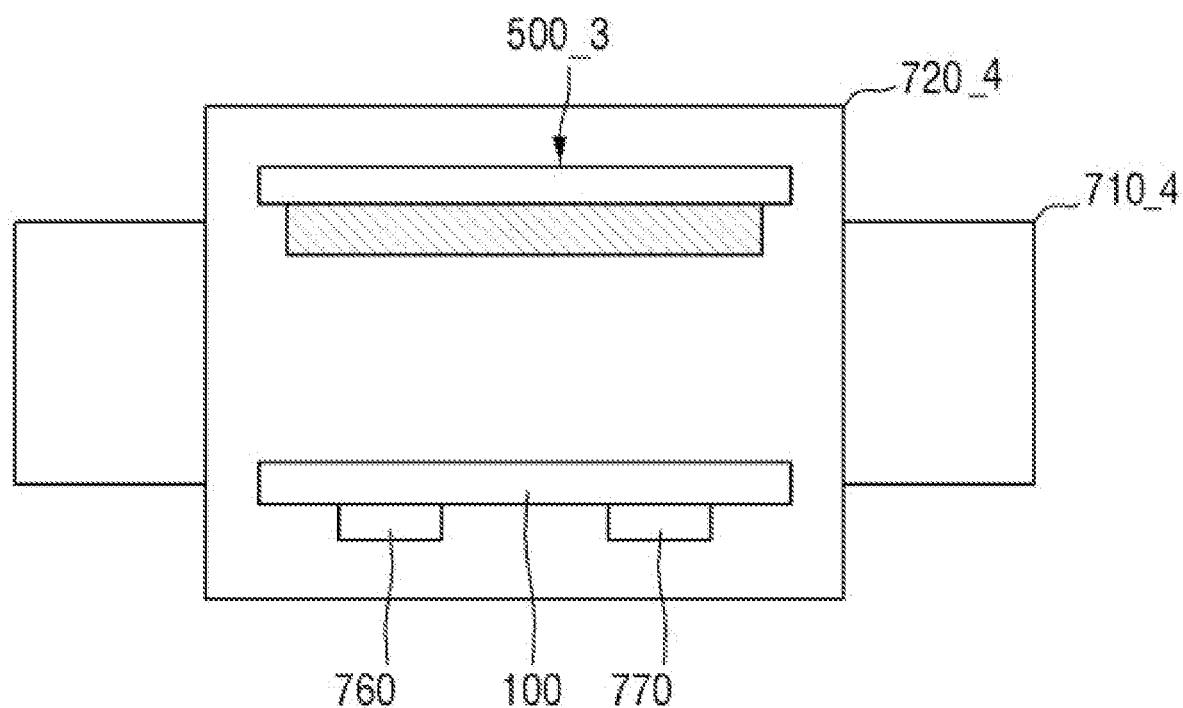
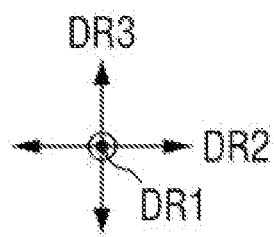

FIG. 38
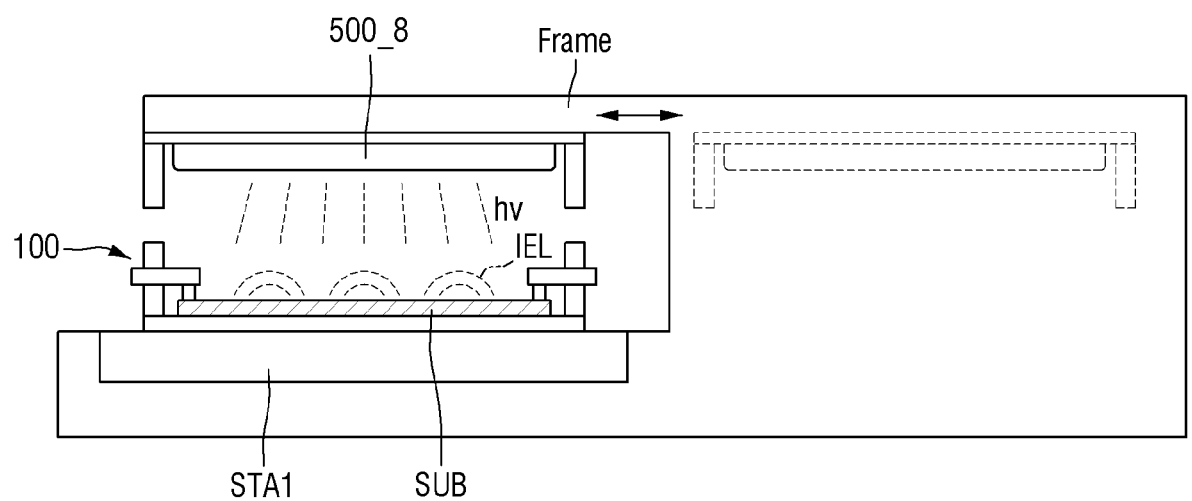
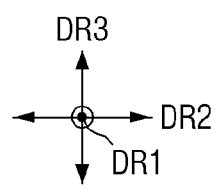

FIG. 41
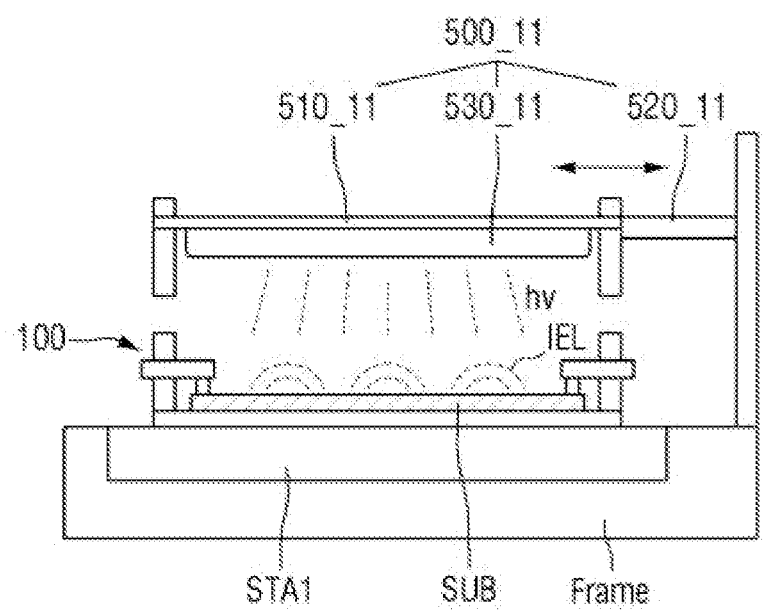
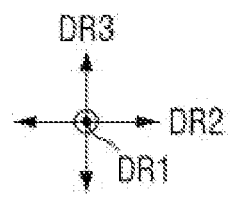

DIPOLE ALIGNMENT APPARATUS FOR USE IN MANUFACTURING OF DISPLAY DEVICE INCLUDING ELECTRIC FIELD FORMING UNIT HAVING A STAGE AND PROBE GENERATING ELECTRIC FIELD, AND APPLYING ELECTRIC FIELD SIMULTANEOUSLY WITH LIGHT IRRADIATION GENERATED BY THE LIGHT IRRADIATION DEVICE TO THE INK SPRAYED ON THE STAGE

CROSS-REFERENCE TO RELATED APPLICATION(S)

This application is a national entry of International Application No. PCT/KR2020/007232, filed on Jun. 3, 2020, which claims under 35 U. S.C. §§ 119(a) and 365(b) priority to and benefits of Korean Patent Application No. 10-2019-0093144, filed on Jul. 31, 2019, in the Korean Intellectual Property Office (KIPO), the entire contents of which are incorporated herein by reference.

BACKGROUND

1. Technical Field

The disclosure relates to a dipole alignment device, a dipole alignment method, and a display device manufacturing method, and particularly, to a dipole alignment device including an inkjet printing apparatus and a light irradiation apparatus, and a dipole alignment method and a display device manufacturing method using the dipole alignment device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

To address the aforementioned problems, embodiments of the disclosure provide a dipole alignment device including an inkjet printing apparatus and a light irradiation apparatus It should be noted that aspects of the disclosure are not limited thereto and other aspects, which are not mentioned herein, will be apparent to those of ordinary skill in the art from the following description.

According to an embodiment of the disclosure, a dipole alignment device may include an electric field forming part including a stage, and probe parts which form an electric field on the stage, an inkjet printing apparatus including at least one inkjet head which sprays ink including dipoles and a solvent with the dipoles dispersed therein onto the stage, a transportation part including a first moving part which moves the electric field forming part in at least one direction, and a light irradiation apparatus including a light irradiation part which applies light to the ink sprayed onto the stage.

The light irradiation apparatus may be disposed between the inkjet printing apparatus and the transportation part, and the inkjet printing apparatus may apply light after the ink is sprayed onto the stage.

The electric field forming part may form an electric field on the stage in case that light is applied to the ink.

The electric field forming part may form the electric field on the stage while light is being applied to the ink.

The light irradiation apparatus may be disposed in the inkjet printing apparatus, and the light irradiation apparatus may apply light onto the stage while the ink is being sprayed onto the stage.

The inkjet printing apparatus may further include a head base which moves in a direction, and the inkjet head may be disposed in the head base.

The light irradiation apparatus may further include a second moving part which moves in the direction, and the light irradiation part may be disposed in the second moving part.

The transportation part may include a plurality of supports which are disposed in the moving part, and the electric field forming part may move while being carried on the supports.

The light irradiation apparatus may be disposed in the transportation part, and the light irradiation apparatus may apply light onto the stage of the electric field forming part while being carried on the supports.

The electric field forming part may form an electric field on the stage while the light irradiation apparatus is applying light.

The dipole alignment device may further comprise a heat treatment apparatus applying heat onto the electric field forming part. The light irradiation apparatus may be disposed between the transportation part and the heat treatment apparatus.

The light irradiation apparatus may be disposed in the heat treatment apparatus, and the light irradiation apparatus may apply the light onto the stage while the heat treatment apparatus is applying heat onto the stage.

The electric field forming part may form an electric field on the stage while the light irradiation apparatus is applying light.

According to an embodiment of the disclosure, a dipole alignment method may include spraying ink including dipoles and a solvent with the dipoles dispersed therein onto a target substrate, applying light onto the target substrate to form an electric field on the target substrate and aligning the dipoles on the target substrate with the electric field, and removing the solvent and settling the dipoles on the target substrate.

The aligning of the dipoles on the target substrate may comprise aligning the dipoles such that an orientation direction of the dipoles is aligned by the electric field.

The applying of light onto the target substrate may be performed while an electric field is being formed on the target substrate.

The light applied onto the target substrate may be applied to the dipoles, and a dipole moment of the dipoles may increase.

The applying of light onto the target substrate may comprise applying light onto a first area defined on the target substrate and applying light to a second area located on a side of the first area.

The settling of the dipoles may comprise moving the target substrate to a heat treatment apparatus with the use of a transportation part and applying, by the heat treatment apparatus, heat onto the target substrate.

The applying of light onto the target substrate may be performed before the transportation part moves the target substrate, and the forming of an electric field on the target substrate may be performed while the transportation part is transferring the target substrate.

The applying of light onto the target substrate may be performed while the transportation part is transferring the target substrate.

The applying of light onto the target substrate may be performed before the heat treatment apparatus applies heat onto the target substrate, and the forming of an electric field on the target substrate may be performed while the heat treatment apparatus is applying heat onto the target substrate.

The applying of light onto the target substrate may be performed while the heat treatment apparatus is applying heat onto the target substrate.

The target substrate may include a first electrode and a second electrode, and the settling of the dipoles may comprise settling the dipoles on the first and second electrodes.

The spraying of the ink onto the target substrate may be performed with an inkjet printing apparatus.

According to an embodiment of the disclosure, a method of manufacturing a display device, comprising spraying ink including light-emitting elements and a solvent with the light-emitting elements dispersed therein onto a target substrate on which a first electrode and a second electrode are formed, applying light onto the target substrate and forming an electric field on the first and second electrodes, and settling the light-emitting elements on the first and second electrodes.

The light applied onto the target substrate may be applied to the light-emitting elements, and a dipole moment of the light-emitting elements may increase.

The first and second electrodes may extend in a direction, and the forming of an electric field on the first and second electrodes and the applying of light onto the target substrate may be performed at the same time.

The details of other embodiments are included in the detailed description and the accompanying drawings.

According to embodiments of the disclosure, as a dipole alignment device including an inkjet printing apparatus, an electric field forming part, and a light irradiation apparatus is provided, an electric field is formed by applying light to dipoles sprayed onto a target substrate. As light is applied, the alignment reactivity of the dipoles can be improved, and the dipoles can be aligned on the target substrate with a high degree of alignment by the electric field.

The effects according to the embodiments are not limited by the contents exemplified above, and more various effects are included in this disclosure.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 1 is a schematic plan view of a dipole alignment device according to an embodiment of the disclosure.

FIG. 3 is a schematic view illustrating how ink is ejected from an inkjet head, according to an embodiment of the disclosure.

FIG. 6 is a schematic plan view of an electric field forming part according to an embodiment of the disclosure.

FIG. 15 is a schematic front view of a heat treatment apparatus according to an embodiment of the disclosure.

FIG. 16 is a schematic view illustrating the operation of the heat treatment apparatus according to an embodiment of the disclosure.

FIG. 17 is a schematic view of a heat treatment apparatus according to another embodiment of the disclosure.

FIGS. 20 to 24 are schematic views illustrating how to align dipoles using the dipole alignment device according to an embodiment of the disclosure.

FIG. 28 is a schematic plan view of a dipole alignment device according to another embodiment of the disclosure.

FIG. 32 is a schematic front view of a transportation part of the dipole alignment device of FIG. 31.

FIGS. 38 to 40 are schematic views illustrating the operations of light irradiation apparatuses according to other embodiments.

FIG. 41 is a schematic view of a light irradiation apparatus according to another embodiment of the disclosure.

DETAILED DESCRIPTION OF THE EMBODIMENTS

Figure 2:
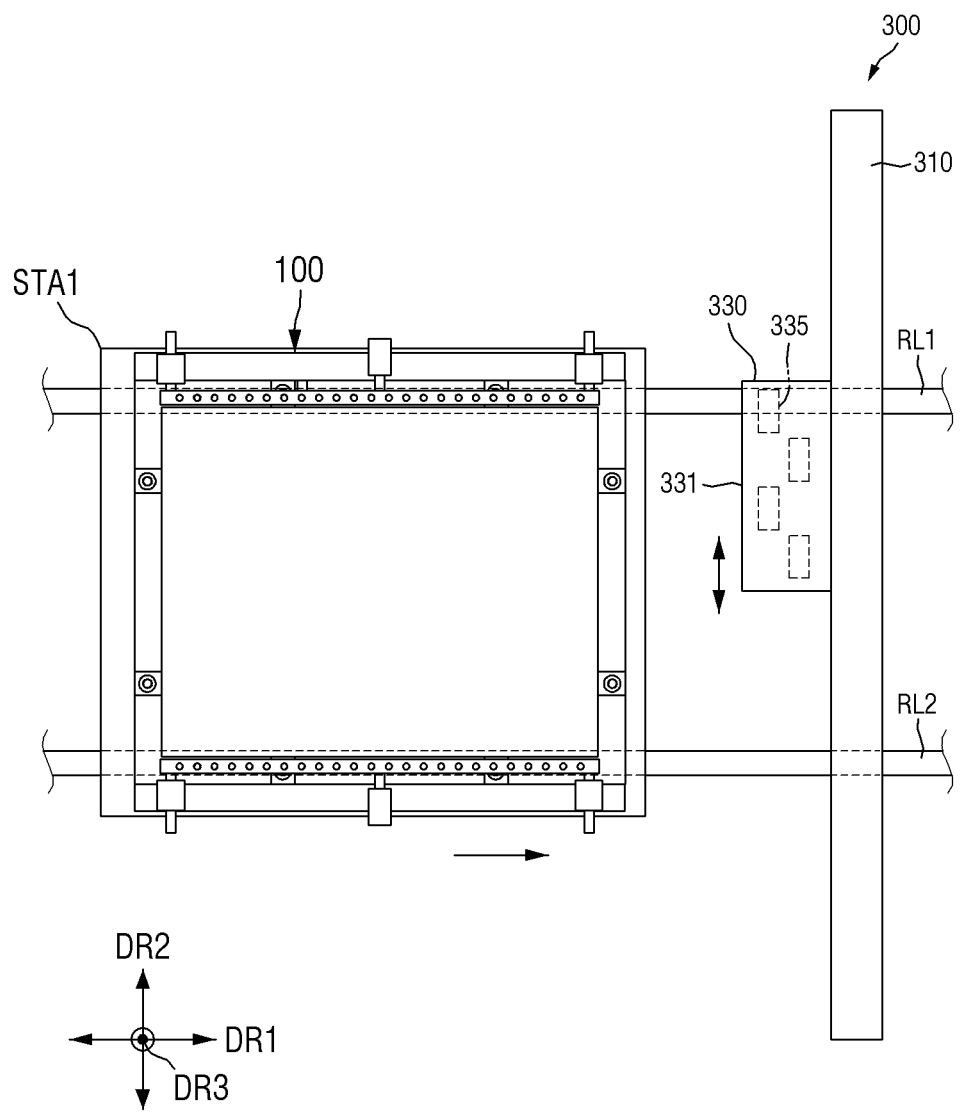
FIG. 2 is a schematic plan view of an inkjet printing apparatus according to an embodiment of the disclosure.

The disclosure will now be described more fully hereinafter with reference to the accompanying drawings, in which embodiments of the disclosure are shown. This disclosure may, however, be embodied in different forms and should not be construed as being limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

FIG. 1 is a schematic plan view of a dipole alignment device according to an embodiment.

Referring to FIG. 1, a dipole alignment device 1000 includes an electric field forming part 100, an inkjet printing apparatus 300, a light irradiation apparatus 500, and a transportation part 700. The dipole alignment device 1000 further includes a heat treatment apparatus 900.

The dipole alignment device 1000 may include a printing part PA, a transportation part TA, and a heat treatment part HA. The dipole alignment device 1000 may spray ink I (see FIG. 3) onto a target substrate SUB (see FIG. 3) by using the inkjet printing apparatus 300, which is disposed in the printing part PA. The target substrate SUB, onto which the ink I is sprayed, may be transferred to the heat treatment part HA via the transportation part TA, and particles such as dipoles included in the ink I may be aligned on the target substrate SUB.

The target substrate SUB may be provided on the electric field forming part 100, and the electric field forming part 100 may form an electric field on the target substrate SUB. The electric field may be transmitted to the ink I sprayed on the target substrate SUB, and the particles such as the dipoles included in the ink I may be aligned in a direction by the electric field. The light irradiation apparatus 500, which is included in the dipole alignment device 1000, may apply light to the ink I and may thus improve the alignment reactivity of particles with an electric field.

As illustrated in FIG. 1, first, second, and third directions DR1, DR2, and DR3 are defined. The first and second directions DR1 and DR2 may be positioned on a plane and may be directions that are orthogonal to each other, and the third direction DR3 may be a direction that is perpendicular to the first and second directions DR2 and DR2. As illustrated in FIG. 1, the first direction DR1 may be a widthwise direction, the second direction DR2 may be a lengthwise direction, and the third direction DR3 may be a vertical direction.

FIG. 1 illustrates a schematic plan view of the dipole alignment device 1000 as viewed from above. FIG. 1 is a schematic view for explaining the layout and operations of elements included in the dipole alignment device 100, but the structure and layout of the dipole alignment device 1000 are not limited to those in FIG. 1. The dipole alignment device 1000 may include more elements than those illustrated in FIG. 1 and may have a different structure from that illustrated in FIG. 1. The structure and operation of the dipole alignment device 1000 will hereinafter be described in detail with reference to FIG. 1 and other drawings.

FIG. 2 is a schematic plan view of an inkjet printing apparatus according to an embodiment. FIG. 2 is a schematic plan view of the inkjet printing device 300 as viewed in the third direction DR3, for example, as viewed from above.

Referring to FIGS. 1 and 2, the printing part PA of the dipole alignment device 1000 includes the inkjet printing device 300 and a first stage STA1.

The first stage STA1 may provide an area in which the electric field forming part 100 is disposed. The printing part PA of the dipole alignment device 1000 includes first and second rails RL1 and RL2, which extend in the first direction DR1, and the first stage STA1 is disposed on the first and second rails RL1 and RL2. The first stage STA1 may move in the first direction DR1 on the first and second rails RL1 and RL2 via a separate moving member. As the first stage STA1 moves, the electric field forming part 100 may also move in the first direction DR1, and as a result, the ink I may be sprayed onto the electric field forming part 100 while the electric field forming part 100 is passing through the inkjet printing apparatus 300.

The inkjet printing apparatus 300 may include a first support 310 and an inkjet head part 330. The inkjet printing device 300 may spray the ink I onto the target substrate SUB, which is provided on the electric field forming part 100, by using the inkjet head part 330, which is extended to a separate ink storage.

In an embodiment, the ink I may include a solvent SV and dipoles DP, which are included in the solvent SV. In an embodiment, the ink I may be provided as a solution or a colloid. In an example, the solvent SV may be acetone, water, alcohol, toluene, propylene glycol (PG), or propylene glycol methyl acetate (PGMA), but the disclosure is not limited thereto. The dipoles DP may be dispersed in the solvent SV and may be supplied to, and ejected from, the inkjet printing apparatus 300.

The first support 310 of the inkjet printing apparatus 300 may extend in the second direction DR2 and may be positioned above the first and second rails RL1 and RL2. Although not specifically illustrated, the first support 310 may be connected to a base frame, which supports the first support 310, and the first stage STA1 may pass below the first support 310. FIG. 2 schematically illustrates the shape of the first support 310 of the inkjet printing apparatus 300, but the shape of the first support 310 is limited to that illustrated in FIG. 2. The first support 310 may have various other structures or may further include other members than those illustrated in FIG. 2.

The inkjet head part 330 may be disposed on the first support 310. The inkjet head part 330 may be connected to the ink storage and may be provided with the ink I. The inkjet head part 330 may spray the ink onto the target substrate SUB via inkjet heads 335 that will be described below. A method by which the inkjet head part 330 is disposed in the first support 310 is not particularly limited. The inkjet head part 330 is illustrated as being disposed directly on the first support 310, but the inkjet head part 330 may be coupled (or connected) to, or mounted on, the first support 310 via a separate member. As another example, the inkjet head part 330 may be directly coupled to the first support 310.

The inkjet head part 330 may include a head base 331 and the inkjet heads 335, which are disposed on a surface of the head base 331 and include nozzles NZ.

The head base 331 of the inkjet head part 330 may be mounted on the first support 310. In an example, the head base 331 may extend in the second direction DR2. The head base 331 may be spaced from the first stage STA1 by a predetermined distance, which passes below the first support 310. In an embodiment, the head base 331 may further include a moving member and may be movable in a direction over the first support 310.

The inkjet heads 335 are disposed on the surface of the head base 331, for example, on the bottom surface, in the third direction DR3, of the head base 331. The inkjet heads 335 may be spaced from each other in a direction. The inkjet heads 335 may be arranged in a direction in one or more columns. The inkjet heads 335 are illustrated as being arranged in two columns in a staggered manner, but the disclosure is not limited thereto. The inkjet heads 335 may be arranged in more than two columns not in a staggered manner, but in an aligned manner. The shape of the inkjet heads 335 is not particularly limited. In an example, the inkjet heads 335 may have a rectangular shape.

At least one inkjet heads 335, for example, two inkjet heads 335, may form a pack together and may be disposed adjacent to each other. However, the number of inkjet heads 335 included in one pack is not particularly limited. In an example, one to five inkjet heads 335 may be included in one pack.

Also, the inkjet head unit 330 is illustrated as having four inkjet heads 335 disposed therein, but the number of inkjet heads 335 is not particularly limited. In an embodiment, the number of inkjet heads 335 included in an inkjet head part 330 may be about 128 to about 1800.

Each of the inkjet heads 335 may include nozzles NZ and may thus spray the ink I onto the target substrate SUB by receiving the ink I from the head base 331. The nozzles NZ at the bottom surface of each of the inkjet heads 335 may be connected to an inner tube IP of the corresponding inkjet head 335. The ink I may move from the head base 331 to each of the inkjet heads 335, may flow along the inner tube IP of each of the inkjet heads 335, and may then be ejected through the nozzles NZ of each of the inkjet heads 335.

Figure 4:
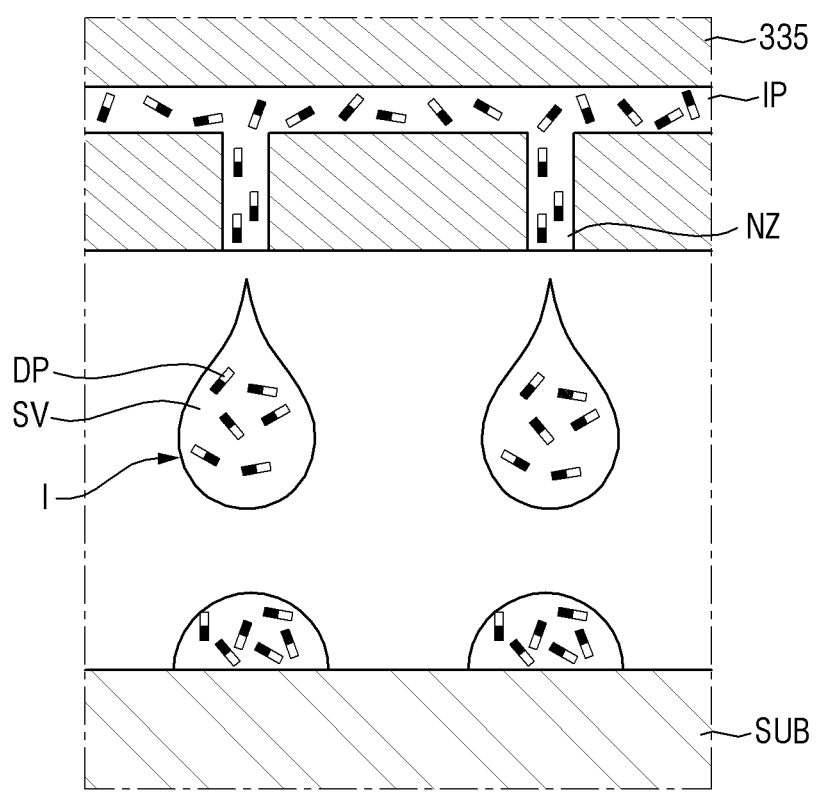
FIG. 4 is a schematic view illustrating how ink is sprayed onto a target substrate, according to an embodiment of the disclosure.

FIG. 3 is a schematic view illustrating how ink is ejected from an inkjet head, according to an embodiment. FIG. 4 is a schematic view illustrating how ink is sprayed onto a target substrate, according to an embodiment.

Referring to FIGS. 3 and 4, an inkjet head 335 may include an inner tube IP, to which the ink I is delivered, and nozzles NZ, via which the ink I is ejected, and the ink I may be ejected through the nozzles NZ and may thus be sprayed onto the target substrate SUB. The amount of ink I sprayed through the nozzles NZ may be controlled in accordance with a voltage applied to each of the nozzles NZ. In an embodiment, the amount of ink ejected at one time through each of the nozzles NZ may be, but not limited to, about 1 to about 50 picoliters (pl).

The ink I ejected from the inkjet head 335 may include dipoles DP and a solvent SV, and the dipoles DP may be ejected through the nozzles NZ together with the solvent SV. The dipoles DP may be supplied to the inkjet head 335 in a state of being dispersed in the solvent SV. FIG. 4 illustrates that dipoles DP are dispersed in random orientation directions in the ink I ejected from the inkjet head 335. As will be described below, the dipoles DP may extend in a direction and may be oriented in a particular direction by an electric field formed by the electric field forming part 100. The dipoles DP may be settled or positioned on the target substrate SUB in a state of being oriented in a direction by the electric field. The solvent SV is evaporated by a subsequent process so that only the dipoles DP remain. This will be described below.

In an embodiment, the inkjet head part 330 may move in a direction, for example, in the second direction DR2, over the first support 310.

Figure 5:
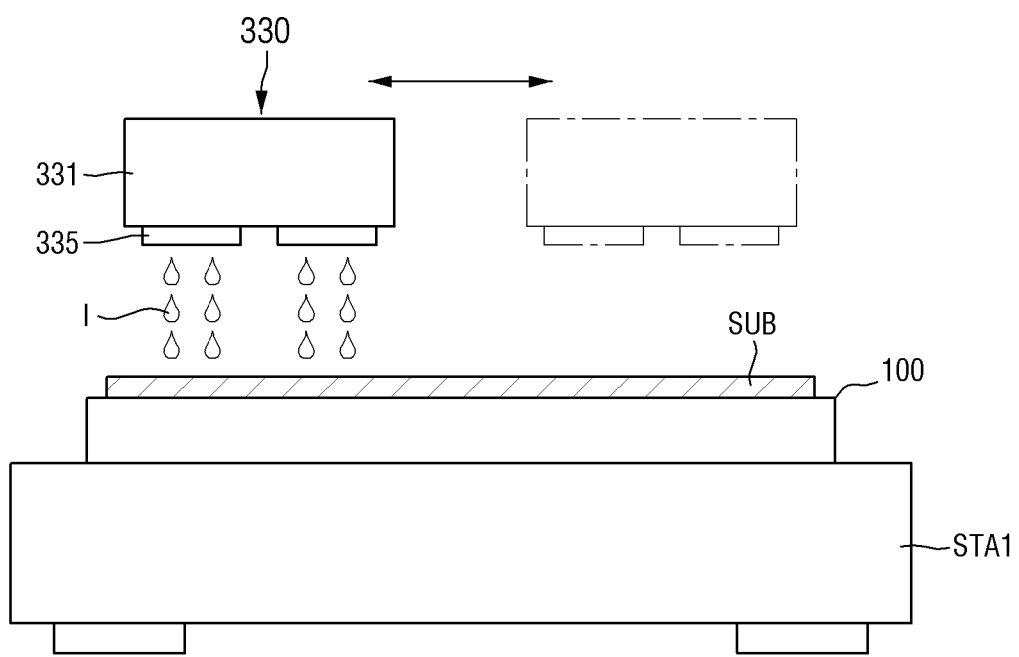
FIG. 5 is a schematic view illustrating the operation of an inkjet head part according to an embodiment of the disclosure.

FIG. 5 is a schematic view illustrating the operation of an inkjet head part according to an embodiment. FIG. 5 illustrates an inkjet head part 330 and the electric field forming part 100, which is disposed on the first stage STA1, as viewed from the front.

Referring to FIGS. 2 and 5, the inkjet head part 330 may move in the direction in which a first support 310 extends, for example, in the second direction DR2, and may spray the ink I onto the target substrate SUB. In some embodiments, the width, in the second direction DR2, of the target substrate SUB may be greater than the width of the inkjet head part 330. In this case, the inkjet head part 330 may spray the ink I onto the entire surface of the target substrate SUB while moving in the second direction DR2. Multiple target substrates SUB may be provided on the electric field forming part 100, and the inkjet head part 330 may spray the ink I onto the multiple target substrates SUB while moving in the second direction DR2.

However, the disclosure is not limited thereto. As another example, the inkjet head part 330 may be positioned on the outside of the first and second rails RL1 and RL2 and may move in the second direction DR2 to spray the ink I. In case that the first stage STA1 moves in the first direction DR1 to be positioned below the first support 310, the inkjet head part 330 may move between the first and second rails RL1 and RL2 to spray the ink I. The operation of the inkjet head part 330 may vary. In an example, the inkjet head part 330 may be mounted on the first support 310 and may move in the second direction DR2 via a separate moving member. As another example, the inkjet head part 330 may be coupled into a groove formed in the first support 310 and may perform the above-described operation. The operation of the inkjet head part 330 is not limited to these examples, and detailed descriptions thereof will be omitted.

The electric field forming part 100 may be disposed on the first stage STA1, in the printing part PA of the dipole alignment device 1000. The electric field forming part 100 may provide space in which the target substrate SUB may be prepared (or provided), and as the ink I is sprayed onto the target substrate SUB, the electric field forming part 100 may form an electric field on the target substrate SUB. The electric field may cause the dipoles included in the ink I to be oriented in a direction.

FIG. 6 is a schematic plan view of an electric field forming part according to an embodiment.

Referring to FIGS. 1 and 6, the electric field forming part 100 may include a substage 110, probe supports 130, probe parts 150, and aligners 180.

The electric field forming part 100 may be disposed on the first stage STA1, in the printing part PT, and may be moved in the first direction DR1 by the first stage STA1. The electric field forming part 100 where the target substrate SUB is prepared may form an electric field on the target substrate SUB while moving along the printing part PA, the transportation part TA, and the heat treatment part HA.

The substage 110 may provide space in which the target substrate SUB may be disposed. The probe supports 130, the probe parts 150, and the aligners 180 may be disposed on the substage 110. The shape of the substage 110 is not particularly limited. In an example, the substage 110 may have a rectangular shape having both sides extending in the first and second directions DR1 and DR2, as illustrated in FIG. 6. The planar shape of the substage 110 may vary depending on the planar shape of the target substrate SUB. In an example, if the target substrate SUB has a rectangular shape, the substage 110 may also have a rectangular shape. As another example, if the target substrate SUB has a circular shape, the substage 110 may also have a circular shape.

One or more aligners 180 may be disposed on the substage 110. The aligners 180 may be disposed on sides of the substage 110, and an area surrounded by the aligners 180 may be an area in which the target substrate SUB may be disposed. FIG. 6 illustrates that two aligners 180 are disposed on each of the sides of the substage 110 to be spaced apart from each other and a total of eight aligners 180 are provided on the substage 110, but the disclosure is not limited thereto. For example, the number and layout of aligners 180 may vary depending on the shape or type of the target substrate SUB.

The probe supports 130 and the probe parts 150 are disposed on the substage 110. The probe supports 130 may provide space in which the probe parts 150 may be disposed, on the substage 110. The probe supports 130 may be disposed on one or more sides of the substage 110 and may extend in the same direction as the corresponding sides of the substage 110. In an example, as illustrated in FIG. 6, the probe supports 130 may be disposed on the left and right sides of the substage 110 to extend in the second direction DR2, but the disclosure is not limited thereto. As another example, more than two probe supports 130 may be provided, and the probe supports 130 may also be disposed on the upper and lower sides of the substage 110. For example, the structure of the probe supports 130 may vary depending on the number, layout, or structure of the probe parts 150 included in the electric field forming part 100.

The probe parts 150 may be disposed on the probe supports 130 and may form an electric field on the target substrate SUB, prepared on the substage 110. The probe parts 150 may extend in the same direction as the probe supports 130, for example, in the second direction DR2, and the probe parts 150 may extend long enough to cover (or overlap) the entire target substrate SUB. For example, the sizes and shapes of the probe parts 130 and the probe parts 150 may be determined by the target substrate SUB.

In an embodiment, each of the probe parts 150 may include probe drivers 153, which are disposed on one of the probe supports 130, probe jigs 151, which are disposed on the probe drivers 153 to receive electric signals, and probe pads 158, which are electrically connected to the probe jigs 151 to transmit electric signals to the target substrate SUB.

The probe drivers 153 may be disposed on one of the probe supports 130 and may move the probe jigs 151 and the probe pads 158. In an embodiment, the probe drivers 153 may move the probe jigs 151 in horizontal and vertical directions, for example, in the second and third directions DR2 and DR3, which are the horizontal and vertical directions, respectively. The probe pads 158 may be driven by the probe drivers 153 to be electrically connected to, or electrically disconnected from, the target substrate SUB. During the operation of the dipole alignment device 1000, the probe drivers 153 may be driven to electrically connect the probe pads 158 to the target substrate SUB in the step of forming an electric field on the target substrate SUB and may be driven again to electrically disconnect the probe pads 158 from the target substrate SUB in other steps. This will be described below with reference to other drawings.

The probe pads 158 may form an electric field on the target substrate SUB in response to electric signals transmitted thereto from the probe jigs 151. The probe pads 158 may be electrically connected to the target substrate SUB to transmit the electric signals and thus to form an electric field on the target substrate SUB. In an example, the probe pads 158 may contact an electrode or a power supply pad of the target substrate SUB, and electric signals from the probe jigs 151 may be transmitted to the electrode or the power supply pad. The electric signals transmitted to the target substrate SUB may form an electric field on the target substrate SUB.

However, the disclosure is not limited thereto. The probe pads 158 may be members for forming an electric field in response to electric signals transmitted thereto from the probe jigs 151. For example, in case that the probe pads 158 form an electric field by receiving electric signals, the probe pads 158 may not be electrically connected to the target substrate SUB.

The shape of the probe pads 158 is not particularly limited. In an embodiment, the probe pads 158 may extend in a direction to cover the entire target substrate SUB.

The probe jigs 151 may be electrically connected to the probe pads 158 and to a separate voltage applying device.

The probe jigs 151 may transmit electric signals applied thereto from the voltage applying device to the probe pads 158 and may thus form an electric field on the target substrate SUB. The electric signals transmitted to the probe jigs 151 may be voltages for forming an electric field, for example, alternating voltages.

Each of the probe parts 150 may include probe jigs 151, and the number of probe jigs 151 included in each of the probe parts 150 is not particularly limited. FIG. 6 illustrates that three probe jigs 151 and three probe drivers 153 are disposed in each of the probe parts 150, but each of the probe parts 150 may include more than three probe jigs 151 and more than three probe drivers 153 and may thus be able to form an electric field with a higher density on the target substrate SUB.

The probe parts 150 are not limited thereto. FIG. 6 illustrates that the probe parts 150 are disposed on the probe supports 130, for example, in the electric field forming part 100, but in some embodiments, the probe parts 150 may be provided as separate devices. The structure and layout of the electric field forming part 100 are not particularly limited, as long as the electric field forming part 100 includes a device capable of forming an electric field and can thus form an electric field on the target substrate SUB.

Figure 7:
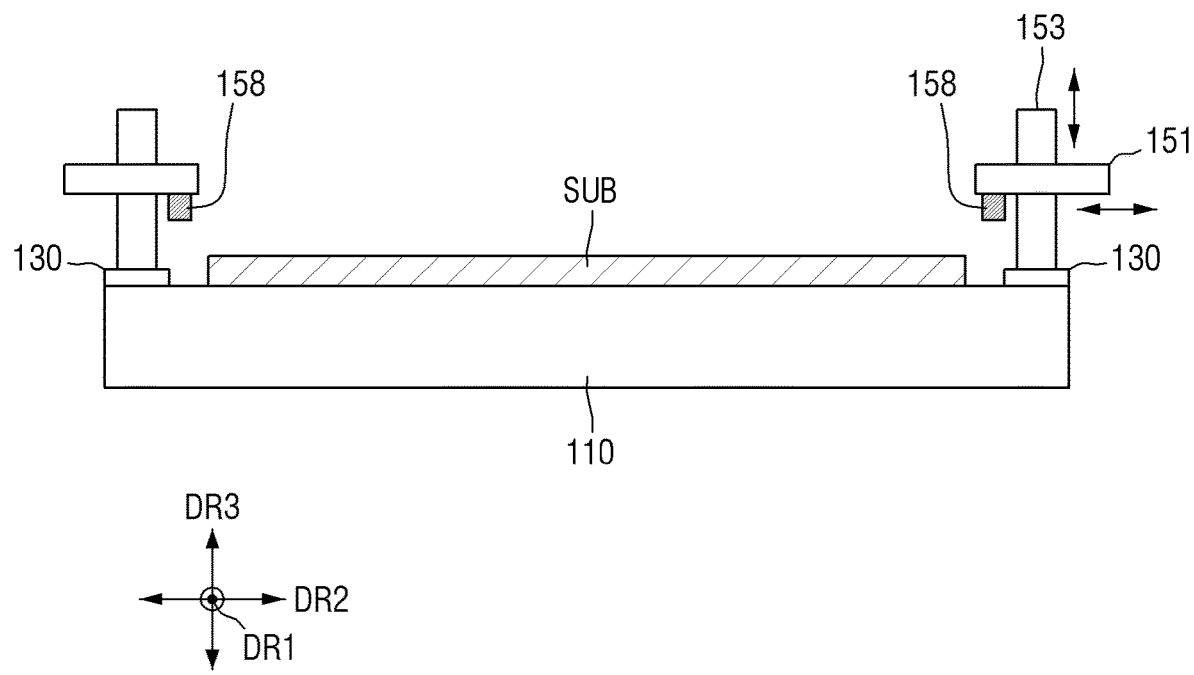
FIGS. 7 and 8 are schematic views illustrating the operation of the electric field forming part according to an embodiment of the disclosure.
Figure 8:
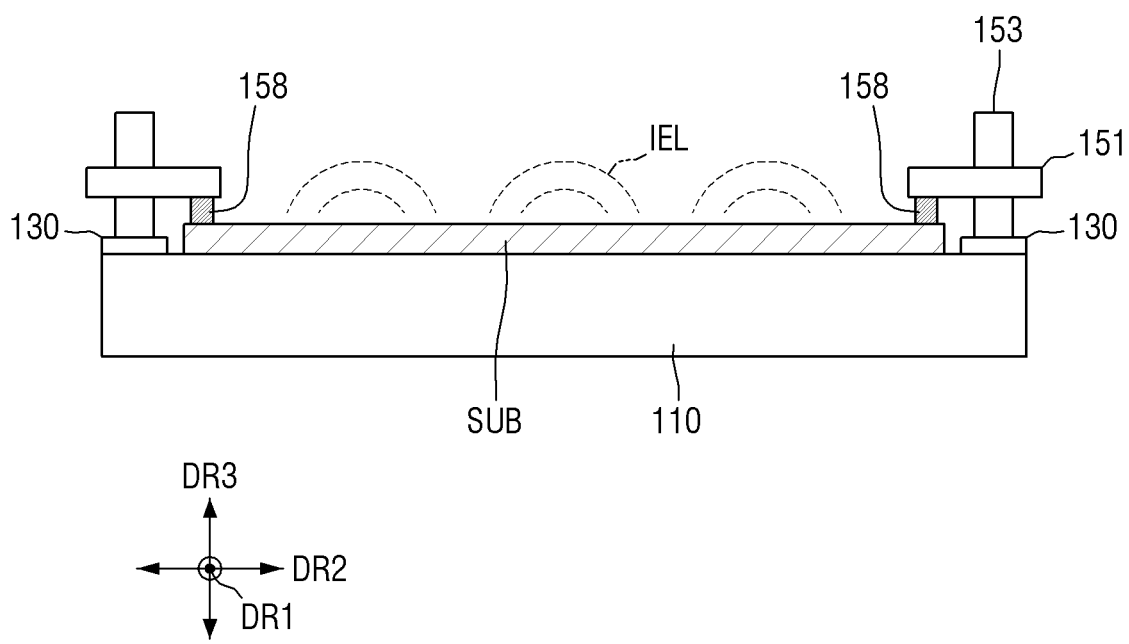

FIGS. 7 and 8 are schematic views illustrating the operation of the electric field forming part according to an embodiment.

As already mentioned above, the probe drivers 153 of each of the probe parts 150 may be driven in accordance with the operation of the dipole alignment device 1000. Referring to FIGS. 7 and 8, in a first state where an electric field is not being formed in the electric field forming part 100, the probe parts 150 may be disposed on the probe supports 130 and may be spaced apart from the target substrate SUB. The probe drivers 153 of each of the probe parts 150 may be driven in the second direction DR2, which is a horizontal direction, and the third direction DR3, which is a vertical direction, to detach the probe pads 158 from the target substrate SUB.

In a second state where an electric field is being formed on the target substrate SUB, the probe drivers 153 of each of the probe parts 150 may be driven to electrically connect the probe pads 158 to the target substrate SUB. The probe drivers 153 may be driven in the third direction DR3, which is the vertical direction, and the second direction DR2, which is the horizontal direction, so that the probe pads 158 may contact the target substrate SUB. The probe jigs 151 of each of the probe parts 150 may transmit electric signals to the probe pads 158 so that an electric field may be formed on the target substrate SUB.

FIGS. 7 and 8 illustrate that two probe parts 150 may be disposed on either side of the electric field forming part 100 and are simultaneously electrically connected to the target substrate SUB, but the disclosure is not limited thereto. As another example, the probe parts 150 may be driven separately. In an example, as the target substrate SUB is prepared on the substage 110 and the ink I is sprayed, a first probe part 150 may form an electric field first on the target substrate SUB, and a second probe part 150 may not be electrically connected to the target substrate SUB. The first probe part 150 may be electrically disconnected from the target substrate SUB, and the second probe part 150 may be electrically connected to the target substrate SUB to form an electric field. For example, multiple probe parts 150 may be driven at the same time to form an electric field or may be driven one after another to form an electric field one after another.

Figure 9:
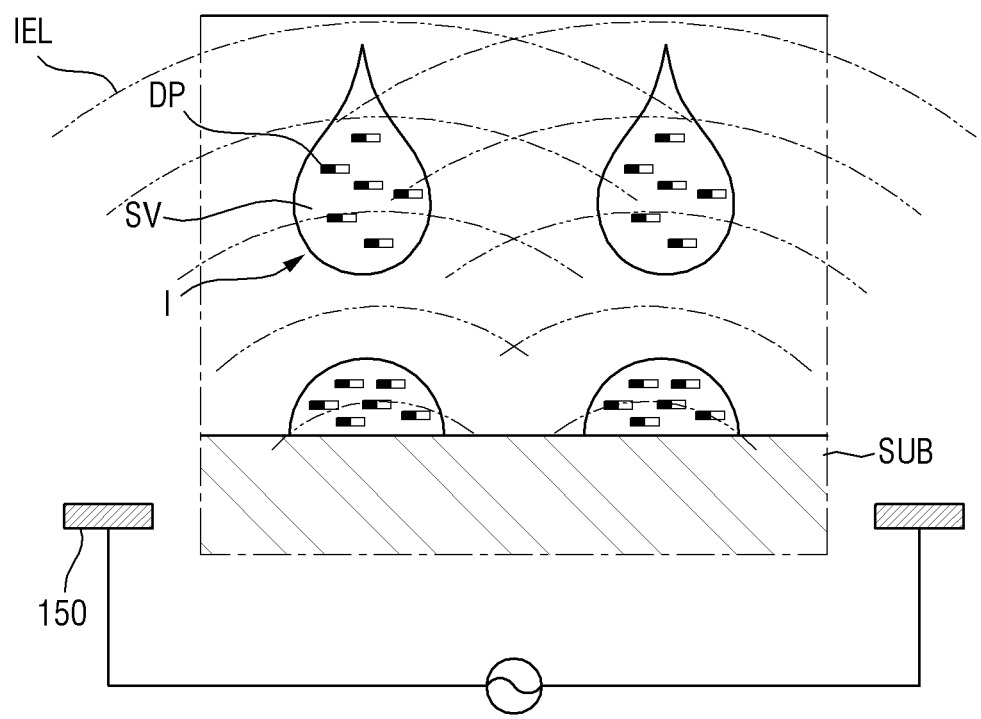
FIG. 9 is a schematic view illustrating how an electric field is formed on a target substrate by a probe part, according to an embodiment of the disclosure.

FIG. 9 is a schematic view illustrating how an electric field is formed on a target substrate by a probe part, according to an embodiment.

As already mentioned above, an electric field may be formed on the target substrate SUB, and ink I sprayed onto the target substrate SUB may include dipoles DP. The dipoles DP may be oriented in a direction by the electric field formed on the target substrate SUB.

Each of the dipoles DP may be an entity having a first polarity at a first end portion thereof and a second polarity, which is different from the first polarity at a second end portion thereof. In an example, the first end portions of the dipoles DP may have positive polarity, and the second end portions of the dipoles DP may have negative polarity. When (or in case that) the dipoles DP, which have different polarities at both end portions thereof, are placed in a predetermined electric field, the dipoles DP may receive an electric force (for example, an attractive or repulsive force), and thus, the orientation direction of the dipoles DP may be controlled.

Referring to FIG. 9, the ink I may include the dipoles DP and may be ejected from the nozzles NZ of each of the inkjet heads 335. The ink I ejected from the nozzles NZ may be sprayed onto the target substrate SUB. If an electric field IEL is formed on the target substrate SUB, the dipoles DP, which have the first and second polarities, may continue to receive an electric force until, or even after, the ink I from the nozzles NZ is settled on the target substrate SUB. The dipoles DP may be oriented by the electric force, and the orientation direction of the dipoles DP may be, for example, the direction faced by the electric field IEL.

FIG. 9 illustrates that the probe parts 150 form the electric field IEL in case that the ink I is being sprayed from the nozzles NZ. Thus, the dipoles DP may continue to receive a force from the electric field IEL until the ink I is ejected from the nozzles NZ and arrives at the target substrate SUB. However, the disclosure is not limited thereto. In some embodiments, the probe parts 150 may form the electric field IEL after the ink I is sprayed onto the target substrate SUB. In this case, the dipoles DP may be sprayed onto the target substrate SUB in random orientation directions and may be aligned later in a direction, within the sprayed ink I, by the electric field IEL.

FIG. 9 illustrates that the probe parts 150 form the electric field on the target substrate SUB when the ink I is being sprayed onto the target substrate SUB, but the disclosure is not limited thereto. As another example, the probe parts 150 may form the electric field IEL after the electric field forming part 100 moves to the heat treatment apparatus 900 in a subsequent step. For example, the probe parts 150 may form the electric field when the ink I is being sprayed or when the solvent SV of the ink I is being removed.

The time when the electric field forming part 100 forms the electric field IEL on the target substrate SUB is not particularly limited. In some embodiments, the electric field forming part 100 may form the electric field IEL when or after the ink I is being sprayed from the inkjet head parts 330, or when or after light is being applied by the light irradiation apparatus 500, as will be described below. The electric field forming part 100 may form an electric field in case that the electric field forming unit 100 is placed in an area other than the printing part PA of the dipole alignment device 1000, and this will be described below.

Although not specifically illustrated, in some embodiments, an electric field forming member may be further disposed on the substage 110. The electric field forming member may form an electric field on the target substrate SUB on the substage 110 (for example, in the third direction DR3). In an embodiment, the electric field forming member may be an antenna part or a device including electrodes.

The ink I sprayed onto the target substrate SUB includes the dipoles DP, and the dipoles DP may receive an electric force from the electric field IEL formed by the electric field forming part 100 and may thus be oriented in a direction. In some embodiments, the dipoles DP may include a semiconductor material with a high specific gravity, and the solvent SV of the ink I may be a high-viscosity solution such that the dipoles DP having a high specific gravity can be dispersed for a long period of time. In this case, even if the electric field forming part 100 generates the electric field IEL, the dipoles DP may not be properly oriented.

To improve the degree of orientation of the dipoles DP by the electric field IEL, the dipole alignment device 1000 may include the light irradiation apparatus 500, which emits light. As light is applied to the ink I before the formation of the electric field IEL by the electric field forming part 100, the dipole moment of the dipoles DP increases so that the dipoles DP may receive a stronger force even from a same electric field IEL. For example, the alignment reactivity of the dipoles DP with respect to the electric field IEL may increase. The light irradiation apparatus 500 will hereinafter be described with reference to other drawings.

Figure 10:
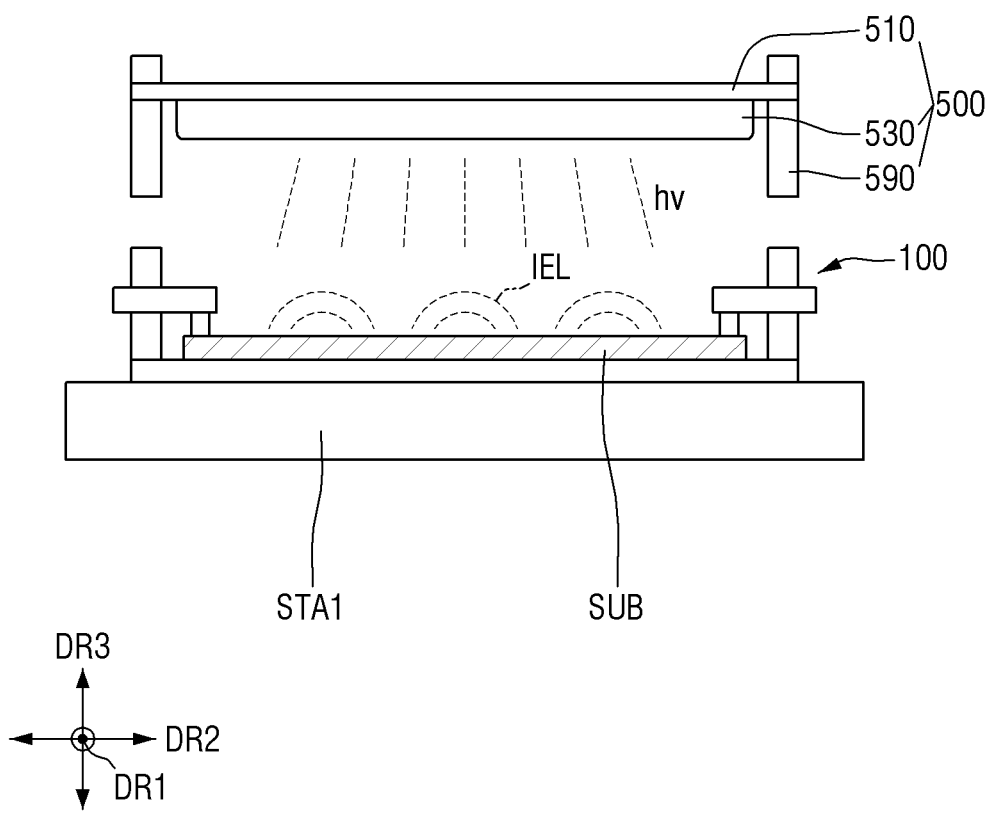
FIG. 10 is a schematic cross-sectional view illustrating an operation of a light irradiation apparatus according to an embodiment of the disclosure.

FIG. 10 is a schematic cross-sectional view illustrating an operation of a light irradiation apparatus according to an embodiment. FIG. 10 is a schematic plan view of the light irradiation apparatus 500 as viewed from the front.

The dipole alignment device 1000 may include the light irradiation apparatus 500. The light irradiation apparatus 500 may be disposed in the printing part PA, between the inkjet printing apparatus 300 and the transportation part 700, but the disclosure is not limited thereto. The light irradiation apparatus 500 may be positioned elsewhere. Various embodiments of the light irradiation apparatus 500 will be described below with reference to other drawings.

The light irradiation apparatus 500 may include a second support 510 and a light irradiation part 530. The light irradiation apparatus 500 may further include a sensing part 590.

The second support 510 may extend in the second direction DR2 and may be positioned above the first stage STA1 of the printing part PA. Although not specifically illustrated, the second support 510 may be connected to a base frame that supports the second support 510, and the first stage STA1 may pass below the second support 510. FIG. 10 schematically illustrates the shape of the second support 510 of the light irradiation apparatus 500, but the shape of the second support 510 of the light irradiation apparatus 500 is not limited to that illustrated in FIG. 10. The second support 510 may have various other structures or may further include other members than those illustrated in FIG. 10.

The sensing part 590 may be disposed on the second support 510 of the light irradiation apparatus 500 and may control the location of the light irradiation part 530. The light irradiation apparatus 500 may apply light hv onto the electric field forming part 100, and the sensing part 590 may sense the location of the light irradiation apparatus 500 and may thus allow the light irradiation apparatus 500 to apply the light hv to an exact location. However, the disclosure is not limited thereto, and the sensing part 590 may not be provided.

The light irradiation part 530 may be disposed on the second support 510. The light irradiation part 530 may apply the light hv onto the electric field forming part 100, which is disposed on the first stage STA1. The method by which the light irradiation part 530 is disposed on the second support 510 is not particularly limited. FIG. 10 illustrates that the light irradiation part 530 is disposed directly on the second support 510, but as another example, the light irradiation part 530 may be coupled to, or mounted on, the second support 510 via a separate member. As still another example, the light irradiation part 530 may be directly coupled to the second support 510.

The type of the light irradiation part 530 is not particularly limited. In some embodiments, the light irradiation part 530 may include mercury light, Fe-based metal halide-series, Ga-based metal halide series, or semiconductor light-emitting elements, but the disclosure is not limited thereto.

The light irradiation apparatus 500 may improve the alignment reactivity of the dipoles DP with respect to the electric field IEL by applying the light hv to the ink I sprayed onto the target substrate SUB. The dipoles DP may include first end portions having the first polarity and second end portions having the second polarity and may thus have a dipole moment. The dipoles DP having a dipole moment may receive a predetermined electric force from the electric field IEL formed by the electric field forming part 100 and may thus be oriented in a direction. As the light irradiation apparatus 500 applies the light hv at the dipoles DP, partial polarities may be further formed in the dipoles DP so that the dipole moment of the dipoles DP may further increase, and the electric force from the electric field IEL may become further stronger. Accordingly, the alignment reactivity of the dipoles DP dispersed in the ink I may increase, and the dipoles DP may be oriented on the target substrate SUB with a high degree of alignment.

Figure 11:
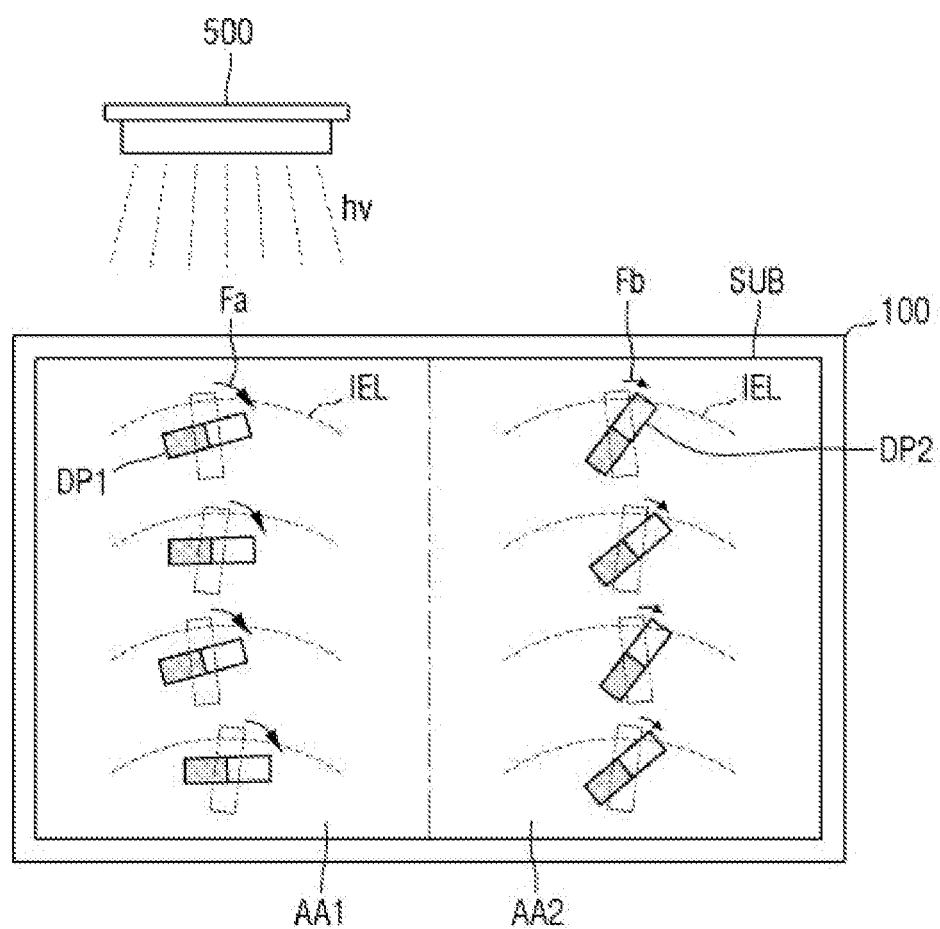
FIG. 11 is a schematic view illustrating how light is applied to dipoles, according to an embodiment of the disclosure.

FIG. 11 is a schematic view illustrating how light is applied to dipoles, according to an embodiment.

Referring to FIG. 11, the dipoles DP are sprayed onto the target substrate SUB prepared on the electric field forming part 100, and the light irradiation apparatus 500 may apply the light hv to the ink I sprayed onto the target substrate SUB. Here, a first area AA1, to which the light hv is applied, and a second area AA2, to which the light hv is not applied, may be defined on the target substrate SUB, and there may exist first dipoles DP1, which are located in the first area AA1 and is thus irradiated with the light hv, and second dipoles DP2, which are located in the second area AA2 and is thus not irradiated with the light hv, among the dipoles DP dispersed in the ink I.

The dipole moment of the first dipoles DP1, which are irradiated with the light hv, may become greater than the dipole moment of the second dipoles DP2, which are not irradiated with the light hv. Electrons that are in the dipoles DP and thus have a polarity may react to the light hv applied by the light irradiation apparatus 500, and the dipole moment between the first and second polarities of the dipoles DP may further increase. As the dipoles DP have a large dipole moment, the dipoles DP may receive a stronger electric force from the same electric field IEL, and the degree of orientation of the dipoles DP on the target substrate SUB may be more uniform.

As illustrated in FIG. 11, the dipoles DP sprayed onto the target substrate SUB may receive a force from the electric field IEL and may thus be oriented in a direction. Here, the first dipoles DP1, which are irradiated with the light hv, may receive a first force Fa and may thus be oriented in a direction, and the second dipoles DP2 may receive a second force Fb and may thus be oriented in a direction. As the dipole moment of the first dipoles DP1 is greater than the dipole moment of the second dipoles DP2, the first force Fa may be stronger than the second force Fb. The dipoles DP may either rotate or move in a direction from their initial locations (as marked by dotted lines) by receiving the first and second forces Fa and Fb. As the second dipoles DP2, which are oriented by the second force Fb, receive a relatively weak force, the second dipoles DP2 may rotate or move by a relatively small width or may be oriented non-uniformly or insufficiently. In contrast, as the first dipoles DP1, which are oriented by the first force Fa, receive a relatively strong force, the first dipoles DP1 may rotate or move by a relatively large width or may be oriented relatively uniformly. The dipole alignment device 1000 includes the light irradiation apparatus 500, which applies the light hv to the dipoles DP in case that the electric field forming part 100 forms the electric field IEL, and can thus improve the degrees of alignment and orientation of the dipoles DP. As will be described below, the degree of alignment of the dipoles DP can be improved during the fabrication of a display device 10 (of FIG. 45) including the dipoles DP.

In some embodiments, the central wavelength range of the light hv applied by the light irradiation apparatus 500 is not particularly limited. The light hv may vary depending on the type of the dipoles DP. As will be described below, the dipoles DP may be light-emitting elements 30 (see FIG. 43) including a semiconductor material, and the central wavelength range of the light hv applied by the light irradiation apparatus 500 may vary depending on active layers 33 (see FIG. 43) included in the light-emitting elements 30. In an embodiment, in case that light emitted from the active layers 33 of the light-emitting elements 30 has a first wavelength range, the central wavelength range of the light hv applied by the light irradiation apparatus 500 may be the first wavelength range. In an example, in case that the active layers 33 of the light-emitting elements 30 emit blue light having a wavelength range of about 450 nm, the light hv applied by the light irradiation apparatus 500 may have a wavelength range of about 450 nm. Similarly, in case that the active layers 33 of the light-emitting elements 30 emit green light having a wavelength range of about 550 nm, the light hv applied by the light irradiation apparatus 500 may have a wavelength range of about 550 nm, and in case that the active layers 33 of the light-emitting elements 30 emit red light having a wavelength range of about 780 nm, the light hv applied by the light irradiation apparatus 500 may have a wavelength range of about 780 nm. However, the disclosure is not limited thereto example.

After the ink I is sprayed onto the target substrate SUB, the electric field forming part 100 may move to the transportation part TA of the dipole alignment device 1000. The transportation part TA may include the transportation part 700 and may thus be able to transfer the electric field forming part 100 to other areas such as the heat treatment part HA.

Figure 12:
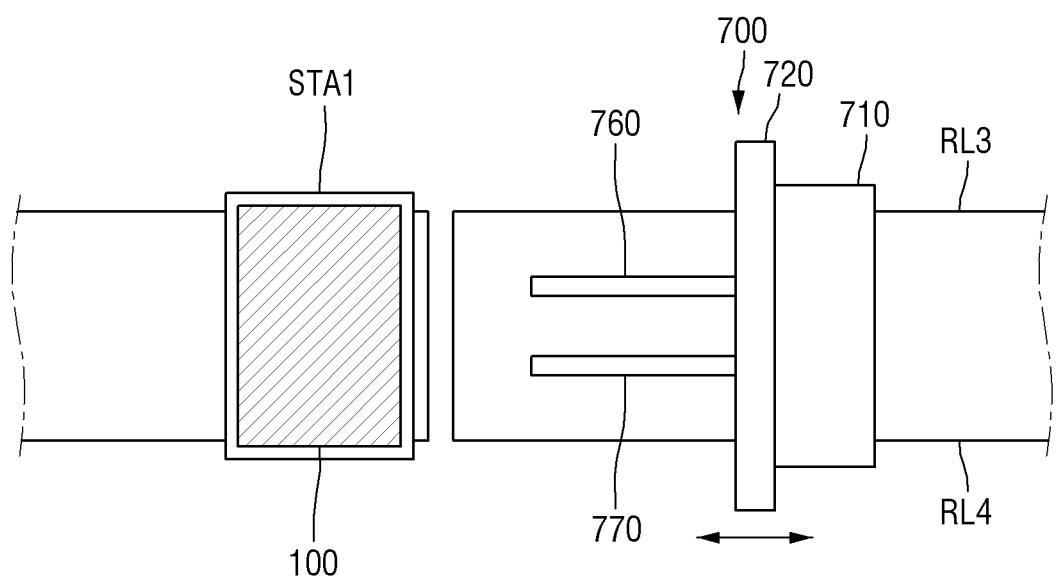
FIG. 12 is a schematic plan view of a transportation part according to an embodiment of the disclosure.

FIG. 12 is a schematic plan view of a transportation part according to an embodiment. FIG. 12 is a schematic front view of the transportation part 700 as viewed in the third direction DR3, for example, as viewed from above.

Referring to FIG. 12 and further to FIG. 1, the transportation part TA of the dipole alignment device 1000 includes the transportation part 700.

The transportation part 700 may transfer the electric field forming part 100 from the printing part PA to the heat treatment part HA of the dipole alignment device 1000. Although not specifically illustrated, the dipole alignment device 1000 may transfer the electric field forming part 100 to an area other than the heat treatment part HA, such as an area adjacent to the transportation part TA, but the disclosure is not limited thereto. Once the dipoles DP are aligned on the target substrate SUB that has passed through the heat treatment part HA, the transportation part 700 may transfer the target substrate SUB to another area.

The transportation part 700 includes a first moving part 710, a second body 720, and supports (760 and 770). The transportation part TA of the dipole alignment device 1000 includes third and fourth rails RL3 and RL4, which extend in the first direction DR1, and the transportation part 700 is disposed on the third and fourth rails RL3 and RL4. The transportation part 700 may move in the first direction DR1 on the third and fourth rails RL3 and RL4 via a separate moving member. As the transportation part 700 moves, the electric field forming part 100 may move in the first direction DR1 and may thus be placed in the heat treatment part HA.

The first moving part 710 of the transportation part 700 may be positioned on the third and fourth rails RL3 and RL4. Although not specifically illustrated, the first moving part 710 may move in the first direction DR1 or in the second direction DR2 on the third and fourth rails RL3 and RL4 via a moving member. The first moving part 710 of the transportation part 700 may include a driver capable of rotating in a direction. As illustrated in FIG. 12, the supports (760 and 770) of the transportation part 700 may be oriented toward one side in the first direction DR1, for example, an area where the printing part PA is located. As the first moving part 710 of the transportation part 700 includes the driver and rotates in a direction, the supports (760 and 770) may be positioned to be oriented in the second direction DR2 or toward the other side in the first direction DR1, for example, the heat treatment part HA. As will be described below, the electric field forming part 100, placed on the supports (760 and 770), may move to another area via the transportation part 700.

The first moving part 710 may have a shape having long sides that extend in the second direction DR2 and short sides that extend in the first direction DR1, but the disclosure is not limited thereto. FIG. 12 schematically illustrates the shape of the first moving part 710 of the transportation part 700. However, the first moving part 710 may have various other structures or may further include other members than those illustrated in FIG. 12.

The second body 720 of the transportation part 700 may be disposed in the first moving part 710. The method by which the second body 720 is disposed in the first moving part 710 is not particularly limited. FIG. 12 illustrates that the second body 720 is disposed directly on the first moving part 710, but as another example, the second body 720 may be coupled to, or mounted on, the first moving part 710 via a separate member. As still another example, the second body 720 may be directly coupled to the first moving part 710.

The transportation part 700 may include the supports (760 and 770), which are disposed in the second body 720. The supports (760 and 770) include first and second supports 760 and 770, which are spaced apart from each other and extend in a direction. The first and second supports 760 and 770 may support the electric field forming part 100 to transfer the electric field forming part 100 from the printing part PA to another area. The electric field forming part 100 may be disposed on the first and second supports 760 and 770 of the transportation part 700 and may thus be movable.

Figure 13:
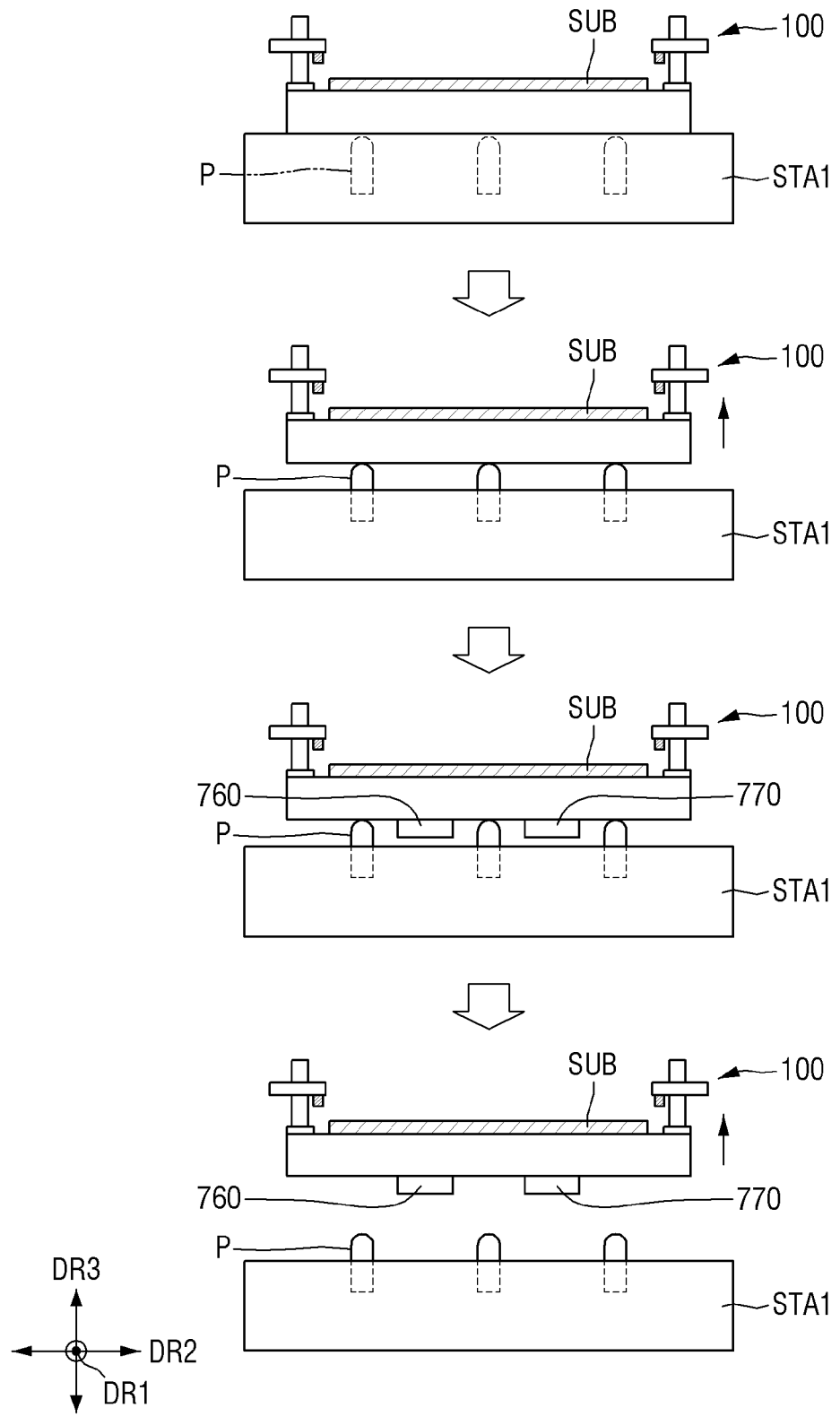
FIGS. 13 and 14 are schematic views illustrating the operation of the transportation part according to an embodiment of the disclosure.
Figure 14:
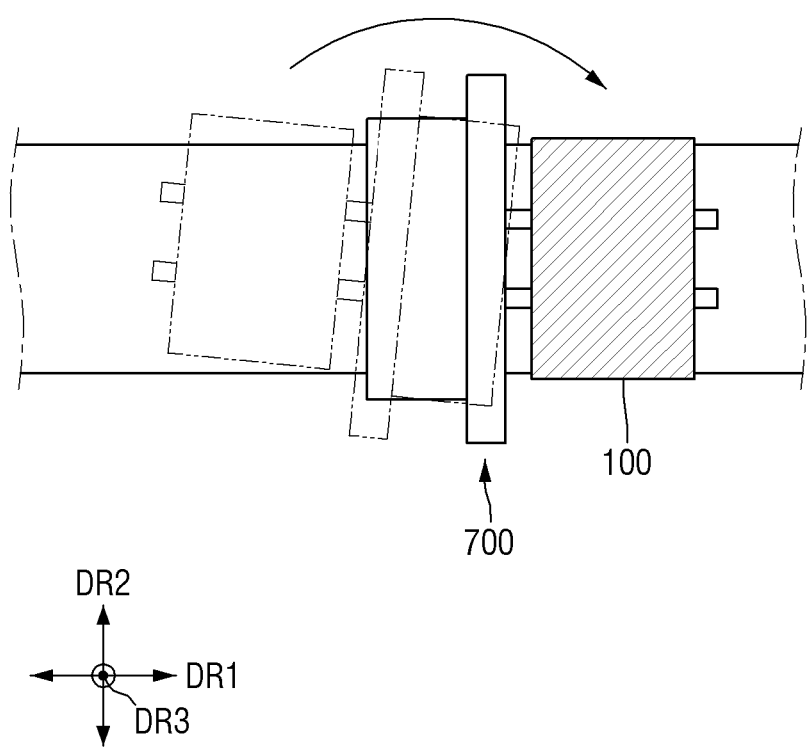

FIGS. 13 and 14 are schematic views illustrating the operation of the transportation part according to an embodiment.

The operation of the transportation part 700 will hereinafter be described with reference to FIGS. 13 and 14.

Referring first to FIG. 13, the electric field forming part 100, disposed on the first stage STA1, is placed on the first and second supports 760 and 770 of the transportation part 700. The first stage STA1 may include pins P, and the pins P may protrude from the top surface of the first stage STA1 to lift up the electric field forming part 100 disposed thereon. As the pins P are projected, the electric field forming part 100 may be spaced apart from the top surface of the first stage STA1, and space may be formed therebetween.

Thereafter, the first moving part 710 of the transportation part 7000 moves, and the first and second supports 760 and 770 are inserted between the top surface of the first stage STA1 and the bottom surface of the electric field forming part 100. Once the first and second supports 760 and 770 are inserted in the space formed by the pins P, the second body 720 or the first and second supports 760 and 770 may move in the third direction DR3 to further lift up the electric field forming part 100. As a result of the operation of the transportation part 700, the electric field forming part 100 is detached from the first stage STA1 and is placed on the first and second supports 760 and 770.

Referring to FIG. 14, the first moving part 710 of the transportation part 700 rotates and thus places the electric field forming part 100 to face the heat treatment part HA. The transportation part 700 may either move in the first or second direction DR1 or DR2 or rotate in a direction and may thus be able to transfer the electric field forming part 100 and the target substrate SUB to a desired area.

FIG. 13 illustrates that the probe parts 150 of the electric field forming part 100 are separated from the target substrate SUB and the electric field IEL is not formed on the probe units 150, but the disclosure is not limited thereto. In some embodiments, the electric field forming part 100 may form an electric field on the target substrate SUB even when the electric field forming part 100 is transferred from the printing part PA to another area by the transportation part 700. At the same time, the light irradiation apparatus 500 may be placed in an area other than the printing part PA, for example, in the transportation part TA and apply the light hv onto the target substrate SUB while the electric field forming part 100 is transferred. This will be described below in connection with other embodiments of the disclosure.

The dipole alignment device 1000 may evaporate the ink I sprayed onto the target substrate SUB. The electric field forming part 100, positioned on the transportation part 700, may be transferred to the heat treatment part HA of the dipole alignment device 1000. The heat treatment apparatus 900, which is disposed in the heat treatment part HA of the dipole alignment device 1000, will hereinafter be described in detail.

FIG. 15 is a schematic front view of a heat treatment apparatus according to an embodiment. FIG. 15 is a front view of the heat treatment apparatus 900 as viewed in the first direction DR1, for example, as viewed from the front.

Referring to FIGS. 1 and 15, the heat treatment part HA of the dipole alignment device 1000 includes the heat treatment apparatus 900 and a second stage STA2.

The second stage STA2 may provide an area in which the electric field forming part 100 with the target substrate SUB prepared thereon is disposed. Although not specifically illustrated, the second stage STA2 may move in the first direction DR1 via a separate moving member. As the second stage STA2 moves, the electric field forming part 100 may also move in the first direction DR1 and may pass through the heat treatment apparatus 900 so that the ink I sprayed onto the target substrate SUB may be dried.

The heat treatment apparatus 900 may include a third support 910, a third body 930, and a heat treatment part 950. The heat treatment part 950 may be disposed on the bottom surface of the third body 930, which is mounted on the third support 910. The heat treatment apparatus 900 may remove the solvent SV from the ink I sprayed onto the target substrate SUB, by applying heat or infrared light via the heat treatment part 950. The dipoles DP may remain on the target substrate SUB that has passed through the heat treatment apparatus 900.

The third support 910 of the heat treatment apparatus 900 may extend in the second direction DR2 and may be disposed above the second stage STA2. Although not specifically illustrated, the third support 910 may be connected to a base frame, which supports the third support 910, and the second stage STA2 may pass below the third support 910. FIG. 15 schematically illustrates the shape of the third support 910 of the heat treatment apparatus 900, but the shape of the third support 910 is limited to that illustrated in FIG. 15. The third support 910 may have various other structures or may further include other members than those illustrated in FIG. 15.

The third body 930 is disposed on the third support 910. The third body 930 may extend in the second direction DR2 and may provide space in which the heat treatment part 950 may be disposed. The third body 930 may cover one side of the target substrate SUB, for example, a side of the target substrate SUB that extends in the second direction DR2. For example, the length, in the second direction DR2, of the third body 930 may be greater than at least the length, in the second direction DR2, of the side of the target substrate SUB that extends in the second direction DR2. Accordingly, the heat treatment part 950, which is disposed on the bottom surface of the third body 930, may also extend in the second direction DR2 and may cover the entire side of the target substrate SUB.

The heat treatment part 950 may be disposed on the bottom surface of the third body 930 and may be spaced from the target substrate SUB by a predetermined distance. The heat treatment part 950 may be spaced apart from the target substrate SUB such that members disposed on the target substrate SUB may not be damaged by heat or infrared light applied by the heat treatment part 950. The distance between the heat treatment part 950 and the target substrate SUB may vary depending on the length, in the third direction DR3, of the heat treatment part 950 or the third body 930. The type of the heat treatment part 950 is not particularly limited. In an example, the heat treatment part 950 may be an IR irradiation apparatus. In an example, a shielding device may be further disposed on the bottom surface of the heat treatment part 950. The shielding device may partially block heat or infrared light applied by the heat treatment part 950, not to damage the target substrate SUB.

The heat treatment part 950 may be disposed on the third body 930. In case that the electric field forming part 100, disposed on the second stage STA2, moves in the first direction DR1 below the bottom surface of the heat treatment apparatus 900, the heat treatment part 950 may apply heat or infrared light while covering (or overlapping) the entire length, in the second direction DR2, of the target substrate SUB.

In an embodiment, the heat treatment apparatus 900 may apply heat or infrared light to an area that overlaps the heat treatment part 950, and as a result, the solvent SV may be removed from the ink I, in the area that overlaps the heat treatment part 950. For example, as the electric field forming part 100 moves in a direction, for example, in the first direction DR1, the solvent SV on the target substrate SUB may be sequentially removed in the direction in which the electric field forming part 100 moves.

FIG. 16 is a schematic view illustrating the operation of the heat treatment apparatus according to an embodiment.

Referring to FIG. 16, the heat treatment apparatus 900 may apply heat H to the area that overlaps the heat treatment part 950, from below the heat treatment apparatus 900. As illustrated in FIG. 16, the heat H is applied only to the area that overlaps the heat treatment part 950, on the target substrate SUB. The heat H may be simultaneously applied to some of the ink I sprayed on the target substrate SUB, in the area that overlaps the heat treatment part 950. In contrast, the heat H may be sequentially applied to ink I that is spaced from the heat treatment part 950 in the first direction DR1 and thus does not overlap the heat treatment part 950, as the electric field forming part 100 passes below the heat treatment part 950. As the electric field forming part 100 moves in the first direction DR1 and passes below the heat treatment apparatus 900, the solvent SV in the ink I sprayed onto the target substrate SUB may be sequentially removed. As illustrated in FIG. 16, the heat H may be applied to the solvent SV on the target substrate SUB, in the area that overlaps the heat treatment part 950, and the solvent SV may be removed so that only the dipoles DP may remain in an area (as marked by dotted lines) that has passed below the heat treatment part 950.

Although not specifically illustrated, a control device for sensing and controlling the temperature on the target substrate SUB may be further included in the electric field forming part 100. If the temperature of the target substrate SUB rises beyond a level due to the heat or infrared light applied by the heat treatment part 950, the target substrate SUB may be cooled by the control device.

The structure of the heat treatment apparatus 900 is not limited to that illustrated in FIGS. 15 and 16. In some embodiments, the heat treatment part HA of the dipole alignment device 1000 may form a sealed space with the third body 930 of the heat treatment apparatus 900 and may have a structure in which the heat treatment part 950 is disposed in the space formed by the third body 930.

FIG. 17 is a schematic view of a heat treatment apparatus according to another embodiment.

Referring to FIG. 17, a second stage STA2 of a heat treatment apparatus 900 may be disposed in space formed by a third body 930, and heat treatment parts 950 may be disposed on the inside of the third body 930. As illustrated in FIG. 17, the heat treatment parts 950 may be disposed on the upper sidewall and the left and right sidewalls of the third body 930, but the disclosure is not limited thereto. In this case, the second stage STA2 may not move in a direction, and the electric field forming part 100, transferred from the transportation part 700, may be placed on the second stage STA2. Heat may be applied to the space formed by the third body 930, by the heat treatment parts 950, and the ink sprayed onto the target substrate SUB may be dried.

The heat treatment apparatus 900 may be provided with a pump capable of creating a vacuum in the space formed by the third body 930. A vacuum may be created in the space formed by the third body 930, by the pump, and the ink I sprayed onto the target substrate SUB can be effectively dried. The adhesion of impurities onto the target substrate SUB can be prevented during the drying of the ink I.

The heat treatment parts 950 may not be disposed on the third body 930. In some embodiments, the heat treatment parts 950 may be embedded in the second stage STA2 where the electric field forming part 100 is disposed.

Figure 18:
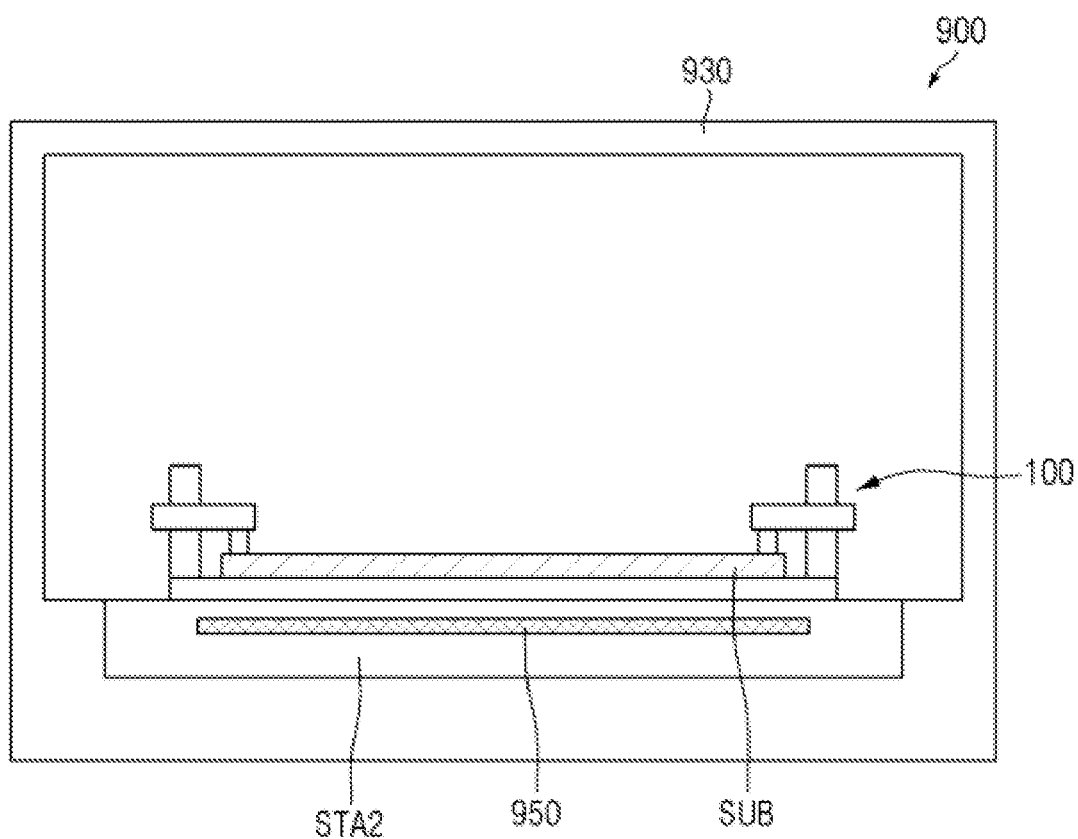
FIG. 18 is a schematic view of a heat treatment apparatus according to another embodiment of the disclosure.

FIG. 18 is a schematic view of a heat treatment apparatus according to another embodiment.

Referring to FIG. 18, a heat treatment part 950 may be embedded in a second stage STA2, which is positioned in the heat treatment part HA of the dipole alignment device 1000, and a third body 930 may form a sealed space above the second stage STA2. In this case, the target substrate SUB may receive heat from the heat treatment part 950 below the electric field forming part 100, and the solvent SV in the ink I may be removed. However, the disclosure is not limited thereto, and the structure and configuration of a heat treatment apparatus 900 may vary.

The dipole alignment device 1000 may include the electric field forming part 100, the inkjet printing apparatus 300, the light irradiation apparatus 500, the transportation part 700, and the heat treatment apparatus 900, and may be able to orient the dipoles DP in a direction on the target substrate SUB. The dipole alignment device 1000 can increase the dipole moment of the dipoles DP by using the light irradiation apparatus 500, and can improve the alignment reactivity of the dipoles DP with the electric field IEL formed by the electric field forming part 100.

Accordingly, during the fabrication of a display device using the dipole alignment device 1000, the degree of alignment of the dipoles DP on the target substrate SUB can be improved by performing the step of applying light by using the light irradiation apparatus 500. A method of aligning the dipoles DP by using the dipole alignment device 1000 will hereinafter be described in detail.

Figure 19:
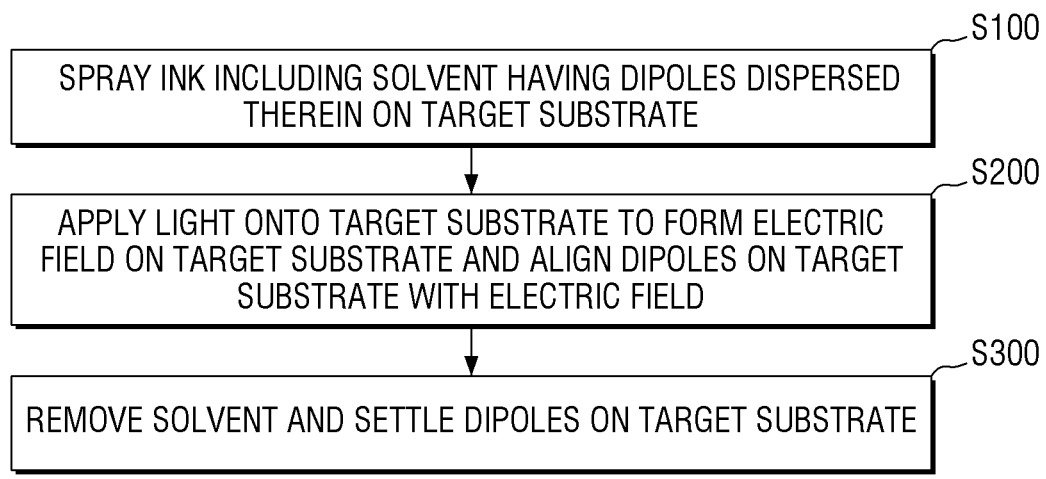
FIG. 19 is a flowchart illustrating a dipole alignment method according to an embodiment of the disclosure.

FIG. 19 is a flowchart illustrating a dipole alignment method according to an embodiment. FIGS. 20 to 24 are schematic views illustrating how to align dipoles by using the dipole alignment device according to an embodiment.

Referring to FIGS. 1 and 19 to 24, the dipole (DP) alignment method may include the steps of: spraying ink I, including a solvent SV, in which dipoles DP are dispersed, onto a target substrate SUB (S100), forming an electric field on the target substrate SUB by applying light to the target substrate SUB to align the dipoles DP on the target substrate SUB (S200), and removing the solvent SV and allowing the dipoles DP to settle on the target substrate SUB (S300).

The dipole (DP) alignment method may use the dipole alignment device 1000 described above with reference to FIG. 1 and may include the step of increasing the dipole moment of the dipoles DP and forming an electric field IEL by applying light.

Referring first to FIG. 20, the target substrate SUB is prepared. In an embodiment, first and second electrodes 21 and 22 may be disposed on the target substrate SUB. FIG. 20 illustrates that a pair of electrodes are disposed. However, as another example, additional pairs of electrodes may be disposed on the target substrate SUB, and inkjet heads 335 may spray the ink I onto each of the pairs of electrodes in a same manner.

Figure 21:
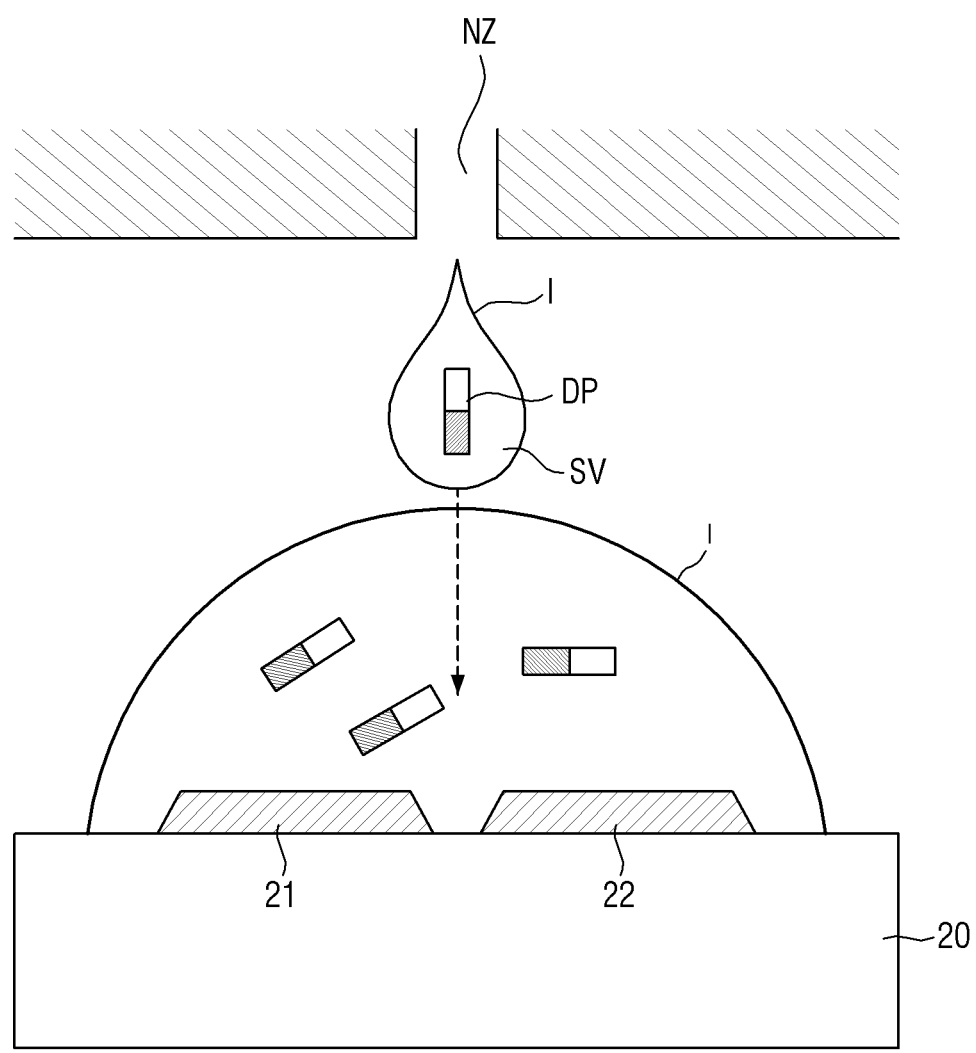

Referring to FIG. 21, the ink I, which includes the solvent SV having the dipoles DP dispersed therein, is sprayed onto the target substrate SUB (S100). The ink I may be ejected from the inkjet heads 335 of an inkjet printing apparatus 300 and may be sprayed onto the first and second electrodes 21 and 22, which are disposed on the target substrate SUB. This is as already described above, and thus, a detailed description thereof will be omitted.

Referring to FIG. 22, light hv is applied to the ink I sprayed on the target substrate SUB. As the light irradiation apparatus 500 applies the light hv to the ink I, electrons included in the dipoles DP may react to the light hv so that the dipole moment of the dipoles DP may increase (see DP' of FIG. 22). The force that dipoles DP' with an increased dipole moment receive from the electric field IEL formed by the electric field forming part 100 may become stronger in a subsequent process, and the dipoles DP' may be aligned between the first and second electrodes 21 and 22. The light irradiation apparatus 500 may apply the light hv at the dipoles DP to increase the dipole moment of the dipoles DP. FIG. 22 illustrates, as an example, that the light irradiation apparatus 500 applies the light hv onto the target substrate SUB, but the disclosure is not limited thereto. As already mentioned above, in some embodiments, the light irradiation apparatus 500 may apply the light hv onto the target substrate SUB or may apply the light hv in case that the ink I is ejected from the inkjet heads 335, but the disclosure is not limited thereto.

Figure 23:
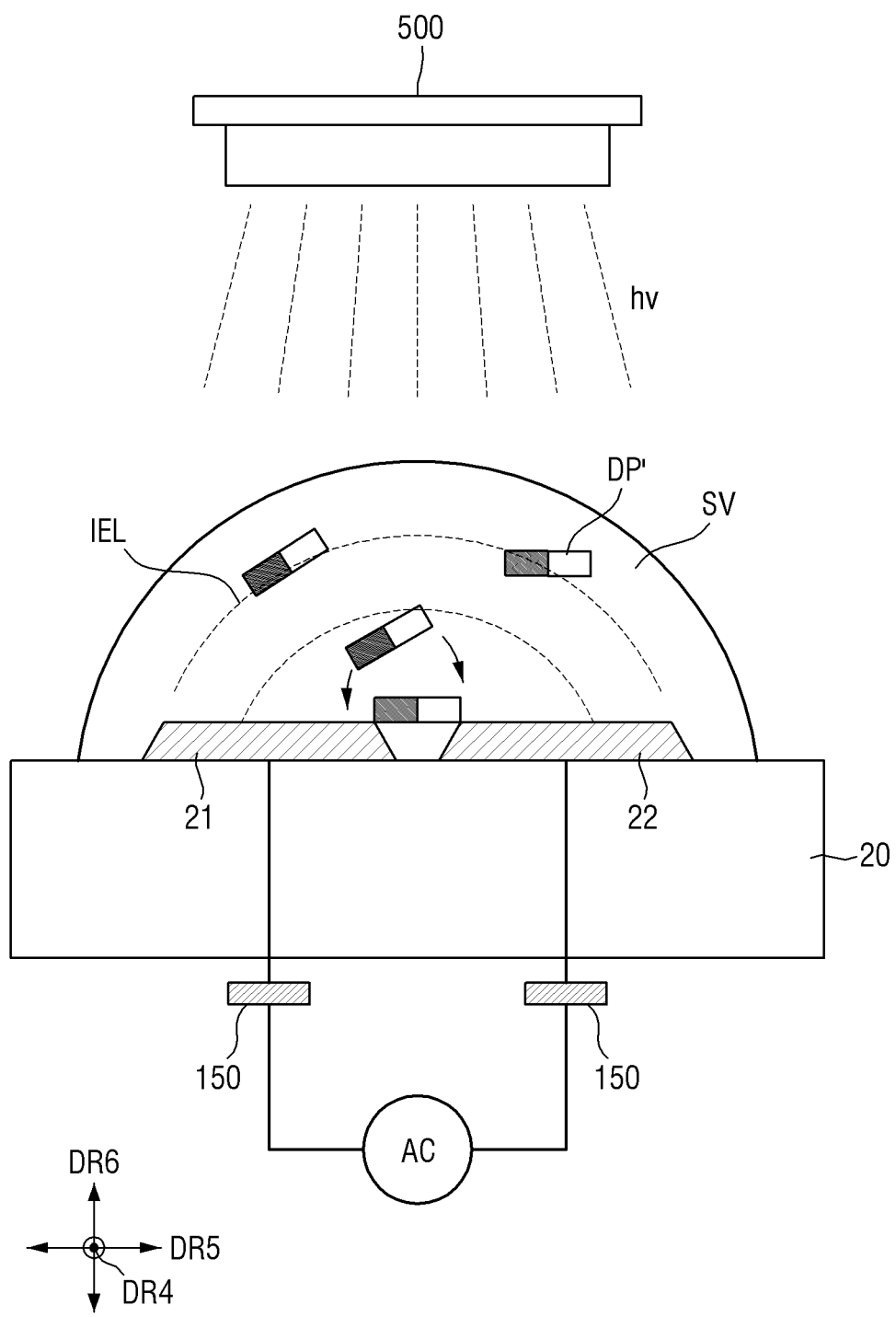

As illustrated in FIG. 23, the dipoles DP are aligned by forming the electric field IEL on the target substrate SUB (S200). The dipoles DP may be placed between the first and second electrodes 21 and 22 via dielectrophoresis.

Electric signals are applied from the probe parts 150 to the first and second electrodes 21 and 22. The probe parts 150 may be electrically connected to pads (not illustrated) provided on the target substrate SUB and may apply electric signals to the first and second electrodes 21 and 22, which are electrically connected to the pads. In an embodiment, the electric signals may be alternating current voltages, and the alternating current voltages may be about ±(10 to 50) V or may have a frequency of about 10 kHz to about 1 MHz. As the alternating current voltages are applied to the first and second electrodes 21 and 22, the electric field IEL is formed between the first and second electrodes 21 and 22, and a dielectrophoretic force from the electric field IEL may act upon the dipoles DP'. By the dielectrophoretic force, the dipoles DP' may be placed on the first and second electrodes 21 and 22 with their orientation direction and location changing.

In some embodiments, the electric field forming part 100 may form the electric field IEL on the target substrate SUB while the light irradiation apparatus 500 is applying the light hv. The electric field forming part 100 may move to the printing part PA, the transportation part TA, and the heat treatment part HA of the dipole alignment device 1000, and the light irradiation apparatus 500 may be disposed in one of the printing part PA, the transportation part TA, and the heat treatment part HA. As already mentioned above, the dipole moment of the dipoles DP' is increased by the light hv from the light irradiation apparatus 500, and as a result, the dipoles DP' may receive a stronger force from the electric field IEL. Accordingly, to properly align the dipoles on the target substrate SUB, the electric field forming part 100 may form the electric field IEL while the light irradiation apparatus 500 is applying light hv, but the disclosure is not limited thereto. As another example, as already mentioned above, the electric field forming part 100 may form the electric field IEL while light is not being applied.

Figure 24:
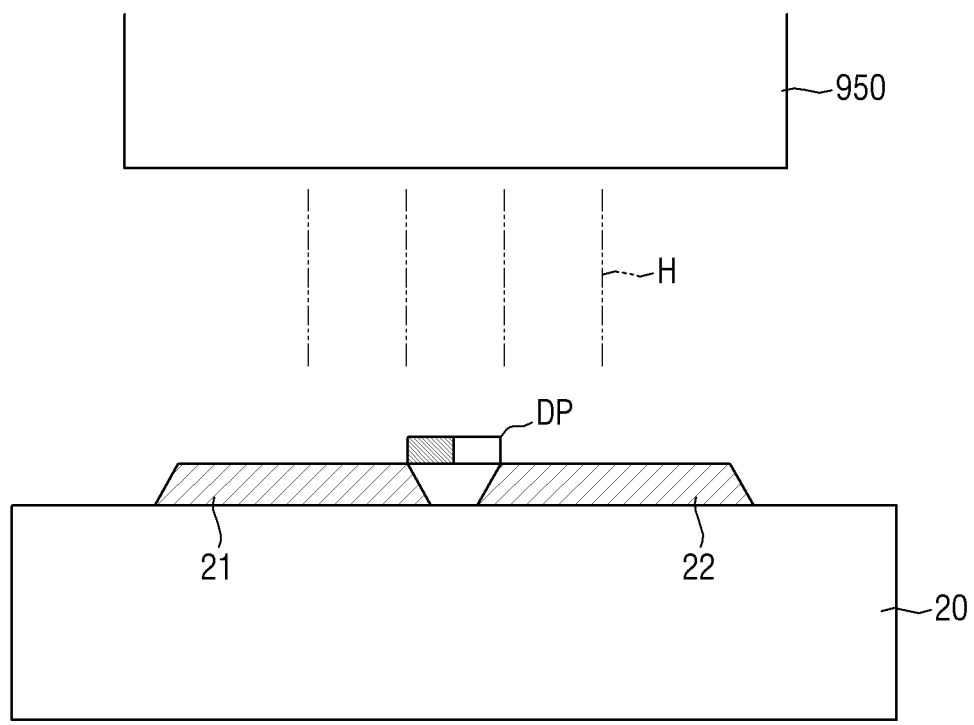

Thereafter, referring to FIG. 24, the solvent SV in the ink I sprayed onto the target substrate SUB is removed (S300). The removal of the solvent SV may be performed by the heat treatment apparatus 900, the heat treatment apparatus 900 may apply heat H or infrared light onto the target substrate SUB, and the solvent SV may be volatilized or evaporated. The method by which the heat treatment apparatus 900 applies the heat H or infrared light is as described above with reference to FIG. 16.

As the solvent SV is removed from the ink I sprayed on the target substrate SUB, the flow of the dipoles DP can be prevented, and the bonding force with respect to the electrodes (21 and 22) can be improved. Thus, the dipoles DP can be aligned on the first and second electrodes 21 and 22.

In this manner, the dipole alignment device 1000 can align the dipoles DP on the target substrate SUB. The dipole alignment device 1000 includes the light irradiation apparatus 500 and can thus improve the alignment reactivity of the dipoles DP.

Various embodiments of the dipole alignment device 1000 will hereinafter be described.

In an embodiment, the light irradiation apparatus 500 may not be disposed in the printing part PA of the dipole alignment device 1000 and may be disposed in another area such as the transportation part TA or the heat treatment part HA.

Figure 25:
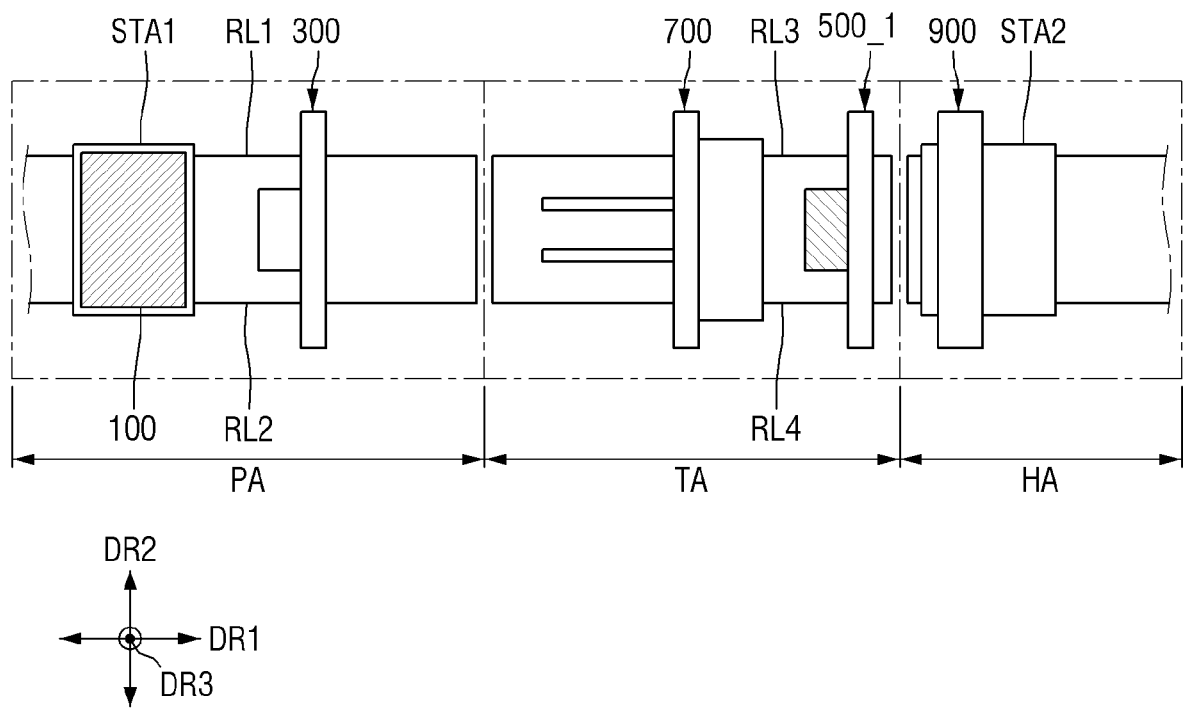
FIGS. 25 and 26 are schematic plan views of dipole alignment devices according to other embodiments.
Figure 26:
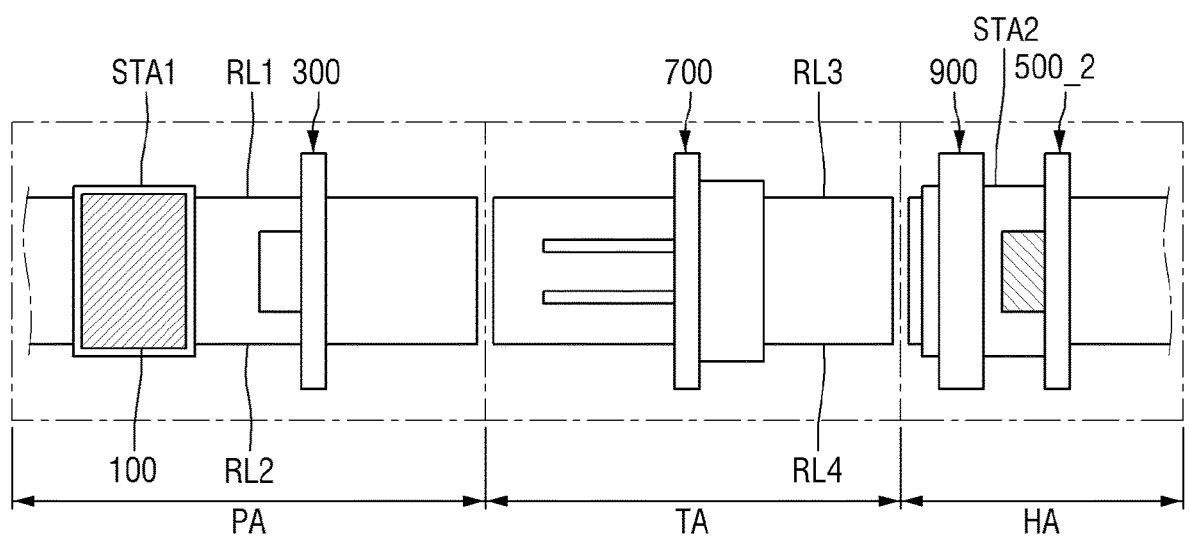

FIGS. 25 and 26 are schematic plan views of dipole alignment devices according to other embodiments.

Referring to a dipole alignment device 1000_1 of FIG. 25, a light irradiation apparatus 500_1 may be disposed in a transportation part TA. The embodiment of FIG. 25 differs from the embodiment of FIG. 1 at least in that the light irradiation apparatus 500_1 is disposed in the transportation part TA. The embodiment will hereinafter be described, focusing mainly on the differences from the embodiment of FIG. 1.

In the dipole alignment device 1000_1 of FIG. 25, the light irradiation apparatus 500_1 may be disposed in the transportation part TA so that light hv may be applied onto a target substrate SUB before an electric field forming part 100 is placed in a heat treatment apparatus 900. As an electric field IEL is formed on the target substrate SUB by probe parts 150 of the electric field forming part 100, the location of the light irradiation apparatus 500 is not particularly limited as long as the light irradiation apparatus 500 can apply light hv before or during the formation of the electric field IEL by the electric field forming part 100. If the light irradiation apparatus 500_1 is disposed in the transportation part TA, the target substrate SUB with ink I sprayed thereon in a printing part PA may be irradiated with light after being transferred via a transportation part 700 together with the electric field forming part 100. The light irradiation apparatus 500_1 is illustrated as being disposed between the transportation part 700 and the heat treatment apparatus 900, but the disclosure is not limited thereto. In some embodiments, the light irradiation apparatus 500_1 may be disposed between the transportation part 700 and an inkjet printing apparatus 300.

Accordingly, the light irradiation apparatus 500_1 can apply the light hv onto the target substrate SUB, in the transportation part TA, before or during the formation of the electric field IEL by the electric field forming part 100.

Thereafter, referring to FIG. 26, a light irradiation apparatus 500_2 of a dipole alignment device 1000_2 may be disposed in a heat treatment part HA. The embodiment of FIG. 26 differs from the embodiment of FIG. 1 at least in that the light irradiation apparatus 500_2 is disposed in the heat treatment part HA. The embodiment will hereinafter be described, focusing mainly on the differences from the embodiment of FIG. 1.

In the dipole alignment device 1000_2 of FIG. 26, the light irradiation apparatus 500_2 may be disposed in the heat treatment part HA so that light hv may be applied to a target substrate SUB in case that an electric field forming part 100 is disposed in a heat treatment apparatus 900 or on a second stage STA2. If the light irradiation apparatus 500_2 is disposed in the heat treatment part HA, light may be applied after the electric field forming part 100 is transferred to the heat treatment part HA via a transportation part 700.

Figure 27:
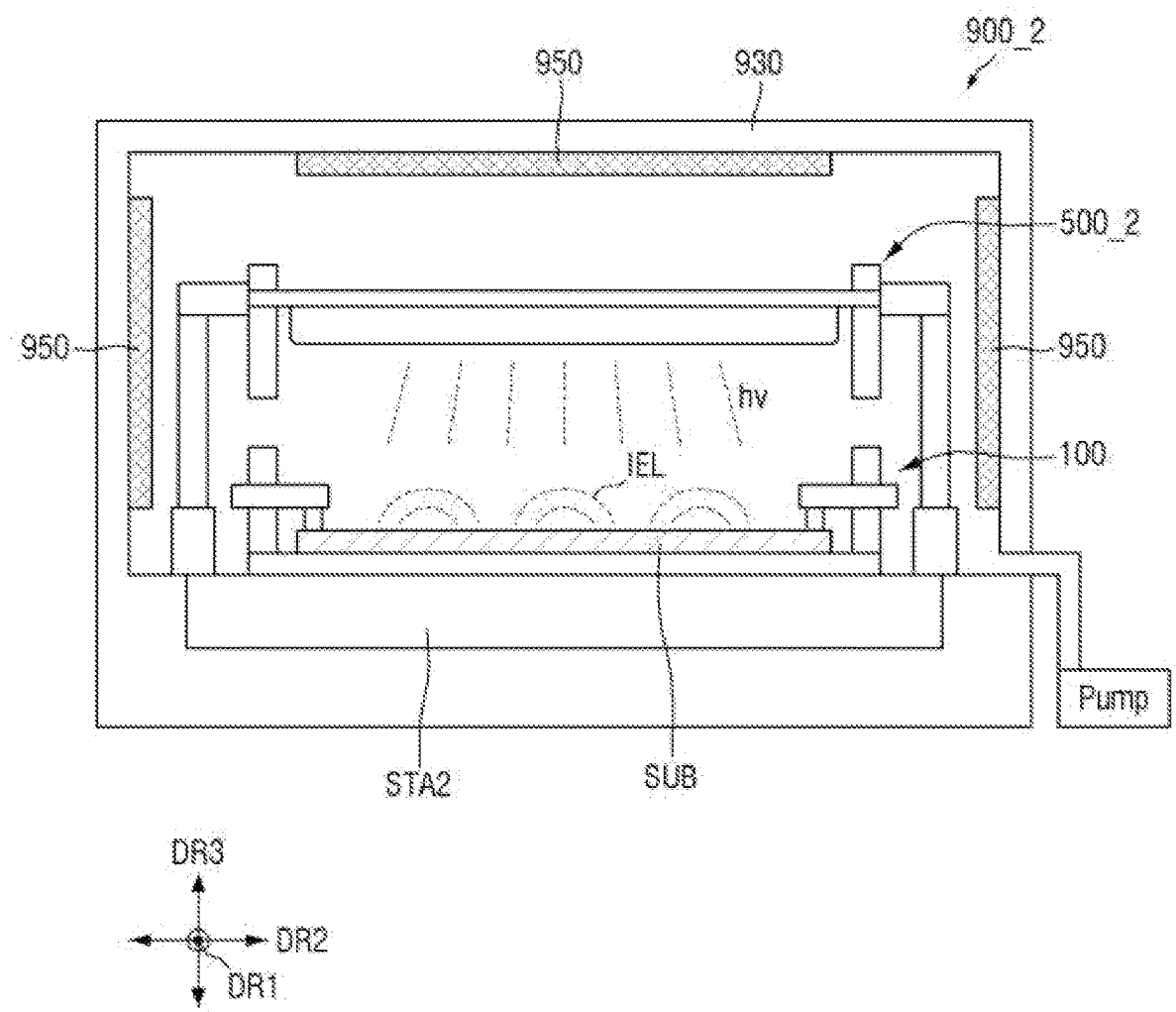
FIG. 27 is a schematic view illustrating the operation of a light irradiation apparatus of the dipole alignment device of FIG. 26.

FIG. 27 is a schematic view illustrating the operation of the light irradiation apparatus of the dipole alignment device of FIG. 26. FIG. 27 illustrates that a light irradiation apparatus 500_2 is disposed in a heat treatment apparatus 900_2.

Referring to FIG. 27, the light irradiation apparatus 500_2 may be disposed in the heat treatment apparatus 900_2, and an electric field forming part 100 may form an electric field IEL on a target substrate SUB while the light irradiation apparatus 500_2 is applying light hv. Although not specifically illustrated, the light irradiation apparatus 500_2 may apply light onto the target substrate SUB while the heat treatment apparatus 900_2 is applying heat onto the target substrate SUB.

In this case, as light is applied to dipoles DP in ink I sprayed onto the target substrate SUB, the alignment reactivity of the dipoles DP can be improved, the dipoles DP can be aligned by the electric field IEL, and at the same time, the solvent SV can be removed. As another example, as the light irradiation apparatus 500_2 is disposed in the heat treatment apparatus 900_2, the electric field IEL can be formed by applying the light hv onto the target substrate SUB, and at the same time, the solvent SV can be removed. As a result, the dipoles DP can be prevented from moving even slightly upon the removal of the solvent SV.

The light irradiation apparatus 500 may be attached to the inkjet printing apparatus 300 and the transportation part 700 and may thus be able to apply light onto the target substrate SUB while moving along with the inkjet printing apparatus 300 and the transportation part 700.

Figure 29:
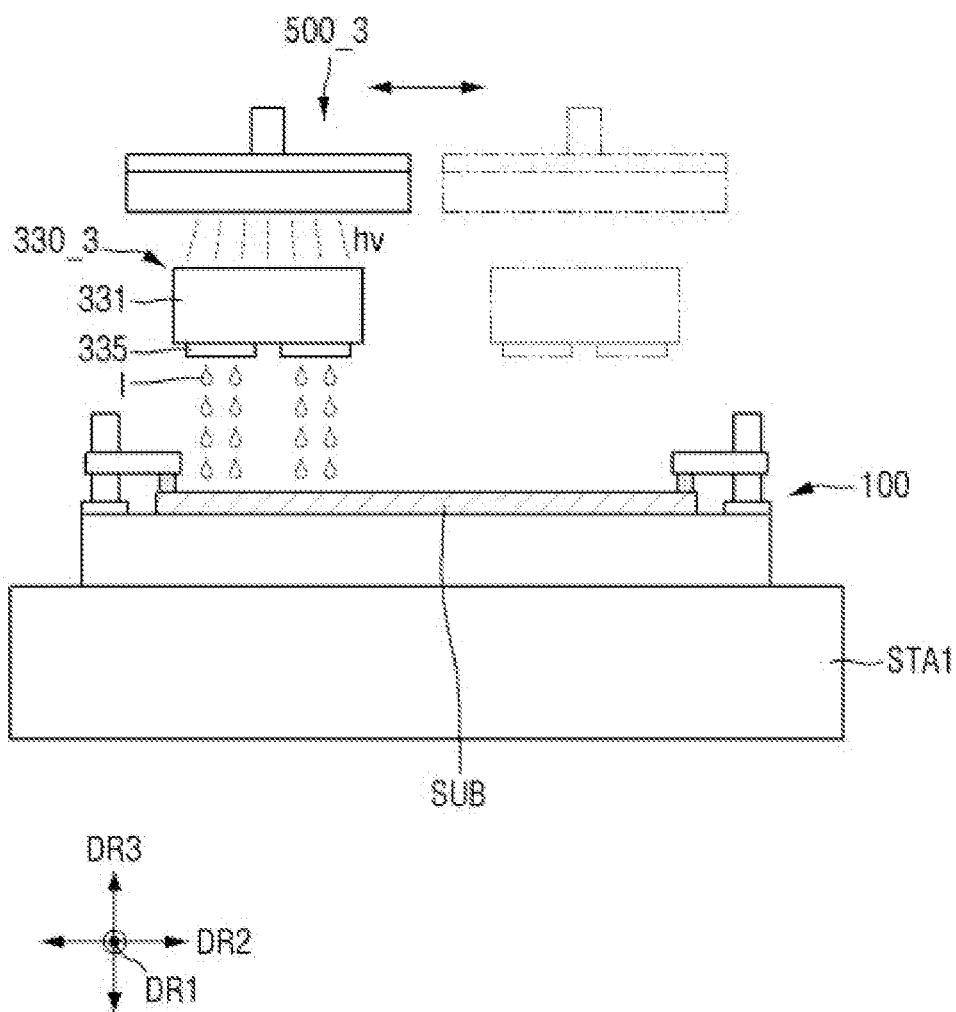
FIGS. 29 and 30 are schematic views illustrating the operation of an inkjet printing apparatus and a light irradiation apparatus of the dipole alignment device of FIG. 28.
Figure 30:
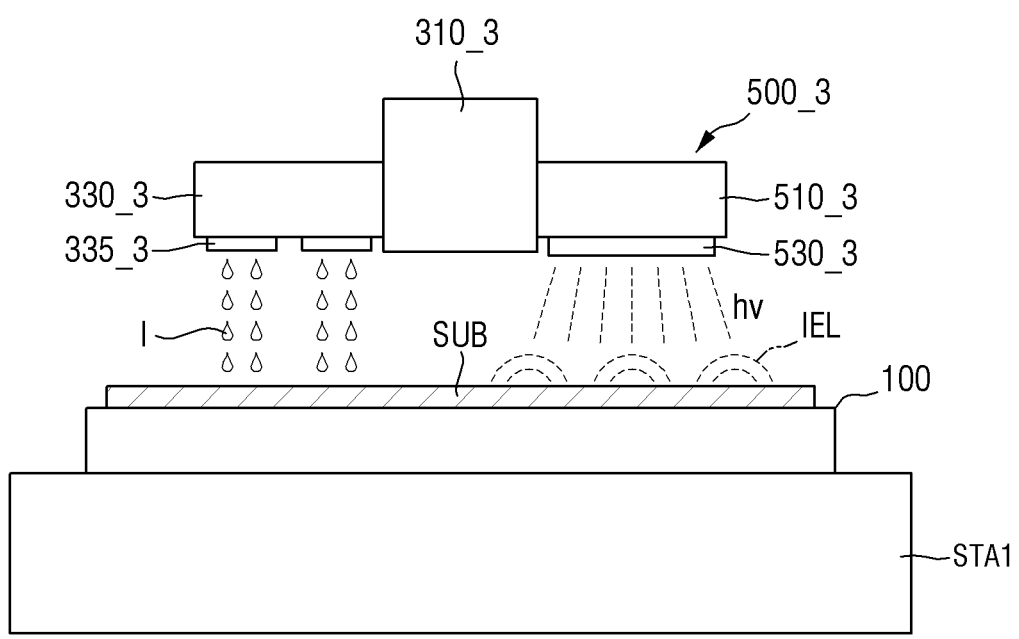

FIG. 28 is a schematic plan view of a dipole alignment device according to another embodiment. FIGS. 29 and 30 are schematic views illustrating the operation of an inkjet printing apparatus and a light irradiation apparatus of the dipole alignment device of FIG. 28.

Referring to FIGS. 28 to 30, a light irradiation apparatus 500_3 of a dipole alignment device 1000_3 may be disposed on an inkjet printing apparatus 300. The embodiment of FIG. 28 differs from the embodiment of FIG. 1 at least in that the light irradiation apparatus 500_3 is disposed in the inkjet printing apparatus 300. The embodiment will hereinafter be described, focusing mainly on the differences from the embodiment of FIG. 1.

Referring to FIGS. 28 to 30, the light irradiation apparatus 500_3 may be disposed on the inkjet printing apparatus 300 and may move in a direction. An inkjet head part 330_3 of the inkjet printing apparatus 300 may move in a direction and may spray ink I onto a target substrate SUB while moving in the direction. In this regard, the light irradiation apparatus 500_3 may move in a direction together with the inkjet head part 330_3 and may apply light hv onto the target substrate SUB while moving in a direction. In an embodiment, the light irradiation apparatus 500_3 may apply the light hv onto the target substrate SUB while the ink I is being sprayed onto the target substrate SUB.

The inkjet head part 330_3 and the light irradiation apparatus 500_3 may spray the ink I onto or apply the light hv onto the target substrate SUB while moving in a second direction DR2. Although not specifically illustrated, in some embodiments, an electric field forming part 100 may form an electric field IEL on the target substrate SUB while light hv is being applied to the ink I. Other features of each of the inkjet printing apparatus 300 and the light irradiation apparatus 500_3 may be substantially identical or similar to those described above, and thus, detailed descriptions thereof will be omitted. The first support 310_3, ink heads 335_3, second support 510_3, and light irradiation part 530_3 may be substantially identical or similar to the first support 310, ink heads 335, second support 510, and light irradiation part 530 discussed in the disclosure.

Figure 31:
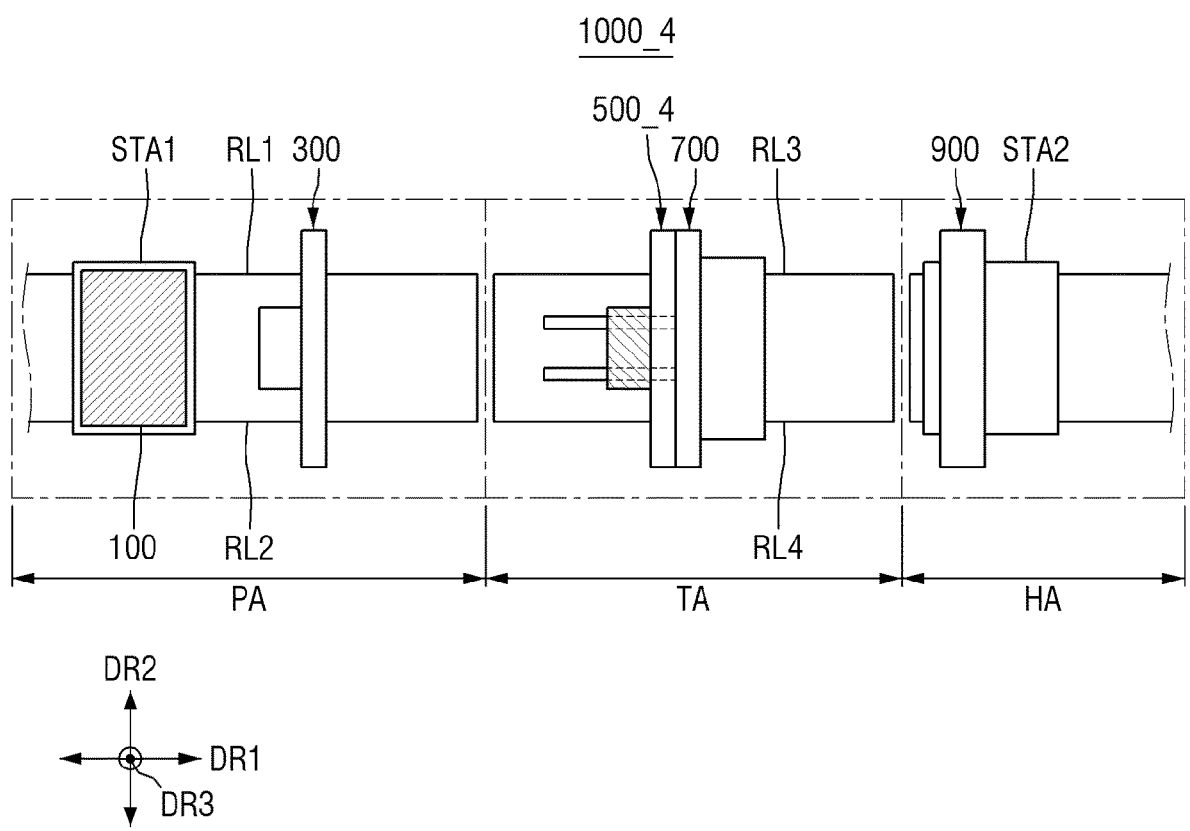
FIG. 31 is a schematic plan view of a dipole alignment device according to another embodiment of the disclosure.
Figure 33:
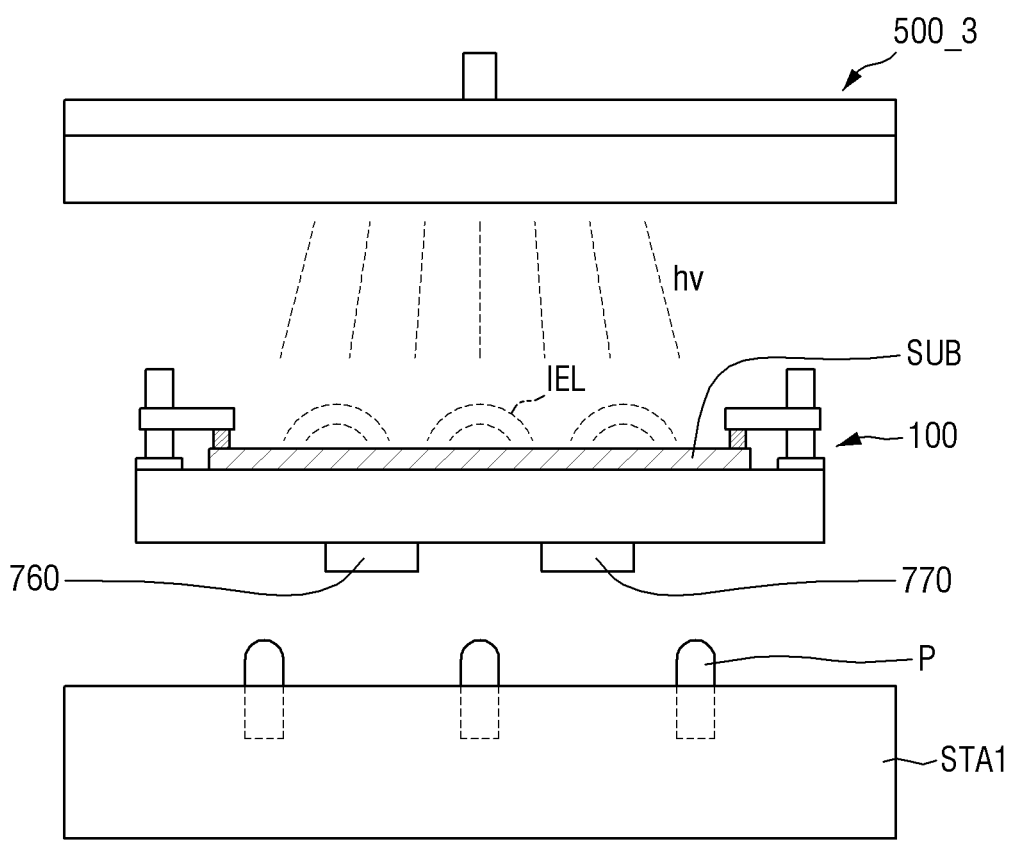
FIG. 33 is a schematic view illustrating the operations of the transportation part and a light irradiation apparatus of the dipole alignment device of FIG. 31.

FIG. 31 is a schematic plan view of a dipole alignment device according to another embodiment. FIG. 32 is a schematic front view of a transportation part of the dipole alignment device of FIG. 31. FIG. 33 is a schematic view illustrating the operations of the transportation part and a light irradiation apparatus of the dipole alignment device of FIG. 31.

Referring to FIGS. 31 to 33, a light irradiation apparatus 500_4 of a dipole alignment device 1000_4 may be disposed on a transportation part 700. The embodiment of FIG. 31 differs from the embodiment of FIG. 1 at least in that the light irradiation apparatus 500_4 is disposed on the transportation part 700. The embodiment will hereinafter be described, focusing mainly on the differences from the embodiment of FIG. 1.

Referring to FIGS. 31 to 33, the light irradiation apparatus 500_4 may be disposed on the transportation part 700. The light irradiation apparatus 500_4 may apply light hv onto a target substrate SUB in case that an electric field forming part 100 is placed on first and second supports 760 and 770. As illustrated in FIGS. 31 to 33, the light irradiation apparatus 500_4 may be disposed in a second body 720_4 of the transportation part 700 and may move as a first moving part 710_4 moves. The light irradiation apparatus 500_4 may be disposed on a surface of the second body 720_4 where supports (760 and 770) are disposed, and may apply the light hv onto the supports (760 and 770). In case that the electric field forming part 100 is transferred from a printing part PA to a transportation part TA, the electric field forming part 100 may be placed on the first and second supports 760 and 770, and at the same time, the light irradiation apparatus 500_4 may apply the light hv onto the target substrate SUB.

In some embodiments, the light irradiation apparatus 500_4 may apply the light hv onto the electric field forming part 100, which is placed on the supports (760 and 770), and the electric field forming part 100 may form an electric field IEL on the target substrate SUB while the light irradiation apparatus 500_4 is applying light. As illustrated in FIG. 33, in case that the electric field forming part 100 is being moved while being carried on the supports (760 and 770), the light irradiation apparatus 500_4 and the electric field forming unit 100 may apply the light hv onto the target substrate SUB or form the electric field IEL. Other features of each of the inkjet transportation unit 700 and the light irradiation apparatus 500_4 may be substantially identical or similar to those described above, and thus, detailed descriptions thereof will be omitted.

The light irradiation apparatus 500 may further include a separate moving part and may thus be able to apply light while moving in a direction over a target substrate SUB.

Figure 34:
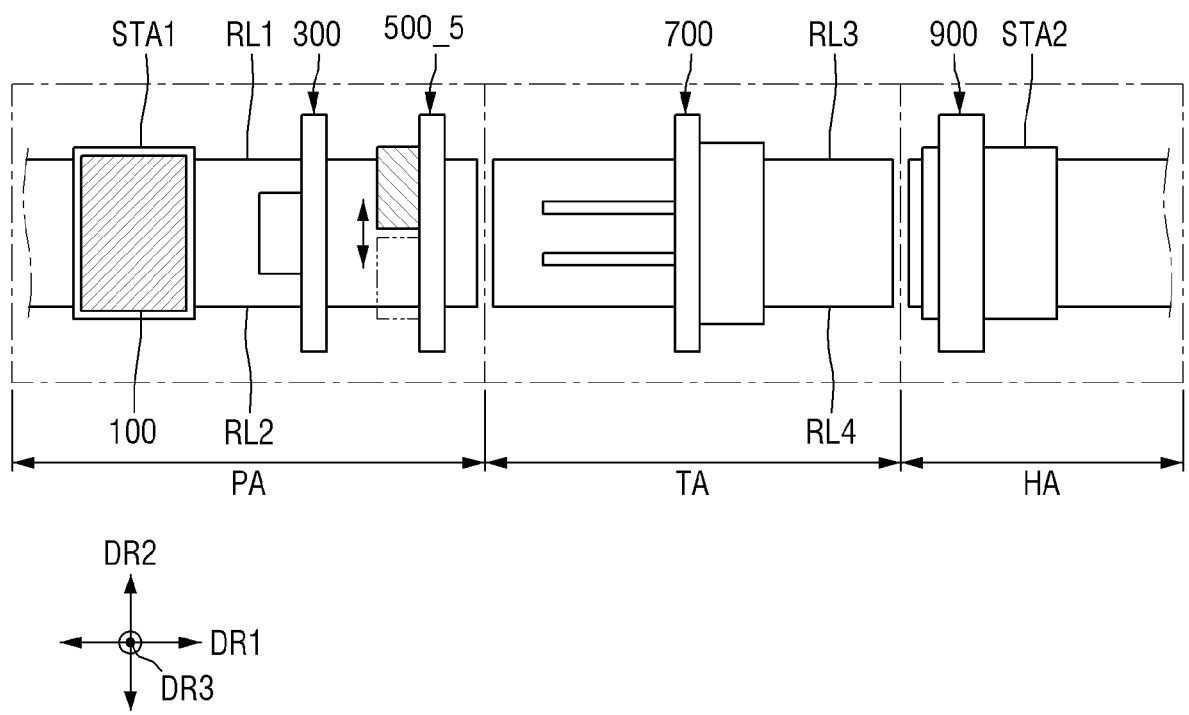
FIG. 34 is a schematic plan view of a dipole alignment device according to another embodiment of the disclosure.
Figure 35:
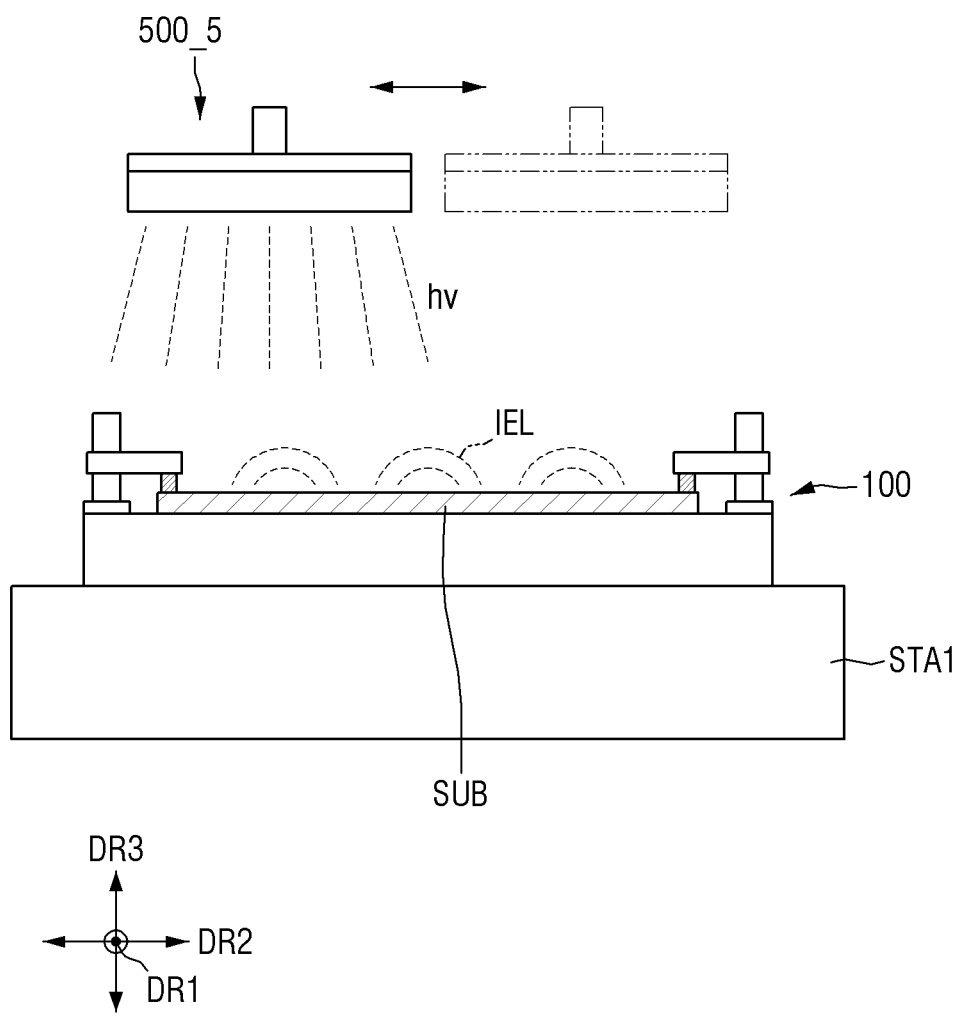
FIG. 35 is a schematic view illustrating the operation of a light irradiation apparatus of the dipole alignment device of FIG. 34.

FIG. 34 is a schematic plan view of a dipole alignment device according to another embodiment. FIG. 35 is a schematic view illustrating the operation of a light irradiation apparatus of the dipole alignment device of FIG. 34.

Referring to FIGS. 34 and 35, a dipole alignment device 1000_5 may further include a second moving part, which moves a light irradiation apparatus 500_5 in a direction, and a light irradiation part 530 may be disposed in the second moving part. Although not specifically illustrated, the light irradiation apparatus 500_5 may move in a direction because of a separate second moving part, even if the light irradiation apparatus 500_5 is not disposed in another member such as, for example, an inkjet head part 330 of an inkjet printing apparatus 300 or a first moving part 710 or a second body 720 of a transportation part 700. The embodiment of FIG. 34 differs from the embodiment of FIG. 1 at least in that the light irradiation apparatus 500_5 includes a separate moving part and is thus movable.

As illustrated in FIG. 35, the light irradiation apparatus 500_5 may move in a direction, for example, in a second direction DR2, and may apply light hv onto a target substrate SUB. The light irradiation apparatus 500_5 may apply the light hv to one area on the target substrate SUB and then to another area on one side of the one area. An electric field forming part 100 may form an electric field IEL on the target substrate SUB while the light irradiation apparatus 500_5 is applying the light hv. In this case, if the light irradiation apparatus 500_5 applies the light hv to the one area, the alignment reactivity of dipoles DP dispersed on the one area may be improved so that they may be oriented with a high degree of alignment, and if the light irradiation apparatus 500_5 applies the light hv to the another area, the alignment reactivity of dipoles DP dispersed on the another area may be improved so that they may be oriented with a high degree of alignment. Descriptions of features or elements of the embodiment that have been described above will be omitted.

Figure 36:
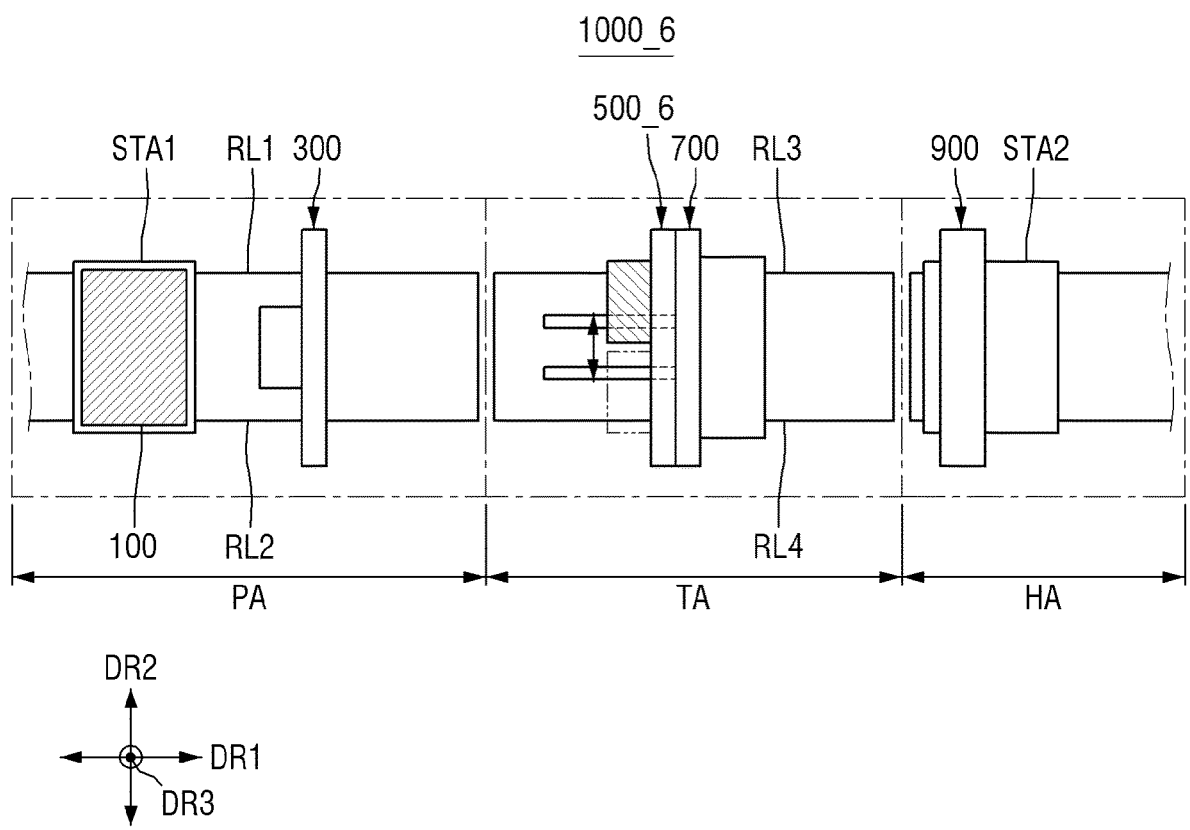
FIGS. 36 and 37 are schematic plan views of dipole alignment devices according to other embodiments.
Figure 37:
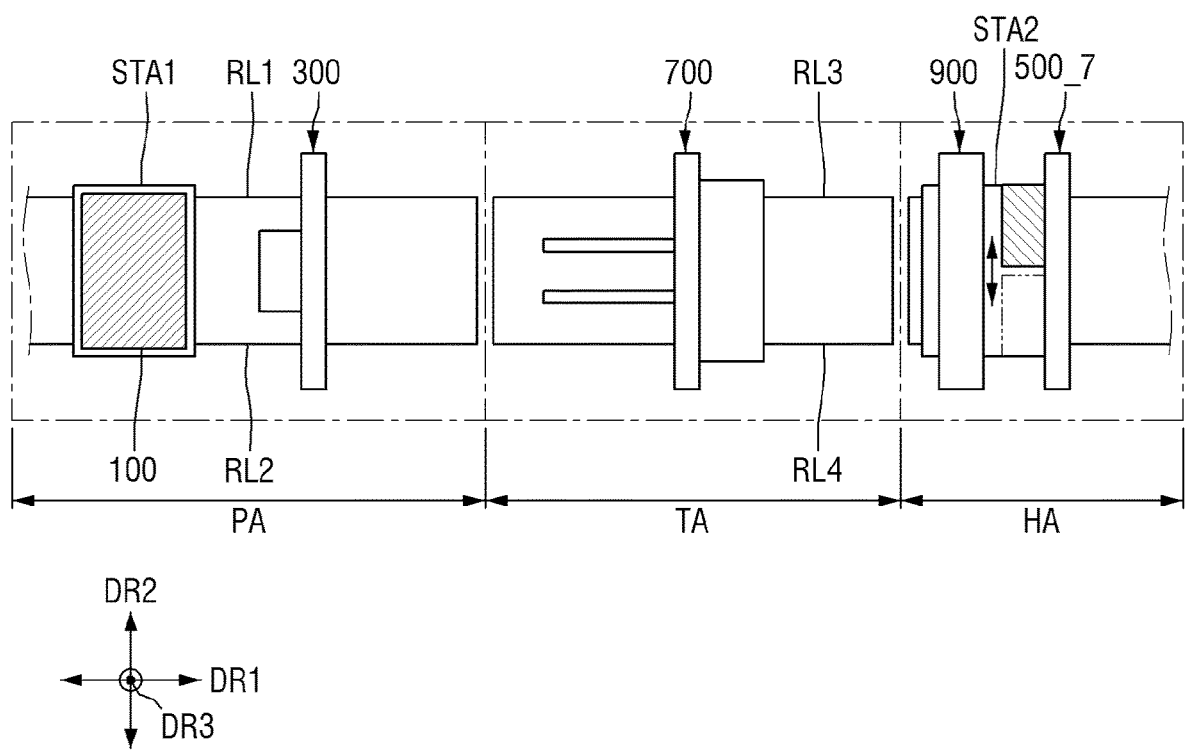

FIGS. 36 and 37 are schematic plan views of dipole alignment devices according to other embodiments.

Referring to FIG. 36, a light irradiation apparatus 500_6 of a dipole alignment device 1000_6 may further include a second moving part, which moves in a direction, and the light irradiation apparatus 500_6 may be disposed in a transportation part TA. Referring to FIG. 37, a light irradiation apparatus 500_7 of a dipole alignment device 1000_7 may further include a second moving part, which moves in a direction, and the light irradiation apparatus 500_7 may be disposed in a heat treatment part HA. The embodiments of FIGS. 36 and 37 differ from the embodiment of FIG. 34 at least in that the light irradiation apparatuses 500_6 and 500_7 are disposed in the transportation part TA and the heat treatment part HA, respectively. Descriptions of features or elements of each of the embodiments of FIGS. 36 and 37 that have been described above will be omitted.

The light irradiation apparatus 500 is not limited to being fixed to an arbitrary member. In some embodiments, the structure of the light irradiation apparatus 500 may vary.

Figure 39:
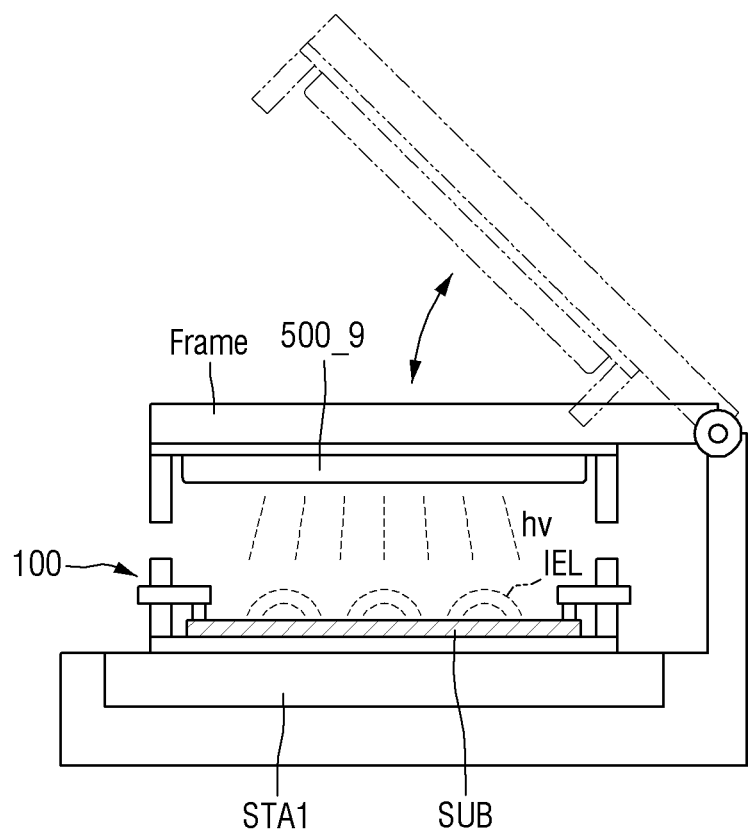
Figure 40:
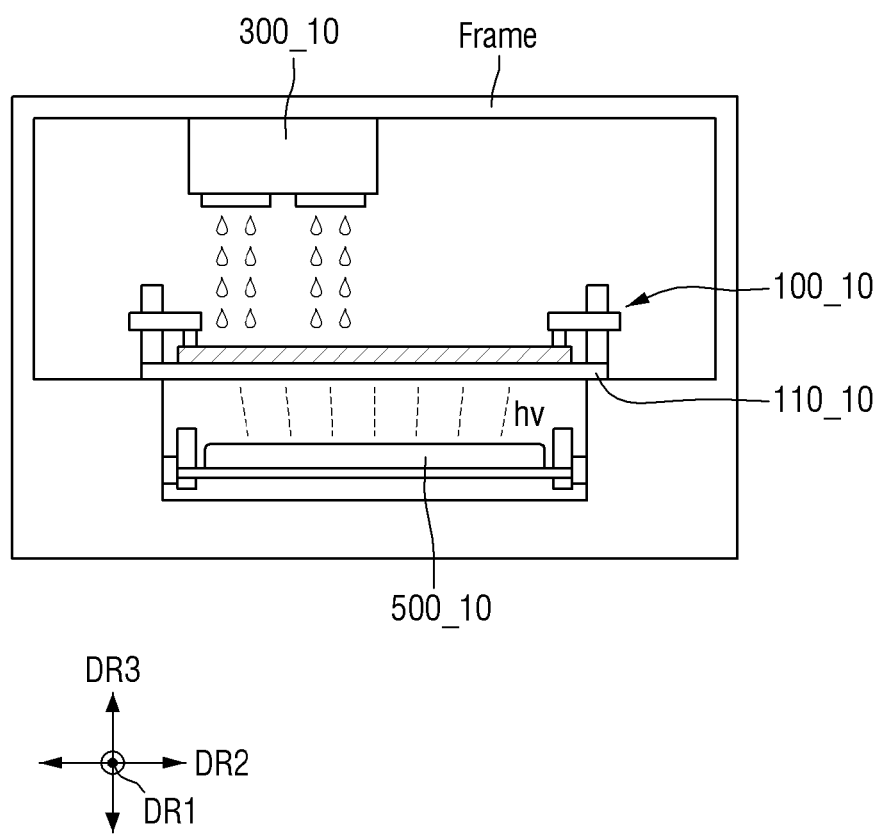

FIGS. 38 to 40 are schematic views illustrating the operations of light irradiation apparatuses according to other embodiments.

Referring first to FIG. 38, a light irradiation apparatus 500_8 may be disposed on a base frame and may move in a direction within the base frame. For example, the light irradiation apparatus 500_8 may have a slide structure in the base frame.

In an example, in case that the light irradiation apparatus 500_8 is disposed in a printing part PA, as illustrated in FIG. 1, the light irradiation apparatus 500_8 may be located inside the base frame until an electric field forming part 100 arrives at a region where the light irradiation apparatus 500_8 is disposed. As a first stage STA1 moves, ink I may be sprayed onto a target substrate SUB on an electric field forming part 100. As the electric field forming part 100 arrives at the region where the light irradiation apparatus 500_8 is disposed, the light irradiation apparatus 500_8 may move in a direction to be exposed from the base frame and may apply light hv onto the target substrate SUB on the electric field forming part 100.

Referring to FIG. 39, a light irradiation apparatus 500_9 may be disposed in a base frame and may rotate about one axis within the base frame. For example, the light irradiation apparatus 500_9 may be disposed in a base frame having a folding structure. The embodiment of FIG. 39 differs from the embodiment of FIG. 38 at least in that the light irradiation apparatus 500_9 is disposed in the base frame having a folding structure. Descriptions of features or elements of the embodiment that have been described above will be omitted.

Referring to FIG. 40, a light irradiation apparatus 500_10 may be disposed below an electric field forming part 100_10. The embodiment of FIG. 40 differs from the embodiment of FIG. 1 at least in that the light irradiation apparatus 500_10 is positioned in a region where a first stage STA1 is disposed. Descriptions of features or elements of the embodiment that have been described above will be omitted.

As illustrated in FIG. 40, the light irradiation apparatus 500_10 may be disposed in a region where the first stage STA1 of a printing part PA is positioned. The light irradiation apparatus 500_10 may include a moving member such as the first stage STA1 and may thus move in a direction, but the disclosure is not limited thereto. The light irradiation apparatus 500_10 may be disposed below the electric field forming part 100_10, overlapping a region where an inkjet printing apparatus 300_10 is positioned. The light irradiation apparatus 500_10 may apply light hv in an upward direction from below the electric field forming part 100_10. In some embodiments, a substage 110_10 of the electric field forming part 100_10 may be formed of a transparent material, and the light hv applied by the light irradiation apparatus 100_10 may arrive at a target substrate SUB.

The light irradiation apparatus 500 may include a second moving part and may thus move in the first and second directions DR1 and DR2.

Figure 42:
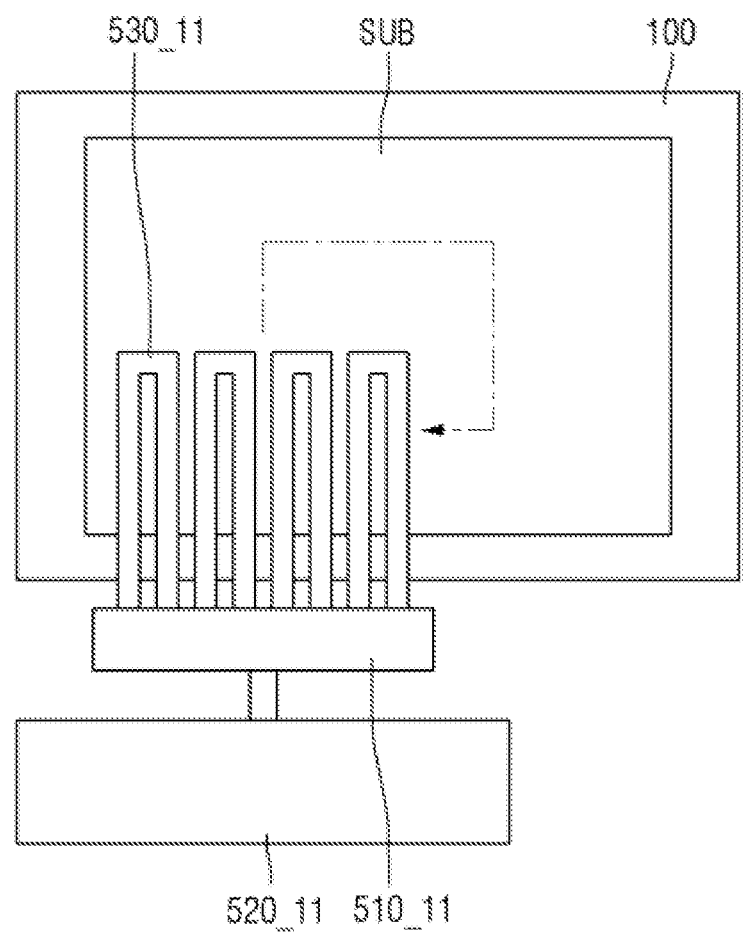
FIG. 42 is a schematic plan view illustrating the operation of the light irradiation apparatus of FIG. 41.

FIG. 41 is a schematic view of a light irradiation apparatus according to another embodiment. FIG. 42 is a schematic plan view illustrating the operation of the light irradiation apparatus of FIG. 41.

Referring to FIGS. 41 and 42, a light irradiation apparatus 500_11 may further include a second moving part 520_11, which is movable in first and second directions DR1 and DR2. As a second support 510_11 is connected to the second moving part 520_11, a light irradiation part 530_11 may move in the first and second directions DR1 and DR2 over a target substrate SUB in accordance with the movement of the second moving part 520_11. The embodiment of FIG. 41 differs from the embodiment of FIG. 1 at least in that the light irradiation apparatus 500_11 further includes the second moving part 520_11. The embodiment will hereinafter be described, focusing mainly on the differences from the embodiment of FIG. 1.

As illustrated in FIG. 41, as the light irradiation apparatus 500_11 includes the second moving part 520_11, the light irradiation apparatus 500_11 may move in the first and second directions DR1 and DR2 over the target substrate SUB. In some embodiments, if the size of the target substrate SUB is greater than the size of the light irradiation part 530_11 of the light irradiation apparatus 500_11 or multiple target substrates SUB are disposed on an electric field forming part 100, the light irradiation apparatus 500_11 can uniformly apply light hv onto the entire surface of the target substrate(s) SUB while the second moving part 520_11 is moving.

In some embodiments, the light irradiation part 530_11 of the light irradiation apparatus 500_11 may be disposed on a side surface of the second support 510_11 and may apply the light hv onto the target substrate SUB below the light irradiation part 530_11. As the light irradiation part 530_11 of the light irradiation apparatus 500_11 is disposed on the side surface of the second support 510_11, as illustrated in FIG. 42, the target substrate SUB may be disposed to overlap the light irradiation part 530_11. The second support 510_11 and the second moving part 520_11 of the light irradiation apparatus 500_11 may be disposed not to overlap the electric field forming part 100. The second moving part 520_11 may move in the first and second directions DR1 and DR2 and may apply the light hv onto the entire surface of the target substrate SUB. Descriptions of features or elements of the embodiment that have been described above will be omitted.

The dipoles DP may be light-emitting elements including a conductive semiconductor. In an embodiment, a display device including light-emitting elements can be fabricated using the dipole alignment device 1000.

Figure 43:
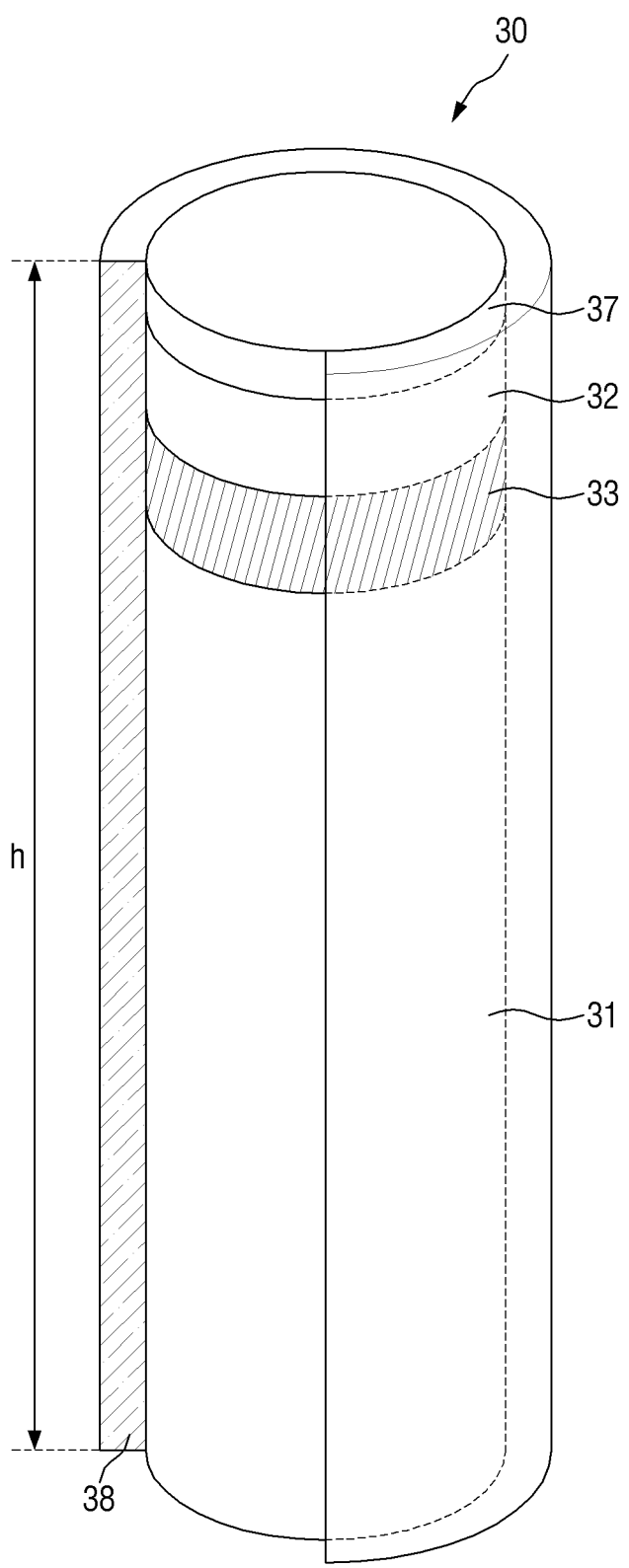
FIG. 43 is a schematic view of a light-emitting element according to an embodiment of the disclosure.

FIG. 43 is a schematic view of a light-emitting element according to an embodiment.

A light-emitting element 30 may be a light-emitting diode (LED), particularly, an ILED (or inorganic LED) having a size of several micrometers or nanometers and formed of an inorganic material. If an electric field is formed in a direction between two opposite electrodes, the ILED may be aligned between the two electrodes where polarities are formed. The light-emitting element 30 may be aligned by the electric field formed between the two electrodes.

The light-emitting element 30 may extend in a direction. The light-emitting element 30 may have the shape of a rod, a wire, or a tube. In an embodiment, the light-emitting element 30 may have a cylindrical or rod shape. However, the shape of the light-emitting element 30 is not particularly limited to this. As another example, the light-emitting element 30 may have the shape of a polygonal column such as a regular cube, a rectangular parallelepiped, or a hexagonal column or may extend in a direction but with a partially inclined outer surface. Semiconductors included in the light-emitting element 30 may be sequentially disposed or stacked in the direction in which the light-emitting element 30 extends.

The light-emitting element 30 may include semiconductor layers doped with impurities of an arbitrary conductivity type (e.g., a p type or an n type). The semiconductor layers may receive electrical signals from an external power source to emit light of a wavelength range.

Referring to FIG. 43, the light-emitting element 30 may include a first semiconductor layer 31, a second semiconductor layer 32, an active layer 33, an electrode layer 37, and an insulating film 38.

The first semiconductor layer 31 may include, for example, an n-type semiconductor having a first conductivity type. In an example, in case that the light-emitting element 30 emits light of a blue wavelength range, the first semiconductor layer 31 may include a semiconductor material $Al_xGa_yIn_{1-x-y}N$ (where $0 \leq x \leq 1$, $0 \leq y \leq 1$, and $0 \leq x+y \leq 1$). The semiconductor material $Al_xGa_yIn_{1-x-y}N$ may be at least one of AlGaInN, GaN, AlGaN, InGaN, AlN, and InN that are doped with an n-type dopant. The first semiconductor layer 31 may be doped with a dopant of the first conductivity type, and the dopant of the first conductivity type may be, for example, Si, Ge, or Sn. In an embodiment, the first semiconductor layer 31 may be n-GaN doped with n-type Si. The first semiconductor layer 31 may have a length of about 1.5 μm to about 5 μm, but the disclosure is not limited thereto.

The second semiconductor layer 32 is disposed on the active layer 33. The second semiconductor layer 32 may include, for example, a p-type semiconductor having a second conductivity type. In one example, in case that the light-emitting element 30 emits light of a blue or green wavelength range, the second semiconductor layer 32 may include a semiconductor material $Al_xGa_yIn_{1-x-y}N$ (where $0 \leq x \leq 1$, $0 \leq y \leq 1$, and $0 \leq x+y \leq 1$). In an example, the semiconductor material $Al_xGa_yIn_{1-x-y}N$ may be at least one of AlGaInN, GaN, AlGaN, InGaN, AlN, and InN that are doped with a p-type dopant. In an example, the second semiconductor layer 32 may be doped with the dopant of the second conductivity type, and the dopant of the second conductivity type may be, for example, Mg, Zn, Ca, Se, or Ba. In an embodiment, the second semiconductor layer 32 may be p-GaN doped with p-type Mg. The second semiconductor layer 32 may have a length of about 0.05 μm to about 0.10 μm, but the disclosure is not limited thereto.

FIG. 43 illustrates that the first and second semiconductor layers 31 and 32 are formed as single-layer films, but the disclosure is not limited thereto. As another example, each of the first and second semiconductor layers 31 and 32 may include more than one layer such as, for example, a clad layer or a tensile strain barrier reducing (TSBR) layer, depending on the material of the active layer 33. This will be described below with reference to other drawings.

The active layer 33 is disposed between the first and second semiconductor layers 31 and 32. The active layer 33 may include a single- or multi-quantum well structure material. In case that the active layer 33 includes a material having a multi-quantum well structure, the active layer 33 may have a structure in which multiple quantum layers and multiple well layers are alternately stacked. The active layer 33 may emit light by combining electron-hole pairs in accordance with electrical signals applied thereto via the first and second semiconductor layers 31 and 32. In an example, in case that the active layer 33 emits light of a blue wavelength range, the quantum layers may include a material such as AlGaN or AlGaInN. In particular, in case that the active layer 33 has a multi-quantum well structure in which multiple quantum layers and multiple well layers are alternately stacked, the quantum layers may include a material such as AlGaN or AlGaInN, and the well layers may include a material such as GaN or AlInN. In an embodiment, in case that the active layer 33 includes AlGaInN as its quantum layer(s) and AlInN as its well layer(s), the active layer 33 can emit blue light having a central wavelength range of about 450 nm to about 495 nm.

However, the disclosure is not limited thereto. As another example, the active layer 33 may have a structure in which a semiconductor material having a large band gap energy and a semiconductor material having a small band gap energy are alternately stacked or may include group III or V semiconductor materials depending on the wavelength of light to be emitted. The light emitted from the active layer 33 is not particularly limited. In some embodiments, the active layer 33 may emit light of a red or green wavelength range, instead of blue light. The active layer 33 may have a length of about 0.05 μm to about 0.10 μm, but the disclosure is not limited thereto.

Light may be emitted not only from the circumferential surface, in a length direction, of the light-emitting element 30, but also from both sides of the light-emitting element 30. The directionality of the light emitted from the active layer 33 is not particularly limited.

The electrode layer 37 may be an ohmic contact electrode, but the disclosure is not limited thereto. As another example, the electrode layer 37 may be a Schottky contact electrode. The light-emitting element 30 may include at least one electrode layer 37. FIG. 43 illustrates that the light-emitting element 30 includes an electrode layer 37, but the disclosure is not limited thereto. As another example, the light-emitting element 30 may include more than one electrode layer 37, or the electrode layer 37 may not be provided. However, the following description of the light-emitting element 30 may be applicable to a light-emitting element 30 having more than an electrode layer 37 or having a different structure from the light-emitting element 30 of FIG. 43.

The electrode layer 37 may reduce the resistance between the light-emitting element 30 and electrodes (or contact electrodes) in case that the light-emitting element 30 is electrically connected to the electrodes (or the contact electrodes), in the display device 10. The electrode layer 37 may include a conductive metal. In an example, the electrode layer 37 may include at least one of Al, Ti, In, Au, Ag, ITO, IZO, and ITZO. The electrode layer 37 may include a semiconductor material doped with an n- or p-type dopant. The electrode layer 37 may include a same material or different materials, but the disclosure is not limited thereto.

The insulating film 38 is disposed to surround the outer surfaces of the first and second semiconductor layers 31 and 32 and the electrode layer 37. In an embodiment, the insulating film 38 may be disposed to surround at least the outer surface of the active layer 33 and may extend in the direction in which the light-emitting element 30 extends. The insulating film 38 may protect the first semiconductor layer 31, the active layer 33, the second semiconductor layer 32, and the electrode layer 37. In an example, the insulating film 38 may be formed to surround the sides of the first semiconductor layer 31, the active layer 33, the second semiconductor layer 32, and the electrode layer 37, but to expose both end portions, in the length direction, of the light-emitting element 30.

FIG. 43 illustrates that the insulating film 38 is formed to extend in the length direction of the light-emitting element 30 and to cover the sides of the first semiconductor layer 31, the active layer 33, the second semiconductor layer 32, and the electrode layer 37, but the disclosure is not limited thereto. The insulating film 38 may cover the side of the active layer 33 and an area of the outer surfaces of the first and second semiconductor layers 31 and 32 or may cover only part of the side of the electrode layer 37 so that the side of the electrode layer 37 may be partially exposed. The top surface of the insulating film 38 may be formed to be rounded in a cross-sectional view, in an area adjacent to at least one end of the light-emitting element 30.

The insulating film 38 may have a thickness of about 10 nm to about 1.0 but the disclosure is not limited thereto. The insulating film 38 may have a thickness of about 40 nm.

The insulating film 38 may include a material with insulating properties such as, for example, $SiO_x$, $SiN_x$, $SiO_xN_y$, AlN, or $Al_2O_3$. Accordingly, the insulating film 38 can prevent any short circuit that may occur in case that the active layer 33 directly contacts electrodes that transmit electrical signals directly to the light-emitting element 30. Since the insulating film 38 includes the active layer 33 to protect the outer surface of the light-emitting element 30, any degradation in the emission efficiency of the light-emitting element 30 can be prevented.

In some embodiments, the outer surfaces of the insulating film 38 may be subjected to surface treatment. During the fabrication of the display device 10, the light-emitting element 30 may be sprayed on electrodes while being scattered (or dispersed) in ink. The surface of the insulating film 38 may be hydrophobically or hydrophilically treated to keep the light-emitting element 30 scattered in ink without agglomerating with other neighboring light-emitting elements 30.

A length h of the light-emitting element 30 may be in a range of about 1 μm to about 10 μm or about 2 μm to about 6 μm, preferably, about 3 μm to about 5 μm. The light-emitting element 30 may have a diameter of about 30 nm to about 700 nm and may have an aspect ratio of about 1.2 to about 100, but the disclosure is not limited thereto. Different light-emitting elements 30 included in the display device 10 may have different diameters depending on the composition of their respective light-emitting layers 36. The light-emitting element 30 may have a diameter of about 500 nm.

The light-emitting element 30 may extend in a direction. The light-emitting element 30 may have a nanorod, nanowire, or nanotube shape. In an embodiment, the light-emitting element 30 may have a cylindrical or rod shape. However, the shape of the light-emitting element 30 is not particularly limited, and the light-emitting element 30 may have various other shapes such as a cube, a cuboid, or a hexagonal prism.

The structure of the light-emitting element 30 is not limited to that illustrated in FIG. 43, and the light-emitting element 30 may have various other structures.

Figure 44:
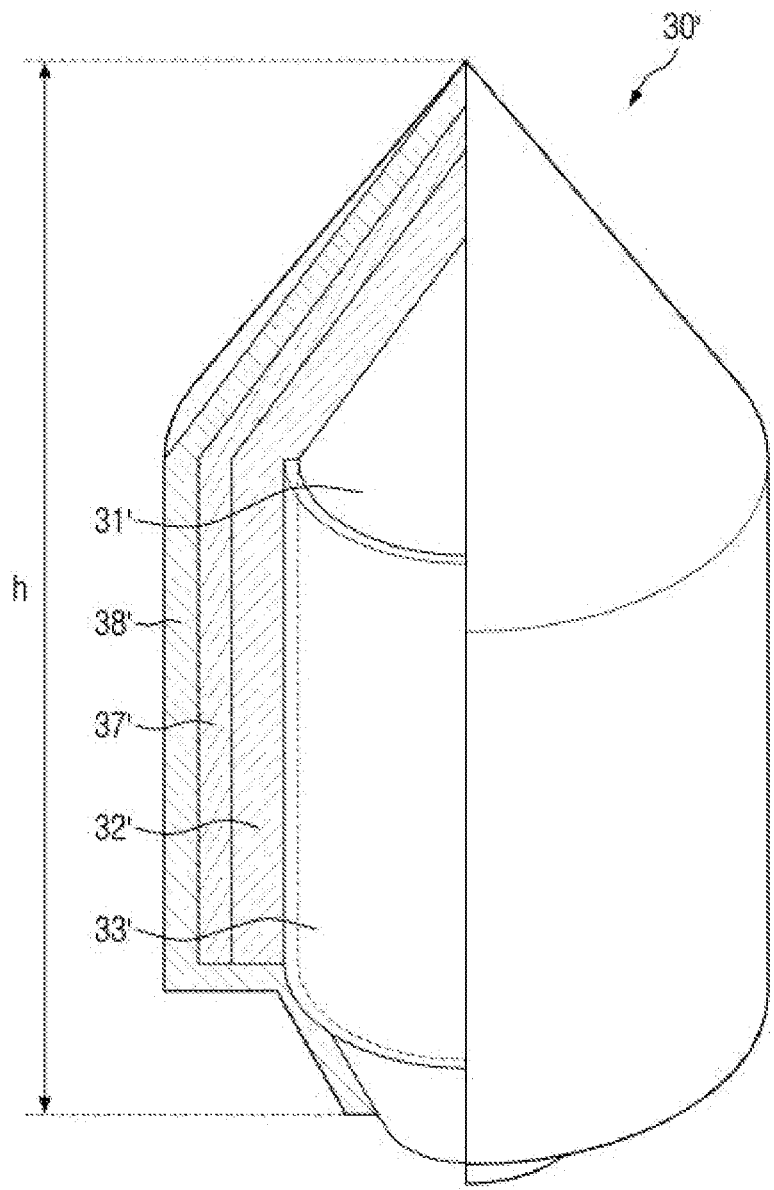
FIG. 44 is a schematic view of a light-emitting element according to another embodiment of the disclosure.

FIG. 44 is a schematic view of a light-emitting element according to another embodiment.

Referring to FIG. 44, a light-emitting element 30' may extend in a direction and may be inclined in part. For example, the light-emitting element 30' may have a conical shape in part.

In the light-emitting element 30', layers may be formed to surround one another, instead of being stacked in a direction. The light-emitting element 30' of FIG. 44 may be formed such that semiconductor layers may surround at least parts of the outer surfaces of another layer. The light-emitting element 30 may include a semiconductor core, which extends in a direction, and an insulating film 38', which is formed to surround the semiconductor core. The semiconductor core may include a first semiconductor layer 31', an active layer 33', a second semiconductor layer 32', and an electrode layer 37'. The light-emitting element 30' of FIG. 44 is the same as the light-emitting element 30 of FIG. 43 except for the shapes of the layers thereof. The light-emitting element 30' will hereinafter be described, focusing mainly on the differences from the light-emitting element 30.

In an embodiment, the first semiconductor layer 31' may extend in a direction and may be inclined toward the center of the light-emitting element 30' at both ends (or end portions) thereof. The first semiconductor layer 31' of FIG. 44 may include a main body portion, which has a rod- or cylindrical shape, and upper and lower end portions, which are formed at the top and bottom of the main body portion to have inclined side surfaces. The upper end portion may be steeper than the lower end portion.

The active layer 33' is disposed to surround the outer surface of the main body portion of the first semiconductor layer 31'. The active layer 33' may have a ring shape that extends in a direction. The active layer 33' may not be formed on the upper and lower end portions of the first semiconductor layer 31'. The active layer 33' may be formed only on a non-inclined side surface of the first semiconductor layer 31', but the disclosure is not limited thereto. Accordingly, light emitted from the active layer 33' may be output not only from both end portions, in the length direction, of the light-emitting element 30', but also from the side surface of the light-emitting element 30' with respect to the length direction. The light-emitting element 30' of FIG. 44 may have a wider active layer 33' than the light-emitting element 30 of FIG. 43 and may thus emit a larger amount of light than the light-emitting element 30 of FIG. 43.

The second semiconductor layer 32' is disposed to surround outer surfaces of the active layer 33' and the upper end portion of the first semiconductor layer 31'. The second semiconductor layer 32' may include a main body portion, which has a ring shape that extends in a direction, and an upper end portion, which is formed to have an inclined side surface. For example, the second semiconductor layer 32' may directly contact the side surface of the active layer 33' and the upper end portion of the first semiconductor layer 31'. However, the second semiconductor layer 32' may not be formed on the lower end portion of the first semiconductor layer 31'.

The electrode layer 37' is disposed to surround an outer surface of the second semiconductor layer 32'. For example, the shape of the electrode layer 37' may be substantially the same as the second semiconductor layer 32'. In other words, the electrode layer 37' may contact the entire outer surface of the second semiconductor layer 32'.

The insulating film 38' may be disposed to surround outer surfaces of the electrode layer 37' and the first semiconductor layer 31'. The insulating film 38' may directly contact not only the electrode layer 37', but also the lower end portion of the first semiconductor layer 31' and exposed lower end portions of the active layer 33' and the second semiconductor layer 32'.

In an embodiment, the dipole alignment device 1000 may disperse the light-emitting element 30 or 30' of FIG. 43 or 44 in the ink I and may spray or eject the ink I onto the target substrate SUB, thereby forming the display device 10 including the light-emitting element 30.

Figure 45:
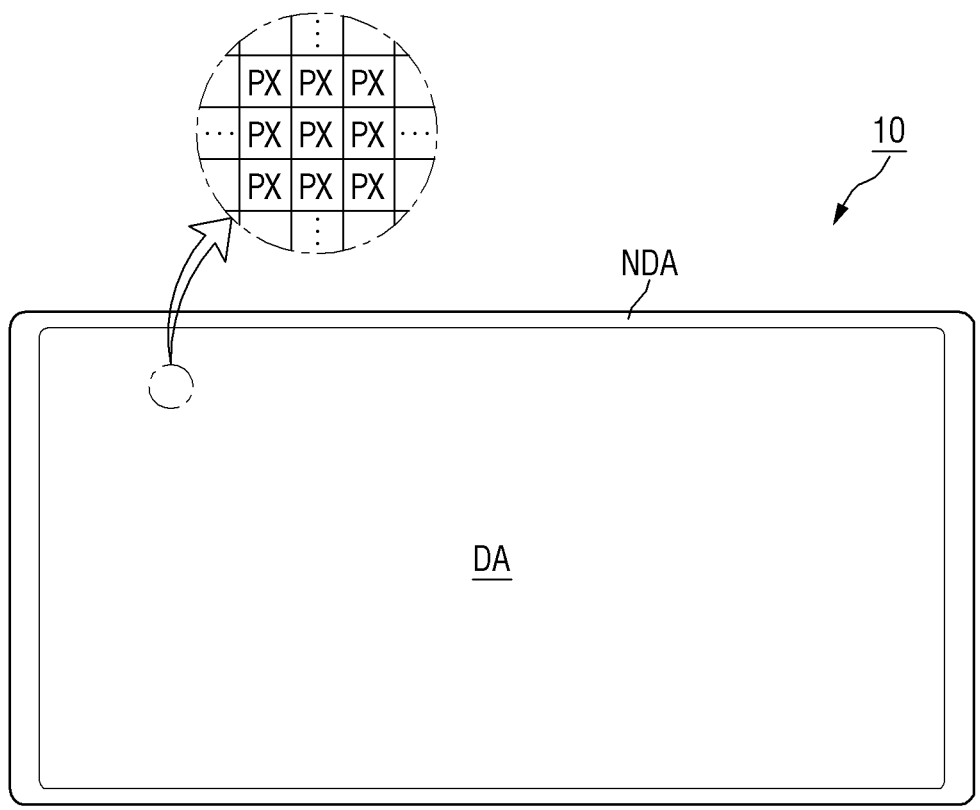
FIG. 45 is a schematic plan view of a display device according to an embodiment of the disclosure.

FIG. 45 is a schematic plan view of a display device according to an embodiment.

Referring to FIG. 45, a display device 10 displays a moving or still image. The display device 10 may refer to all types of electronic devices that provide a display screen. Examples of the display device 10 may include a television (TV), a laptop computer, a monitor, a billboard, an Internet of things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, a camcorder, and the like.

The shape of the display device 10 may vary. In an example, the display device 10 may have a rectangular shape that extends longer in a horizontal direction than in a vertical direction, a rectangular shape that extends longer in a vertical direction than in a horizontal direction, a square shape, a tetragonal shape with rounded corners, a non-tetragonal polygonal shape, or a circular shape. The shape of a display area DA of the display device 10 may be similar to the shape of the display device 10. FIG. 45 illustrates that the display device 10 and the display area DA both have a rectangular shape that extends in a fourth direction DR4.

The display device 10 may include the display area DA and a non-display area NDA. The display area DA may be an area in which an image is displayed, and the non-display area NDA may be an area in which an image is not displayed. The display area DA may also be referred to as an active area, and the non-display area NDA may also be referred to as an inactive area.

The display area DA may occupy the middle part (or center) of the display device 10. The display area DA may include pixels PX. The pixels PX may be arranged in row and column directions. The pixels PX may have a rectangular or square shape in a plan view, but the disclosure is not limited thereto. As another example, the pixels PX may have a rhombic shape having sides that are inclined with respect to a direction. Each of the pixels PX may include one or more light-emitting elements 30 emitting light of a wavelength range and may thus display a color.

Figure 46:
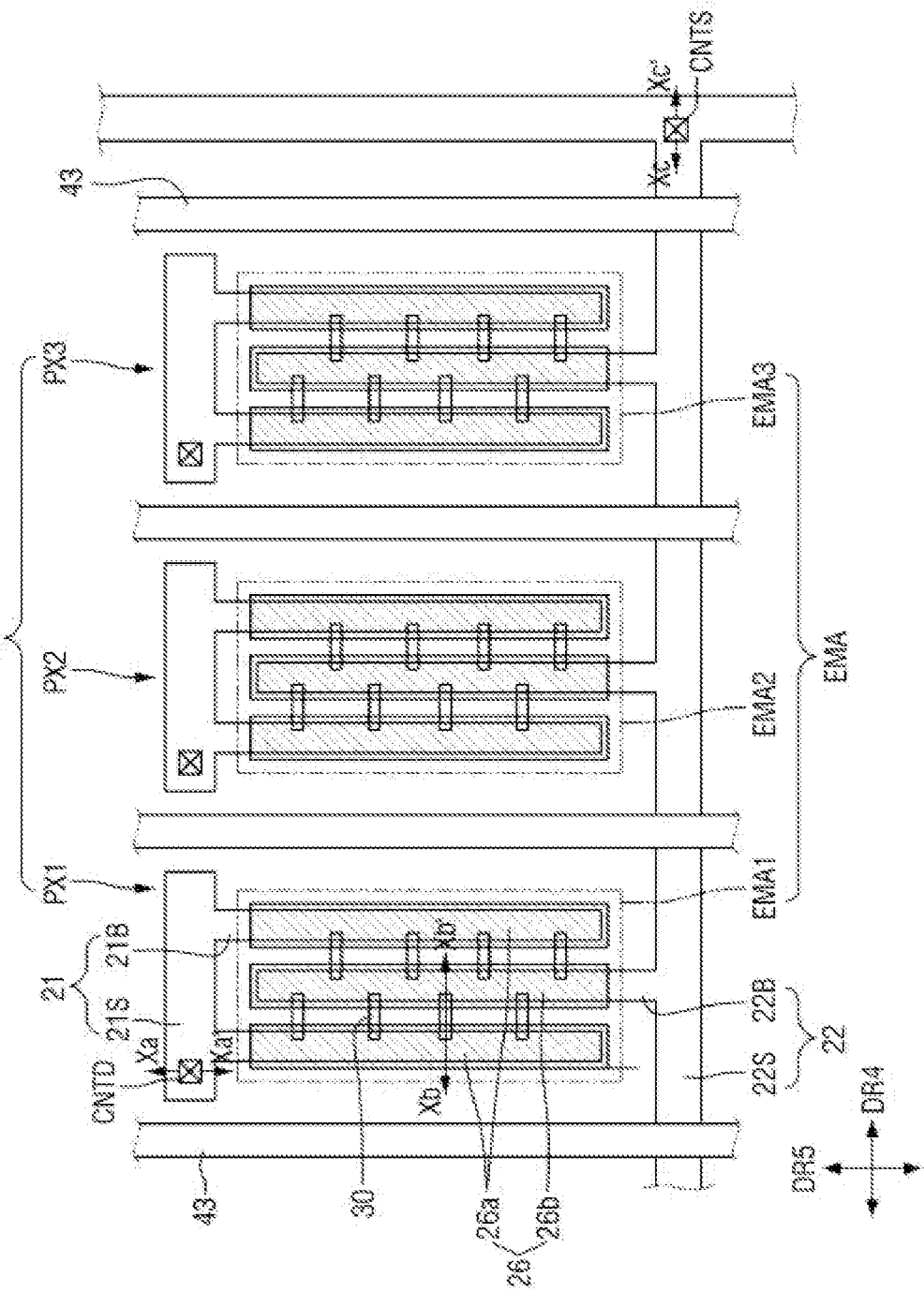
FIG. 46 is a schematic plan view of a pixel of the display device according to an embodiment of the disclosure.

FIG. 46 is a schematic plan view of a pixel of the display device according to an embodiment.

Referring to FIG. 46, each of the pixels PX may include first, second, and third subpixels PX1, PX2, and PX3. The first subpixel PX1 may emit light of a first color, the second subpixel PX2 may emit light of a second color, and the third subpixel PX3 may emit light of a third color. The first, second, and third colors may be blue, green, and red, respectively, but the disclosure is not limited thereto. As another example, the subpixels PXn may all emit light of a same color, where n is a natural number. FIG. 46 illustrates that the pixel PX may include three subpixels PXn, but the disclosure is not limited thereto. As another example, each of the pixels PX may include more than three subpixels PXn.

Each of the subpixels PXn of the display device 10 may include a region defined as an emission area EMA. The first subpixel PX1 may include a first emission area EMA1, the second subpixel PX2 may include a second emission area EMA2, and the third subpixel PX3 may include a third emission area EMA3. The emission area EMA may be defined as a region where the light-emitting elements 30 of the display device are disposed and light of a wavelength range is emitted.

Although not specifically illustrated, each of the subpixels PXn of the display device 10 may further include a non-emission area, which is defined as a region other than the emission area EMA. The non-emission area may be a region where the light-emitting elements 30 are not disposed so that light emitted by the light-emitting elements 30 does not arrive and is thus not output.

Figure 47:
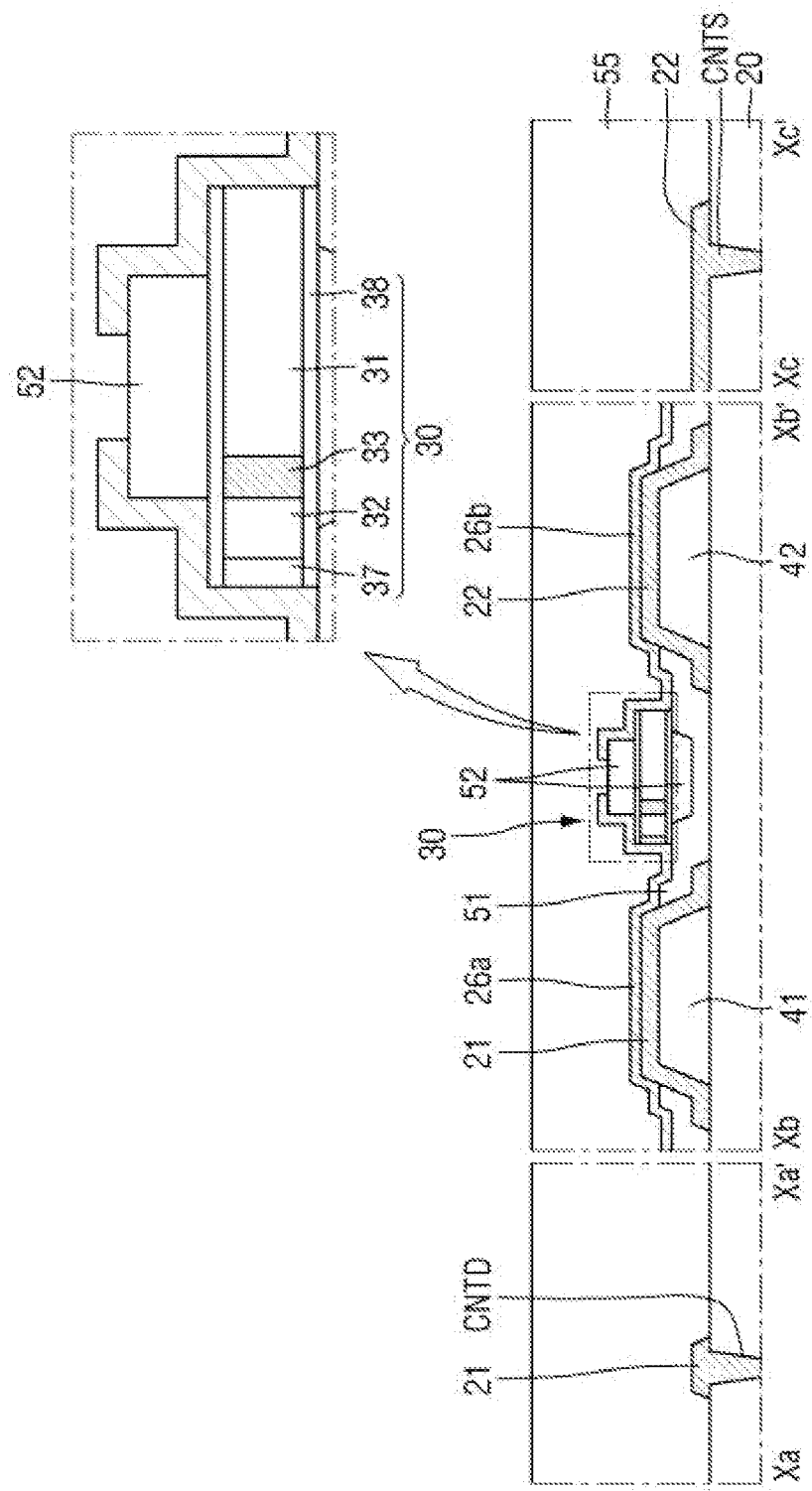
FIG. 47 is a schematic cross-sectional view taken along lines Xa-Xa', Xb-Xb', and Xc-Xc' of FIG. 46.

Each of the subpixels PXn of the display device 10 may include electrodes (21 and 22), the light-emitting elements 30, contact electrodes 26, banks (41, 42, and 43 of FIG. 47), and one or more insulating layers (51, 52, and 55 of FIG. 47).

The electrodes (21 and 22) may be electrically connected to the light-emitting elements 30 and may receive predetermined voltages to cause the light-emitting elements 30 to emit light of a wavelength range. At least some of the electrodes (21 and 22) may be used to form an electric field in each of the subpixels PXn.

The electrodes (21 and 22) may include first and second electrodes 21 and 22. In an embodiment, the first electrode 21 may be a pixel electrode separate for each of the subpixels PXn, and the second electrode 22 may be a common electrode connected (or extended) in common along each of the subpixels PXn. One of the first and second electrodes 21 and 22 may be anode electrodes of the light-emitting elements 30, and the other electrode may be cathode electrodes of the light-emitting elements 30. However, the disclosure is not limited to this. As another example, one of the first and second electrodes 21 and 22 may be anode electrodes of the light-emitting elements 30, and the other electrode may be cathode electrodes of the light-emitting elements 30.

The first and second electrodes 21 and 22 may include electrode stems (21S and 22S), which extend in the fourth direction DR4, and electrode branches (21B and 22B), which extend in a fifth direction DR5 that intersects the fourth direction DR4, and branch off from the electrode stems (21S and 22S).

The first electrode 21 may include a first electrode stem 21S, which extends in the fourth direction DR4, and one or more first electrode branches 21B, which branch off from the first electrode stem 21S to extend in the fifth direction DR5.

Both end portions of first electrode stems 21S of an arbitrary pixel are spaced apart and terminated between subpixels PXn of the arbitrary pixel, and first electrode stems 21S of a pair of adjacent subpixels in a same row (e.g., in the fourth direction DR4) may fall on substantially the same straight line (or may be collinear with each other). As both the end portions of the first electrode stems 21S of the subpixels PXn are spaced apart from each other, different electric signals may be applied to the first electrode branches 21B of the subpixels PXn, and sets of first electrode branches 21B of the subpixels PXn may be driven separately.

The first electrode branches 21B of the first electrode 21 may branch off from at least part of the first electrode stem 21S, may extend in the fifth direction DR5, and may be terminated in a state of being spaced apart from a second electrode stem 22S that faces the first electrode stem 21S.

The second electrode 22 may include the second electrode stem 22S, which extends in the fourth direction DR4 and is spaced apart from, and faces, the first electrode stem 21S in the fifth direction DR5, and a second electrode branch 22B, which branches off from the second electrode stem 22S and extends in the fifth direction DR5. A second end portion of the second electrode stem 22S may be connected to a second electrode stem 22S of a neighboring subpixel PXn in the fourth direction DR4. For example, the second electrode stem 22S, unlike the first electrode stem 21S, may extend in the fourth direction DR4 across each of the subpixels PXn. The second electrode stem 22S, which extends across each of the subpixels PXn, may be connected to outer parts of the display area DA, in which the respective pixels PX or subpixels PXn are disposed, or parts of the non-display area NDA which extends in a direction.

The second electrode branch 22B may be spaced apart from, and face, the first electrode branches 21B and may be terminated in a state of being spaced apart from the first electrode stem 21S. The second electrode branch 22B may be connected to the second electrode stem 22S, and an end portion of the second electrode branch 22B may be disposed in the corresponding subpixel PXn in a state of being spaced apart from the first electrode stem 21S.

The first and second electrodes 21 and 22 may be electrically connected to a circuit element layer (not illustrated) of the display device 10 through contact holes, for example, through first and second electrode contact holes CNTD and CNTS. FIG. 46 illustrates that the first electrode contact hole CNTD is formed in each of the first electrode stems 21S of the subpixels PXn and only a second electrode contact hole CNTS is formed in the second electrode stem 22, which extends across each of the subpixels PXn, but the disclosure is not limited thereto. In another example, the second electrode contact hole CNTS may be formed in each of the subpixels PXn.

The banks (41, 42, and 43) may include an outer bank 43, which is disposed along the boundaries of each of the subpixels PXn, and inner banks (41 and 42), which are disposed on the lower sides of the electrodes (21 and 22)21 and 22, near the center of each of the subpixels PXn. The inner banks (41 and 42) are not illustrated, but there may be provided first inner banks 41, which are disposed below the first electrode branches 21B, and a second inner bank 42, which is disposed below the second electrode branch 22B.

The outer bank 43 may be disposed along the boundaries of each of the subpixels PXn. The end portions of first electrode stems 21S may be spaced apart and terminated by the outer bank 43. The outer bank 43 may extend in the fifth direction DR5 and may be arranged along the boundaries of each of subpixels PXn that are arranged in the fourth direction DR4, but the disclosure is not limited thereto. The outer bank 43 may extend in the fourth direction DR4 and may be arranged along the boundaries of each of subpixels PXn that are arranged in the fifth direction DR5. The outer bank 43 and the inner banks 41 and 42 may include a same material, and may be formed at the same time by a single process.

The light-emitting elements 30 may be disposed between the first and second electrodes 21 and 22. First end portions of the light-emitting elements 30 may be electrically connected to the first electrode 21, and second end portions of the light-emitting elements 30 may be electrically connected to the second electrode 22. The light-emitting elements 30 may be electrically connected to the first and second electrodes 21 and 22 through contact electrodes 26 that will be described below.

The light-emitting elements 30 may be disposed to be spaced apart from each other, substantially in parallel to each other. The distance between the light-emitting elements 30 is not particularly limited. Light-emitting elements 30 may be arranged adjacent to each other to form a group, and other light-emitting elements 30 may be grouped while being spaced apart from each other by a predetermined distance and may be oriented and aligned in a direction with a non-uniform density. In an embodiment, the light-emitting elements 30 may extend in a direction, and the direction in which the electrodes, for example, the first electrode branches 21B and the second electrode branch 22B, extend may form a substantially right angle with the direction in which the light-emitting elements 30 extend. However, the disclosure is not limited thereto. As another example, the light-emitting elements 30 may be arranged not perpendicularly, but diagonally with respect to the direction in which the first electrode branches 21B and the second electrode branch 22B extend.

The light-emitting elements 30 may include active layers 33 that include different materials and may thus emit light of different wavelength ranges. In the display device 10, the light-emitting elements 30 of the first subpixel PX1 may emit first light having a first wavelength as its central wavelength range, the light-emitting elements 30 of the second subpixel PX2 may emit second light having a second wavelength as its central wavelength range, and the light-emitting elements 30 of the third subpixel PX3 may emit third light having a third wavelength as its central wavelength range. Accordingly, the first subpixel PX1 may emit the first light, the second subpixel PX2 may emit the second light, and the third subpixel PX3 may emit the third light. In some embodiments, the first light may be blue light having a central wavelength range of about 450 nm to about 495 nm, the second light may be green light having a central wavelength range of about 495 nm to about 570 nm, and the third light may be red light having a central wavelength range of about 620 nm to about 750 nm. However, the disclosure is not limited thereto. Light hv applied by a light irradiation apparatus 500 may be controlled in accordance with the central wavelength range of light emitted by the light-emitting elements 30. This has already been described above, and thus, a detailed description thereof will be omitted.

Although not specifically illustrated in FIG. 46, the display device 10 may include a first insulating layer 51, which covers (or overlaps) parts of the first and second electrodes 21 and 22.

The first insulating layer 51 may be disposed in each of the subpixels PXn of the display device 10. The first insulating layer 51 may be disposed to cover substantially the entire surfaces of the subpixels PXn and may be disposed to extend even between each pair of adjacent subpixels PXn. The first insulating layer 51 may be disposed to cover at least parts of the first and second electrodes 21 and 22. Although not specifically illustrated in FIG. 46, the first insulating layer 51 may be disposed to expose parts of the first and second electrodes 21 and 22, particularly, parts of the first electrode branches 21B and of the second electrode branch 22B.

The contact electrodes 26 may extend at least in part in a direction. The contact electrodes 26 may contact the light-emitting elements 30 and the electrodes (21 and 22), and the light-emitting elements 30 may receive electric signals from the first and second electrodes 21 and 22 through the contact electrodes 26.

The contact electrodes 26 may include first contact electrodes 26a and a second contact electrode 26b. The first contact electrodes 26a and the second contact electrode 26b may be disposed on the first electrode branches 21B and the second electrode branch 22B, respectively.

The first contact electrodes 26a may be disposed on the first electrode 21 or the first electrode branches 21B to extend in the fifth direction DR5. The first contact electrodes 26a may contact the first end portions of the light-emitting elements 30. The first contact electrodes 26a may contact an area of the first electrode 21 that are exposed due to the absence of the first insulating layer 51 thereon. Accordingly, the light-emitting elements 30 may be electrically connected to the first electrode 21 through the first contact electrodes 26a.

The second contact electrode 26b may be disposed on the second electrode 22 or the second electrode branch 22B to extend in the first direction DR5. The second contact electrode 26b may be spaced apart from the first contact electrodes 26a in the fourth direction DR4. The second contact electrode 26b may contact the second end portions of the light-emitting elements 30. The second contact electrode 26b may contact parts of the second electrode 22 that are exposed due to the absence of the first insulating layer 51 thereon. Accordingly, the light-emitting elements 30 may be electrically connected to the second electrode 22 through the second contact electrode 26b. FIG. 46 illustrates that two first contact electrodes 26a and a second contact electrode 26b are disposed in each of the subpixels PXn, but the disclosure is not limited thereto. The numbers of first contact electrodes 26a and second contact electrodes 26b may vary depending on the numbers of first electrodes 21 and second electrodes 22 in each of the subpixels PXn or the numbers of first electrode branches 21B and second electrode branches 22B in each of the subpixels PXn.

In some embodiments, the widths, in a direction, of the first contact electrodes 26a and the second contact electrode 26b may be greater than the widths, in the direction, of the first electrode branches 21B and the second electrode branch 22B, but the disclosure is not limited thereto. In another example, the first contact electrodes 26a and the second contact electrode 26b may be disposed to cover only side portions of the first electrode branches 21B and of the second electrode branch 22B.

The display device 10 may include a circuit element layer, which is positioned below the electrodes (21 and 22), and a second insulating layer 52 (see FIG. 47) and a passivation layer 55 (see FIG. 47), which are disposed to cover at least parts of the electrodes (21 and 22) and of the light-emitting elements 30, in addition to the first insulating layer 51. The structure of the display device 10 will hereinafter be described with reference to FIG. 47.

FIG. 47 is a schematic cross-sectional view taken along lines Xa-Xa', Xb-Xb', and Xc-Xc' of FIG. 46.

FIG. 47 illustrates a schematic cross-sectional view of the first subpixel PX1, which may also be applicable to other pixels PX or other subpixels PXn. FIG. 47 illustrates a schematic cross-sectional view taken from one end portion to another end portion of one of the light-emitting elements 30 disposed in the first subpixel PX1.

Although not specifically illustrated in FIG. 47, the display device may further include a circuit element layer, which is positioned below the electrodes (21 and 22). The circuit element layer may include semiconductor layers and conductive patterns and may thus include at least one transistor and at least one power supply line, but a detailed description thereof will be omitted.

Referring to FIG. 47 and further to FIG. 46, the display device may include a via layer 20 and the electrodes (21 and 22) and the light-emitting elements 30, which are disposed on the via layer 20. The circuit element layer (not illustrated) may be further disposed below the via layer 20. The via layer 20 may include an organic insulating material and may thus perform a surface planarization function.

The banks (41, 42, and 43), the electrodes (21 and 22), and the light-emitting elements 30 may be disposed on the via layer 20.

The banks (41, 42, and 43) may include the inner banks (41 and 42), which are disposed to be spaced apart from one another in each of the subpixels PXn, and the outer bank 43, which is disposed along the boundary between each pair of adjacent subpixels PXn.

The outer bank 43 may extend in the fifth direction DR5 and may be disposed along the boundaries of each of subpixels PXn that are arranged in the fourth direction DR4, but the disclosure is not limited thereto. The outer bank 43 may extend in the fourth direction DR4 and may be arranged along the boundaries of each of subpixels PXn that are arranged in the fifth direction DR5. For example, the outer bank 43 may define the boundaries of each of the subpixels PXn.

The outer bank 43 may prevent ink having the light-emitting elements 30 dispersed therein from spilling over the boundaries of each of the subpixels PXn when the ink is being sprayed using the dipole alignment device 1000 of FIG. 1 during the fabrication of the display device. The outer bank 43 may separate ink having different sets of light-emitting elements 30 for different subpixels PXn so that the ink may not be mixed together, but the disclosure is not limited thereto.

The inner banks (41 and 42) may include the first inner banks 41 and the second inner bank 42, which are disposed adjacent to the center of each of the subpixels PXn.

The first inner banks 41 and the second inner bank 42 may be disposed to be spaced apart from, and face, each other. The first electrode 21 may be disposed on the first inner banks 41, and the second electrode 22 may be disposed on the second inner bank 42. Referring to FIGS. 46 and 47, it may be understood that the first electrode branches 21B and the second electrode branch 22B are disposed on the first inner banks 41 and the second inner bank 42, respectively.

The first inner banks 41 and the second inner bank 42 may be disposed in each of the subpixels PXn to extend in the fifth direction DR5, but the disclosure is not limited thereto. The first inner banks 41 and the second inner bank 42 may be disposed in each of the subpixels PXn to form patterns on the entire surface of the display device. The banks (41, 42, and 43) may include polyimide (PI), but the disclosure is not limited thereto.

The first inner banks 41 and the second inner bank 42 may protrude at least in part from the via layer 20. The first inner banks 41 and the second inner bank 42 may protrude upwardly from a plane where the light-emitting elements 30 are disposed, and each of protruding parts of the first inner banks 41 and of the second inner bank 42 may have inclined side surfaces. As the inner banks (41 and 42) protrude from the via layer 20 and thus each have inclined side surfaces, light emitted by the light-emitting elements 30 may be reflected by the inclined side surfaces of each of the inner banks (41 and 42). As will be described below, in case that the electrodes (21 and 22), which are disposed on the inner banks (41 and 42), include a material with high reflectance, light emitted by the light-emitting elements 30 may be reflected by the electrodes (21 and 22) and may thus travel in an upward direction from the via layer 20.

As already mentioned above, the banks (41, 42, and 43) may include a same material and may be formed by a same process. The outer bank 43 may be disposed along the boundaries of each of the subpixels PXn to form a lattice pattern, but the inner banks (41 and 42) may be disposed in each of the subpixels PXn to extend in a direction.

The electrodes (21 and 22) may be disposed on the via layer 20 and the inner banks (41 and 42). As already mentioned above, the electrodes (21 and 22) include the electrode stems (21S and 22) and the electrode branches (21B and 22B).

Parts of the first and second electrodes 21 and 22 may be disposed on the via layer 20, and parts of the first and second electrodes 21 and 22 may be disposed on the first inner banks 41 and the second inner bank 42. As already mentioned above, the first electrode stem 21S of the first electrode 21 and the second electrode stem 22S of the second electrode 22 may extend in the fourth direction DR4, and the first inner banks 41 and the second inner bank 42 may extend in the fifth direction DR5 and may thus be disposed in each pair of adjacent subpixels PXn in the fifth direction DR5.

A first electrode contact hole CNTD, which exposes part of the circuit element layer through the via layer 20, may be formed in the first electrode stem 21S of the first electrode 21. The first electrode 21 may be electrically connected to a transistor of the circuit element layer through the first electrode contact hole CNTD. The first electrode 21 may receive a predetermined electric signal from the transistor.

The second electrode stem 22S of the second electrode 22 may extend in a direction and may thus be disposed even in the non-emission area where the light-emitting elements 30 are not disposed. A second electrode contact hole CNTS, which exposes part of the circuit element layer through the via layer 20, may be formed in the second electrode stem 22S. The second electrode 22 may be electrically connected to a power supply electrode through the second electrode contact hole CNTS. The second electrode 22 may receive a predetermined electric signal from the power supply electrode.

Parts of the first and second electrodes 21 and 22, for example, the first electrode branches 21B and the second electrode branch 22B, may be disposed on the first inner banks 41 and the second inner bank 42. The light-emitting elements 30 may be disposed in gaps between the first and second electrodes 21 and 22, for example, in gaps where the first electrode branches 21B and the second electrode branch 22B are spaced apart from, and face, each other.

The electrodes (21 and 22) may include a transparent conductive material. In an example, the electrodes (21 and 22) may include a material such as indium tin oxide (ITO), indium zinc oxide (IZO), or indium tin-zinc oxide (ITZO), but the disclosure is not limited thereto. In some embodiments, the electrodes (21 and 22) may include a conductive material with high reflectance. For example, the electrodes (21 and 22) may include a material with high reflectance, for example, a metal such as silver (Ag), copper (Cu), or aluminum (Al). In this case, the electrodes (21 and 22) can reflect incident light thereupon and can emit the light in an upward direction of each of the subpixels PXn.

The electrodes (21 and 22) may have a structure in which one or more layers of a transparent conductive material and at least one metal layer with high reflectance are stacked or may be formed as a single layer including the transparent conductive material and the metal. In an embodiment, the electrodes (21 and 22) may have a stack of ITO/Ag/ITO/IZO or may include an alloy including Al, nickel (Ni), or lanthanum (La), but the disclosure is not limited thereto.

The first insulating layer 51 is disposed on the via layer 20 and the first and second electrodes 21 and 22. The first insulating layer 51 is disposed to cover parts of the first and second electrodes 21 and 22. The first insulating layer 51 may be disposed to cover most of the top surfaces of the first and second electrodes 21 and 22 and may expose parts of the first and second electrodes 21 and 22. The first insulating layer 51 may be disposed to expose parts of the top surfaces of the first and second electrodes 21 and 22, for example, the top surfaces of the first electrode branches 21B on the first inner banks 41 and the top surface of the second electrode branch 22B on the second inner bank 42. For example, the first insulating layer 51 may be formed substantially on the entire surface of the via layer 20 and may include openings, which expose parts of the first and second electrodes 21 and 22.

In an embodiment, the first insulating layer 51 may be formed to be recessed in part on the top surface thereof between the first and second electrodes 21 and 22. In some embodiments, the first insulating layer 51 may include an inorganic insulating material, and part of the top surface of the first insulating layer 51, which is disposed to cover the first and second electrodes 21 and 22, may be recessed due to step differences (or height differences) formed by the underlying members. The light-emitting elements 30, which are disposed on the first insulating layer 51 between the first and second electrodes 21 and 22, may form empty space in the recessed part of the top surface of the first insulating layer 51. The light-emitting elements 30 may be disposed to be spaced apart in part from the top surface of the first insulating layer 51, and the space may be filled with the material of the second insulating layer 52 that will be described below. However, the disclosure is not limited thereto. As another example, the first insulating layer 51 may has a flat top surface so that the light-emitting elements 30 may be disposed thereon.

The first insulating layer 51 may protect and insulate the first and second electrodes 21 and 22. The first insulating layer 51 may prevent the light-emitting elements 30, which are disposed on the first insulating layer 51, from being damaged by other members by direct contact therewith. However, the shape and structure of the first insulating layer 51 are not particularly limited.

The light-emitting elements 30 may be disposed on the first insulating layer 51 between the electrodes (21 and 22). In an example, at least one light-emitting element 30 may be disposed on the first insulating layer 51 between the electrode branches (21B and 22B), but the disclosure is not limited thereto. Although not specifically illustrated, at least some of the light-emitting elements 30 disposed in each of the subpixels PXn may be arranged in regions other than those between the electrode branches (21B and 22B). The light-emitting elements 30 may be disposed on end portions of the first electrode branches 21B and of the second electrode branch 22B that face each other, and may be electrically connected to the electrodes (21 and 22) through the contact electrodes 26.

In each of the light-emitting elements 30, layers may be arranged in a horizontal direction with respect to the via layer 20. The light-emitting elements 30 of the display device may extend in a direction and may have a structure in which semiconductor layers are sequentially arranged in a direction. As already mentioned above, in each of the light-emitting elements 30, a first semiconductor layer 31, an active layer 33, a second semiconductor layer 32, and an electrode layer 37 may be sequentially arranged in a direction, and outer surfaces of the first semiconductor layer 31, the active layer 33, the second semiconductor layer 32, and the electrode layer 37 may be surrounded by an insulating film 38. The light-emitting elements ED, which are disposed in the display device, may be arranged such that the direction in which the light-emitting elements ED extend may be parallel to the via layer 20, and the semiconductor layers included in each of the light-emitting elements 30 may be sequentially arranged in a direction parallel to the top surface of the via layer 20. However, the disclosure is not limited thereto. As another example, in case that the light-emitting elements 30 have a different structure, layers may be arranged in each of the light-emitting elements 30 in a direction perpendicular to the via layer 20.

The first end portions of the light-emitting elements 30 may contact the first contact electrodes 26a, and the second end portions of the light-emitting elements 30 may contact the second contact electrode 26B. In an embodiment, as the insulating film 38 is not formed on both end surfaces of each of the light-emitting elements 30 so that both end surfaces of each of the light-emitting elements 30 are exposed, the light-emitting elements 30 may contact the first contact electrodes 26a and the second contact electrode 26b at both exposed end surfaces thereof. However, the disclosure is not limited thereto. As another example, at least part of the insulating film 38 may be removed so that the side surfaces of both end portions of each of the light-emitting elements 30 may be partially exposed.

The second insulating layer 52 may be disposed in part on the light-emitting elements 30, which are disposed between the first and second electrodes 21 and 22. The second insulating layer 52 may be disposed to surround parts of outer surfaces of the light-emitting elements 30. The second insulating layer 52 may protect the light-emitting elements 30 and fix the light-emitting elements 30 during the fabrication of the display device. In an embodiment, some of the materials of the second insulating layer 52 may be disposed between the bottom surfaces of the light-emitting elements 30 and the first insulating layer 51. As already mentioned above, the second insulating layer 52 may be formed to fill gaps that are formed between the first insulating layer 51 and the light-emitting elements 30 during the fabrication of the display device. Thus, the second insulating layer 52 may be formed to surround the outer surfaces of the light-emitting elements ED, but the disclosure is not limited thereto.

The second insulating layer 52 may be disposed to extend in the fifth direction DR5 between the first electrode branches 21B and the second electrode branch 22B in a plan view. In an example, the second insulating layer 52 may have an island or linear shape in a plan view over the via layer 20. In an embodiment, the second insulating layer 52 may be disposed on the light-emitting elements 30.

The first contact electrodes 26a and the second contact electrode 26b may be disposed on the electrodes (21 and 22) and the second insulating layer 52. The first contact electrodes 26a and the second contact electrode 26b may be disposed on the second insulating layer 52 to be spaced apart from each other. The second insulating layer 52 may insulate the first contact electrodes 26a and the second contact electrode 26b such that the first contact electrodes 26a and the second contact electrode 26b may not directly contact each other.

The first contact electrodes 26a may contact an exposed parts of the first electrode 21, on the first inner banks 41, and the second contact electrode 26b may contact an exposed part of the second electrode 22, on the second inner bank 42. The first contact electrodes 26a and the second contact electrode 26b may deliver electric signals transmitted thereto from the electrodes (21 and 22) to the light-emitting elements 30.

The contact electrodes 26 may include a conductive material. For example, the contact electrodes 26 may include ITO, IZO, ITZO, or Al, but the disclosure is not limited thereto.

The passivation layer 55 may be disposed on the contact electrodes 26 and the second insulating layer 52. The passivation layer 55 may protect the members disposed on the via layer 20 from an external environment.

Each of the first insulating layer 51, the second insulating layer 52, and the passivation layer 55 may include an inorganic insulating material or an organic insulating material. In an embodiment, the first insulating layer 51, the second insulating layer 52, and the passivation layer 55 may include an inorganic insulating material such as silicon oxide ($SiO_x$), silicon nitride ($SiN_x$), silicon oxynitride ($SiO_xN_y$), aluminum oxide ($Al_2O_3$), or aluminum nitride (AlN). The first insulating layer 51, the second insulating layer 52, and the passivation layer 55 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, but the disclosure is not limited thereto.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:
1. A dipole alignment device comprising:
an electric field forming part including:
a stage; and
probe parts which form an electric field on the stage;
an inkjet printing apparatus including at least one inkjet head which sprays ink including dipoles and a solvent with the dipoles dispersed therein onto the stage;
a transportation part including a first moving part which moves the electric field forming part in at least one direction; and a light irradiation apparatus including a light irradiation part which applies light to the ink sprayed onto the stage, wherein
the electric field forming part forms an electric field on the stage simultaneously while light is applied to the ink.

2. The dipole alignment device of claim 1, wherein
the light irradiation apparatus is disposed between the inkjet printing apparatus and the transportation part, and
the light irradiation apparatus applies light after the ink is sprayed onto the stage.

3. The dipole alignment device of claim 2, wherein
the light irradiation apparatus is disposed in the inkjet printing apparatus, and
the light irradiation apparatus applies light onto the stage while the ink is being sprayed onto the stage.

4. The dipole alignment device of claim 3, wherein
the inkjet printing apparatus further includes a head base which moves in a direction, and
the inkjet head is disposed in the head base.

5. The dipole alignment device of claim 4, wherein the light irradiation apparatus further includes a second moving part which moves in the direction, and the light irradiation part is disposed in the second moving part.

6. The dipole alignment device of claim 1, wherein
the transportation part includes supports which are disposed in the moving part, and
the electric field forming part moves while being carried on the supports.

7. The dipole alignment device of claim 6, wherein
the light irradiation apparatus is disposed in the transportation part, and
the light irradiation apparatus applies light onto the stage of the electric field forming part while being carried on the supports.

8. The dipole alignment device of claim 1, further comprising:
a heat treatment apparatus applying heat onto the electric field forming part,
wherein the light irradiation apparatus is disposed between the transportation part and the heat treatment apparatus.

9. The dipole alignment device of claim 8, wherein
the light irradiation apparatus is disposed in the heat treatment apparatus, and
the light irradiation apparatus applies the light onto the stage while the heat treatment apparatus is applying heat onto the stage.

10. A dipole alignment method comprising:
spraying ink including dipoles and a solvent with the dipoles dispersed therein onto a target substrate;
applying light onto the target substrate to form an electric field on the target substrate and aligning the dipoles on the target substrate with the electric field; and
removing the solvent and settling the dipoles on the target substrate, wherein
the applying of light onto the target substrate is performed simultaneously while an electric field is being formed on the target substrate.

11. The dipole alignment method of claim 10, wherein the settling of the dipoles comprises moving the target substrate to a heat treatment apparatus with the use of a transportation part and applying, by the heat treatment apparatus, heat onto the target substrate.

12. The dipole alignment method of claim 11, wherein
the applying of light onto the target substrate is performed before the transportation part moves the target substrate, and
the forming of an electric field on the target substrate is performed while the transportation part is transferring the target substrate.

13. The dipole alignment method of claim 12, wherein the applying of light onto the target substrate is performed while the transportation part is transferring the target substrate.

14. The dipole alignment method of claim 11, wherein
the applying of light onto the target substrate is performed before the heat treatment apparatus applies heat onto the target substrate, and
the forming of an electric field on the target substrate is performed while the heat treatment apparatus is applying heat onto the target substrate.

15. The dipole alignment method of claim 14, wherein the applying of light onto the target substrate is performed while the heat treatment apparatus is applying heat onto the target substrate.

16. The dipole alignment method of claim 10, wherein the aligning of the dipoles on the target substrate comprises aligning the dipoles such that an orientation direction of the dipoles is aligned by the electric field.

17. The dipole alignment method of claim 16, wherein
the light applied onto the target substrate is applied to the dipoles, and
a dipole moment of the dipoles increases.

18. The dipole alignment method of claim 16, wherein the applying of light onto the target substrate comprises applying light onto a first area defined on the target substrate and applying light to a second area located on a side of the first area.

19. The dipole alignment method of claim 10, wherein
the target substrate includes a first electrode and a second electrode, and
the settling of the dipoles comprises settling the dipoles on the first and second electrodes.

20. The dipole alignment method of claim 19, wherein the spraying of the ink onto the target substrate is performed with an inkjet printing apparatus.

21. A method of manufacturing a display device, comprising:
spraying ink including light-emitting elements and a solvent with the light-emitting elements dispersed therein onto a target substrate on which a first electrode and a second electrode are formed;
applying light onto the target substrate and forming an electric field on the first and second electrodes; and
settling the light-emitting elements on the first and second electrodes, wherein
the forming of the electric field on the first and second electrodes and the applying of light onto the target substrate are performed at the same time.

22. The method of claim 21, wherein
the light applied onto the target substrate is applied to the light-emitting elements, and
a dipole moment of the light-emitting elements increases.

23. The method of claim 22, wherein
the first and second electrodes extend in a direction.

* * * * *